(12) United States Patent
Hotelling

(10) Patent No.: US 10,359,813 B2
(45) Date of Patent: *Jul. 23, 2019

(54) CAPACITANCE SENSING ELECTRODE WITH INTEGRATED I/O MECHANISM

(71) Applicant: Apple Inc., Cupertino, CA (US)

(72) Inventor: Steven P. Hotelling, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/196,772

(22) Filed: Nov. 20, 2018

(65) Prior Publication Data

US 2019/0086954 A1   Mar. 21, 2019

Related U.S. Application Data

(63) Continuation of application No. 14/850,905, filed on Sep. 10, 2015, now Pat. No. 10,139,870, which is a
(Continued)

(51) Int. Cl.
*G06F 1/16* (2006.01)
*H03K 17/96* (2006.01)
(Continued)

(52) U.S. Cl.
CPC ............ *G06F 1/169* (2013.01); *G06F 1/1684* (2013.01); *G06F 3/016* (2013.01); *G06F 3/044* (2013.01); *G06F 3/0412* (2013.01); *G06F 3/0485* (2013.01); *G06F 3/0488* (2013.01); *G06F 3/04886* (2013.01); *H03K 17/96* (2013.01); *H03K 17/962* (2013.01);
(Continued)

(58) Field of Classification Search
CPC ........ G06F 3/016; G06F 3/0412; G06F 3/044; G06F 3/0485; G06F 3/0488; G06F 3/04886

See application file for complete search history.

(56) References Cited

U.S. PATENT DOCUMENTS

| 1,061,578 A | 5/1913 | Wischhusen et al. |
| 2,063,276 A | 12/1936 | Thomas |

(Continued)

FOREIGN PATENT DOCUMENTS

| CA | 1243096 | 10/1988 |
| CN | 1139235 | 1/1997 |

(Continued)

OTHER PUBLICATIONS

"About Quicktip®" www.logicad3d.com/docs/at.html, downloaded Apr. 8, 2002.
(Continued)

*Primary Examiner* — Viet D Pham
(74) *Attorney, Agent, or Firm* — Kubota & Basol LLP

(57) ABSTRACT

A touch sensing device is disclosed. The touch sensing device includes one or more multifunctional nodes each of which represents a single touch pixel. Each multifunctional node includes a touch sensor with one or more integrated I/O mechanisms. The touch sensor and integrated I/O mechanisms share the same communication lines and I/O pins of a controller during operation of the touch sensing device.

20 Claims, 16 Drawing Sheets

Related U.S. Application Data continuation of application No. 13/236,255, filed on Sep. 19, 2011, now abandoned, which is a continuation of application No. 11/483,008, filed on Jul. 6, 2006, now Pat. No. 8,022,935.

(51) Int. Cl.

| | | |
|---|---|---|
| *G06F 3/0488* | (2013.01) | |
| *G06F 3/0485* | (2013.01) | |
| *G06F 3/041* | (2006.01) | |
| *G06F 3/01* | (2006.01) | |
| *G06F 3/044* | (2006.01) | |
| *H01H 3/02* | (2006.01) | |

(52) U.S. Cl.
CPC .......... *H01H 2003/0293* (2013.01); *H03K 2217/96015* (2013.01); *H03K 2217/96046* (2013.01); *H03K 2217/960795* (2013.01)

(56) References Cited

U.S. PATENT DOCUMENTS

| | | |
|---|---|---|
| 2,903,229 A | 2/1956 | Landge |
| 2,794,861 A | 6/1957 | Heine |
| 2,798,907 A | 7/1957 | Schneider |
| 2,945,111 A | 10/1958 | McCormick |
| 3,005,055 A | 10/1961 | Mattke |
| 3,965,399 A | 6/1976 | Walker et al. |
| 3,996,441 A | 12/1976 | Ohashi |
| 4,029,915 A | 6/1977 | Ojima |
| 4,103,252 A | 7/1978 | Bobick |
| 4,110,749 A | 8/1978 | Janko et al. |
| 4,115,670 A | 9/1978 | Chandler |
| 4,121,204 A | 10/1978 | Welch et al. |
| 4,129,747 A | 12/1978 | Pepper |
| 4,158,216 A | 6/1979 | Bigelow |
| 4,242,676 A | 12/1980 | Piguet et al. |
| 4,246,452 A | 1/1981 | Chandler |
| 4,264,903 A | 4/1981 | Bigelow |
| 4,266,144 A | 5/1981 | Bristol |
| 4,293,734 A | 10/1981 | Peper, Jr. |
| D264,969 S | 6/1982 | McGoutry |
| 4,338,502 A | 7/1982 | Hashimoto et al. |
| 4,380,007 A | 4/1983 | Steinegger |
| 4,380,040 A | 4/1983 | Posset |
| 4,394,649 A | 7/1983 | Suchoff et al. |
| 4,475,008 A | 10/1984 | Doi et al. |
| 4,570,149 A | 2/1986 | Thornburg et al. |
| 4,583,161 A | 4/1986 | Gunderson et al. |
| 4,587,378 A | 5/1986 | Moore |
| 4,604,786 A | 8/1986 | Howie, Jr. |
| 4,613,736 A | 9/1986 | Shichijo et al. |
| 4,644,100 A | 2/1987 | Brenner et al. |
| 4,658,690 A | 4/1987 | Aitken et al. |
| 4,719,524 A | 1/1988 | Morishima et al. |
| 4,734,034 A | 3/1988 | Maness et al. |
| 4,736,191 A | 4/1988 | Matzke et al. |
| 4,739,191 A | 4/1988 | Puar |
| 4,739,299 A | 4/1988 | Eventoff et al. |
| 4,752,655 A | 6/1988 | Tajiri et al. |
| 4,755,765 A | 7/1988 | Ferland |
| 4,764,717 A | 8/1988 | Tucker et al. |
| 4,771,139 A | 9/1988 | DeSmet |
| 4,797,514 A | 1/1989 | Talmage, Jr. et al. |
| 4,798,919 A | 1/1989 | Miessler et al. |
| 4,810,992 A | 3/1989 | Eventoff |
| 4,822,957 A | 4/1989 | Talmage, Jr. et al. |
| 4,831,359 A | 5/1989 | Newell |
| 4,849,852 A | 7/1989 | Mullins |
| 4,856,993 A | 8/1989 | Maness et al. |
| 4,860,768 A | 8/1989 | Hon et al. |
| 4,866,602 A | 9/1989 | Hall |
| 4,876,524 A | 10/1989 | Jenkins |
| 4,897,511 A | 1/1990 | Itaya et al. |
| 4,914,624 A | 4/1990 | Dunthorn |
| 4,917,516 A | 4/1990 | Retter |
| 4,943,889 A | 7/1990 | Ohmatoi |
| 4,951,036 A | 8/1990 | Grueter et al. |
| 4,954,823 A | 9/1990 | Binstead |
| 4,976,435 A | 12/1990 | Shatford et al. |
| 4,990,900 A | 2/1991 | Kikuchi |
| 5,008,497 A | 4/1991 | Asher |
| 5,036,321 A | 7/1991 | Leach et al. |
| 5,053,757 A | 10/1991 | Meadows |
| 5,086,870 A | 2/1992 | Bolduc |
| 5,088,070 A | 2/1992 | Shiff |
| 5,107,082 A | 4/1992 | Valenzona |
| 5,125,077 A | 6/1992 | Hall |
| 5,159,159 A | 10/1992 | Asher |
| 5,179,648 A | 1/1993 | Hauck |
| 5,186,646 A | 2/1993 | Pederson |
| 5,192,082 A | 3/1993 | Inoue et al. |
| 5,193,669 A | 3/1993 | Demeo et al. |
| 5,225,959 A | 7/1993 | Stearns |
| 5,231,326 A | 7/1993 | Echols |
| 5,237,311 A | 8/1993 | Mailey et al. |
| 5,278,362 A | 1/1994 | Ohashi |
| 5,305,017 A | 4/1994 | Gerpheide |
| 5,313,027 A | 5/1994 | Inoue et al. |
| D349,280 S | 8/1994 | Kaneko |
| 5,339,213 A | 8/1994 | O'Callaghan |
| 5,367,199 A | 11/1994 | Lefkowitz et al. |
| 5,374,787 A | 12/1994 | Miller et al. |
| 5,379,057 A | 1/1995 | Clough et al. |
| 5,404,152 A | 4/1995 | Nagai |
| 5,408,621 A | 4/1995 | Ben-Arie |
| 5,414,445 A | 5/1995 | Kaneko et al. |
| 5,416,498 A | 5/1995 | Grant |
| 5,424,756 A | 6/1995 | Ho et al. |
| 5,432,531 A | 7/1995 | Calder et al. |
| 5,434,757 A | 7/1995 | Kashiwagi |
| 5,438,331 A | 8/1995 | Gilligan et al. |
| D362,431 S | 9/1995 | Kaneko et al. |
| 5,450,075 A | 9/1995 | Waddington |
| 5,453,761 A | 9/1995 | Tanaka |
| 5,473,343 A | 12/1995 | Kimmich et al. |
| 5,473,344 A | 12/1995 | Bacon et al. |
| 5,479,192 A | 12/1995 | Carroll, Jr. et al. |
| 5,481,278 A | 1/1996 | Shigematsu et al. |
| 5,483,261 A | 1/1996 | Yasutake |
| 5,483,454 A | 1/1996 | Lewiner et al. |
| 5,488,204 A | 1/1996 | Mead et al. |
| 5,494,157 A | 2/1996 | Golenz et al. |
| 5,495,077 A | 2/1996 | Miller et al. |
| 5,495,566 A | 2/1996 | Kwatinetz |
| 5,508,703 A | 4/1996 | Okamura et al. |
| 5,508,717 A | 4/1996 | Miller |
| 5,541,372 A | 7/1996 | Bailer et al. |
| 5,543,588 A | 8/1996 | Bisset et al. |
| 5,543,591 A | 8/1996 | Gillespie et al. |
| 5,555,004 A | 9/1996 | Ono et al. |
| 5,559,301 A | 9/1996 | Bryan, Jr. et al. |
| 5,559,943 A | 9/1996 | Cyr et al. |
| 5,561,445 A | 10/1996 | Miwa et al. |
| 5,563,632 A | 10/1996 | Roberts |
| 5,564,112 A | 10/1996 | Hayes et al. |
| 5,565,887 A | 10/1996 | McCambridge et al. |
| 5,578,817 A | 11/1996 | Bidiville et al. |
| 5,581,670 A | 12/1996 | Bler et al. |
| 5,585,823 A | 12/1996 | Duchon et al. |
| 5,589,856 A | 12/1996 | Stein et al. |
| 5,589,893 A | 12/1996 | Gaughan et al. |
| 5,591,945 A | 1/1997 | Kent |
| 5,596,347 A | 1/1997 | Robertson et al. |
| 5,596,697 A | 1/1997 | Foster et al. |
| 5,598,183 A | 1/1997 | Robertson et al. |
| 5,611,040 A | 3/1997 | Brewer et al. |
| 5,611,060 A | 3/1997 | Belfiore et al. |
| 5,613,137 A | 3/1997 | Bertram et al. |
| 5,617,114 A | 4/1997 | Bier et al. |
| 5,627,531 A | 5/1997 | Posso et al. |
| 5,632,679 A | 5/1997 | Tremmel |
| 5,640,258 A | 6/1997 | Kurashima et al. |
| 5,648,642 A | 7/1997 | Miller et al. |

(56) References Cited

U.S. PATENT DOCUMENTS

| | | |
|---|---|---|
| D382,550 S | 8/1997 | Kaneko et al. |
| 5,657,012 A | 8/1997 | Tart |
| 5,661,632 A | 8/1997 | Register |
| D385,542 S | 10/1997 | Kaneko et al. |
| 5,675,362 A | 10/1997 | Clough et al. |
| 5,689,285 A | 11/1997 | Asher |
| 5,721,849 A | 2/1998 | Amro |
| 5,726,687 A | 3/1998 | Belfiore et al. |
| 5,729,219 A | 3/1998 | Armstrong et al. |
| 5,730,165 A | 3/1998 | Philipp |
| 5,748,185 A | 5/1998 | Stephan et al. |
| 5,748,512 A | 5/1998 | Vargas |
| 5,751,274 A | 5/1998 | Davis |
| 5,754,890 A | 5/1998 | Holmdahl et al. |
| 5,764,066 A | 6/1998 | Novak et al. |
| 5,764,218 A | 6/1998 | Della Bona et al. |
| 5,777,605 A | 7/1998 | Yoshinobu et al. |
| 5,786,818 A | 7/1998 | Brewer et al. |
| 5,790,769 A | 8/1998 | Buxton et al. |
| 5,798,752 A | 8/1998 | Buxton et al. |
| 5,801,941 A | 9/1998 | Betram et al. |
| 5,805,144 A | 9/1998 | Scholder et al. |
| 5,808,602 A | 9/1998 | Sellers |
| 5,812,239 A | 9/1998 | Eger |
| 5,812,498 A | 9/1998 | Terés |
| 5,815,141 A | 9/1998 | Phares |
| 5,821,922 A | 10/1998 | Sellers |
| 5,825,351 A | 10/1998 | Tam |
| 5,825,352 A | 10/1998 | Bisset et al. |
| 5,825,353 A | 10/1998 | Will |
| 5,828,364 A | 10/1998 | Siddiqui |
| 5,835,079 A | 11/1998 | Shieh |
| 5,838,304 A | 11/1998 | Hall |
| 5,841,078 A | 11/1998 | Miller et al. |
| 5,841,423 A | 11/1998 | Carroll, Jr. et al. |
| D402,281 S | 12/1998 | Ledbetter et al. |
| 5,850,213 A | 12/1998 | Imai et al. |
| 5,856,645 A | 1/1999 | Norton |
| 5,856,822 A | 1/1999 | Du et al. |
| 5,859,629 A | 1/1999 | Tognazzini |
| 5,861,875 A | 1/1999 | Gerpheide |
| 5,864,334 A | 1/1999 | Sellers |
| 5,867,914 A | 2/1999 | Watson et al. |
| 5,869,791 A | 2/1999 | Young |
| 5,875,311 A | 2/1999 | Bertram et al. |
| 5,880,411 A | 3/1999 | Gillespie et al. |
| 5,883,612 A | 3/1999 | Kreitzer |
| 5,883,619 A | 3/1999 | Ho et al. |
| 5,889,236 A | 3/1999 | Gillespie et al. |
| 5,889,511 A | 3/1999 | Ong et al. |
| 5,890,181 A | 3/1999 | Selesky et al. |
| 5,894,117 A | 4/1999 | Kamishima |
| 5,903,229 A | 5/1999 | Kishi |
| 5,907,152 A | 5/1999 | Dandiliker et al. |
| 5,907,318 A | 5/1999 | Medina |
| 5,909,211 A | 6/1999 | Combs et al. |
| 5,910,802 A | 6/1999 | Shields et al. |
| 5,914,706 A | 6/1999 | Kono |
| 5,923,388 A | 7/1999 | Kurashima et al. |
| D412,940 S | 8/1999 | Kato et al. |
| 5,933,102 A | 8/1999 | Miller et al. |
| 5,933,141 A | 8/1999 | Smith |
| 5,936,619 A | 8/1999 | Nagasaki et al. |
| 5,943,044 A | 8/1999 | Martinelli et al. |
| 5,943,052 A | 8/1999 | Allen et al. |
| 5,953,000 A | 9/1999 | Weirich |
| 5,956,019 A | 9/1999 | Bang et al. |
| 5,959,610 A | 9/1999 | Silfvast |
| 5,959,611 A | 9/1999 | Smailagic et al. |
| 5,963,671 A | 10/1999 | Comerford et al. |
| 5,964,661 A | 10/1999 | Dodge |
| 5,973,668 A | 10/1999 | Watanabe |
| 6,000,000 A | 12/1999 | Hawkins et al. |
| 6,002,093 A | 12/1999 | Hrehor et al. |
| 6,002,389 A | 12/1999 | Kasser et al. |
| 6,005,299 A | 12/1999 | Hengst |
| 6,011,542 A | 1/2000 | Durrani et al. |
| 6,025,832 A | 2/2000 | Sudo et al. |
| 6,031,518 A | 2/2000 | Adams et al. |
| 6,034,672 A | 3/2000 | Gaultiet et al. |
| 6,040,829 A | 3/2000 | Croy et al. |
| 6,057,829 A | 5/2000 | Silfvast |
| 6,075,533 A | 6/2000 | Chang |
| 6,084,574 A | 7/2000 | Bidiville |
| D430,169 S | 8/2000 | Scibora |
| 6,097,372 A | 8/2000 | Suzuki |
| 6,104,790 A | 8/2000 | Narayanaswami |
| 6,118,435 A | 9/2000 | Fujita et al. |
| 6,122,526 A | 9/2000 | Parulski et al. |
| 6,124,587 A | 9/2000 | Bidiville et al. |
| 6,128,006 A | 10/2000 | Rosenberg et al. |
| 6,131,048 A | 10/2000 | Sudo et al. |
| 6,141,068 A | 10/2000 | Iijima |
| 6,147,856 A | 11/2000 | Karidis |
| 6,154,210 A | 11/2000 | Anderson |
| 6,163,312 A | 12/2000 | Furuya |
| 6,166,721 A | 12/2000 | Kuroiwa et al. |
| 6,179,496 B1 | 1/2001 | Chou |
| 6,181,322 B1 | 1/2001 | Nanavati |
| D437,860 S | 2/2001 | Suzuki et al. |
| 6,185,591 B1 | 2/2001 | Baker et al. |
| 6,188,391 B1 | 2/2001 | Seely et al. |
| 6,188,393 B1 | 2/2001 | Shu |
| 6,191,774 B1 | 2/2001 | Schena et al. |
| 6,198,054 B1 | 3/2001 | Janniere |
| 6,198,473 B1 | 3/2001 | Armstrong |
| 6,211,861 B1 | 4/2001 | Rosenberg et al. |
| 6,216,988 B1 | 4/2001 | Hsu et al. |
| 6,219,038 B1 | 4/2001 | Cho |
| 6,222,528 B1 | 4/2001 | Gerpheide et al. |
| D442,592 S | 5/2001 | Ledbetter et al. |
| 6,225,976 B1 | 5/2001 | Yates et al. |
| 6,225,980 B1 | 5/2001 | Weiss et al. |
| 6,226,534 B1 | 5/2001 | Aizawa |
| 6,227,966 B1 | 5/2001 | Yokoi |
| D443,616 S | 6/2001 | Fisher et al. |
| 6,243,078 B1 | 6/2001 | Rosenberg |
| 6,243,080 B1 | 6/2001 | Molne |
| 6,243,646 B1 | 6/2001 | Ozaki et al. |
| 6,246,395 B1 | 6/2001 | Goyins et al. |
| 6,248,017 B1 | 6/2001 | Roach |
| 6,254,477 B1 | 7/2001 | Sasaki et al. |
| 6,256,011 B1 | 7/2001 | Culver |
| 6,259,491 B1 | 7/2001 | Ekedahl et al. |
| 6,262,717 B1 | 7/2001 | Donohue et al. |
| 6,262,785 B1 | 7/2001 | Kim |
| 6,266,050 B1 | 7/2001 | Oh et al. |
| 6,285,211 B1 | 9/2001 | Sample et al. |
| D448,810 S | 10/2001 | Goto |
| 6,297,795 B1 | 10/2001 | Kato et al. |
| 6,297,811 B1 | 10/2001 | Kent et al. |
| 6,300,946 B1 | 10/2001 | Lincke et al. |
| 6,307,539 B2 | 10/2001 | Suzuki |
| 6,310,610 B1 | 10/2001 | Beaton et al. |
| D450,713 S | 11/2001 | Masamitsu et al. |
| 6,314,483 B1 | 11/2001 | Goto et al. |
| 6,321,441 B1 | 11/2001 | Davidson et al. |
| 6,323,843 B2 | 11/2001 | Giles et al. |
| 6,323,845 B1 | 11/2001 | Robbins |
| 6,323,846 B1 | 11/2001 | Westerman et al. |
| D452,250 S | 12/2001 | Chan |
| 6,330,244 B1 | 12/2001 | Swartz et al. |
| 6,336,614 B1 | 1/2002 | Kwitek |
| 6,337,678 B1 | 1/2002 | Fish |
| 6,340,800 B1 | 1/2002 | Zhai et al. |
| 6,344,619 B1 | 2/2002 | Yamasaki et al. |
| D454,568 S | 3/2002 | Andre et al. |
| 6,357,887 B1 | 3/2002 | Novak |
| 6,359,572 B1 | 3/2002 | Vale |
| D455,793 S | 4/2002 | Lin |
| 6,369,803 B2 | 4/2002 | Brisebois et al. |
| 6,373,265 B1 | 4/2002 | Morimoto et al. |
| 6,373,470 B1 | 4/2002 | Andre et al. |
| 6,377,530 B1 | 4/2002 | Burrows |

(56) References Cited

U.S. PATENT DOCUMENTS

| | | |
|---|---|---|
| 6,396,523 B1 | 5/2002 | Segal et al. |
| 6,407,325 B2 | 6/2002 | Yi et al. |
| 6,424,338 B1 | 7/2002 | Anderson |
| 6,429,846 B2 * | 8/2002 | Rosenberg .............. A63F 13/06 345/156 |
| 6,429,852 B1 | 8/2002 | Adams et al. |
| 6,437,836 B1 | 8/2002 | Huang et al. |
| 6,452,514 B1 | 9/2002 | Philipp |
| 6,462,941 B1 | 10/2002 | Hulick et al. |
| 6,465,271 B1 | 10/2002 | Ko et al. |
| 6,473,069 B1 | 10/2002 | Gerphelde |
| 6,492,602 B2 | 12/2002 | Asai et al. |
| 6,492,979 B1 | 12/2002 | Kent et al. |
| 6,496,181 B1 | 12/2002 | Bomer et al. |
| 6,497,412 B1 | 12/2002 | Bramm |
| D468,365 S | 1/2003 | Bransky et al. |
| D469,109 S | 1/2003 | Andre et al. |
| D472,245 S | 3/2003 | Andre et al. |
| 6,546,231 B1 | 4/2003 | Someya et al. |
| 6,556,222 B1 | 4/2003 | Narayanaswami |
| 6,563,487 B2 | 5/2003 | Martin et al. |
| 6,570,583 B1 | 5/2003 | Kung et al. |
| 6,573,844 B1 | 6/2003 | Venolia et al. |
| 6,587,091 B2 | 7/2003 | Serpa |
| 6,597,345 B2 | 7/2003 | Hirshberg |
| 6,600,481 B1 | 7/2003 | Brown et al. |
| 6,606,244 B1 | 8/2003 | Liu et al. |
| 6,610,936 B2 | 8/2003 | Gillespie et al. |
| 6,611,253 B1 | 8/2003 | Cohen |
| 6,618,909 B1 | 9/2003 | Yang |
| 6,636,197 B1 | 10/2003 | Goldenberg et al. |
| 6,639,584 B1 | 10/2003 | Li |
| 6,640,250 B1 | 10/2003 | Chang et al. |
| 6,650,975 B2 | 11/2003 | Ruffner |
| 6,654,001 B1 | 11/2003 | Su |
| D483,809 S | 12/2003 | Lim |
| 6,657,560 B1 | 12/2003 | Jung |
| 6,658,773 B2 | 12/2003 | Rohne et al. |
| 6,661,438 B1 | 12/2003 | Shiraishi et al. |
| 6,664,951 B1 | 12/2003 | Fujii et al. |
| 6,674,439 B1 | 1/2004 | Shin et al. |
| 6,677,927 B1 | 1/2004 | Bruck et al. |
| 6,678,215 B1 | 1/2004 | Treyz et al. |
| 6,678,891 B1 | 1/2004 | Wilcox et al. |
| 6,683,649 B1 | 1/2004 | Anderson |
| 6,684,110 B1 | 1/2004 | Kutsuna et al. |
| 6,686,904 B1 | 2/2004 | Sherman et al. |
| 6,686,906 B2 | 2/2004 | Salminen et al. |
| 6,690,387 B2 | 2/2004 | Zimmerman et al. |
| 6,703,550 B2 | 3/2004 | Chu |
| 6,710,771 B1 | 3/2004 | Yamaguchi et al. |
| 6,724,817 B1 | 4/2004 | Simpson et al. |
| 6,727,889 B2 | 4/2004 | Shaw |
| D489,731 S | 5/2004 | Huang |
| 6,738,045 B2 | 5/2004 | Hinckley et al. |
| 6,747,636 B2 | 6/2004 | Martin |
| 6,750,803 B2 | 6/2004 | Yates et al. |
| 6,756,971 B1 | 6/2004 | Ramey et al. |
| 6,760,012 B1 | 7/2004 | Laurila |
| 6,765,557 B1 | 7/2004 | Segal et al. |
| 6,781,576 B2 | 8/2004 | Tamura |
| 6,784,384 B2 | 8/2004 | Park et al. |
| 6,788,288 B2 | 9/2004 | Ano |
| 6,791,533 B2 | 9/2004 | Su |
| 6,795,057 B2 | 9/2004 | Gordon |
| D497,618 S | 10/2004 | Andre et al. |
| 6,810,271 B1 | 10/2004 | Wood et al. |
| 6,819,312 B2 | 11/2004 | Fish |
| 6,822,640 B2 | 11/2004 | Derocher |
| 6,834,975 B2 | 12/2004 | Chu-Chia et al. |
| 6,844,872 B1 | 1/2005 | Farag et al. |
| 6,855,899 B2 | 2/2005 | Sotome |
| 6,865,718 B2 | 3/2005 | Levi Montalcini |
| 6,867,965 B2 | 3/2005 | Khoo |
| 6,930,494 B2 | 3/2005 | Tesdahl et al. |
| 6,886,842 B2 | 5/2005 | Vey et al. |
| 6,894,916 B2 | 5/2005 | Reohr et al. |
| D506,476 S | 6/2005 | Andre et al. |
| 6,922,189 B2 | 7/2005 | Fujiyoshi |
| 6,933,732 B2 | 8/2005 | Morimoto |
| 6,943,705 B1 | 9/2005 | Bolender et al. |
| 6,943,779 B2 | 9/2005 | Satoh |
| 6,958,614 B2 | 10/2005 | Morimoto |
| 6,958,749 B1 | 10/2005 | Matsushita et al. |
| 6,977,808 B2 | 12/2005 | Lam et al. |
| 6,978,127 B1 | 12/2005 | Bulthuis et al. |
| 6,982,695 B1 | 1/2006 | Canova et al. |
| 6,985,137 B2 | 1/2006 | Kaikuranta |
| 7,006,077 B1 | 2/2006 | Uusimäki |
| 7,015,894 B2 | 3/2006 | Morohoshi |
| 7,019,225 B2 | 3/2006 | Matsumoto et al. |
| 7,036,946 B1 | 5/2006 | Mosier |
| 7,038,659 B2 | 5/2006 | Rajkowski |
| 7,046,230 B2 | 5/2006 | Zadesky et al. |
| 7,050,292 B2 | 5/2006 | Shimura et al. |
| 7,069,044 B2 | 6/2006 | Okada et al. |
| 7,078,633 B2 | 7/2006 | Ihalainen |
| 7,084,856 B2 | 8/2006 | Huooi |
| 7,088,347 B2 | 8/2006 | Iisaka et al. |
| 7,107,147 B2 | 9/2006 | Pascual et al. |
| 7,111,788 B2 | 9/2006 | Reponen |
| 7,113,196 B2 | 9/2006 | Kerr |
| 7,113,520 B1 | 9/2006 | Meenan |
| 7,117,136 B1 | 10/2006 | Rosedale |
| 7,119,792 B1 | 10/2006 | Andre et al. |
| 7,148,882 B2 | 12/2006 | Kamrath et al. |
| 7,149,550 B2 | 12/2006 | Kraft et al. |
| 7,176,902 B2 | 2/2007 | Peterson et al. |
| 7,184,064 B2 | 2/2007 | Zimmerman et al. |
| 7,215,319 B2 | 5/2007 | Kamijo et al. |
| 7,218,956 B2 | 5/2007 | Okawa |
| 7,233,318 B1 | 6/2007 | Farag et al. |
| 7,236,154 B1 | 6/2007 | Kerr et al. |
| 7,236,159 B1 | 6/2007 | Siversson |
| 7,253,643 B1 | 8/2007 | Seguine |
| 7,277,087 B2 | 10/2007 | Hill et al. |
| 7,279,647 B2 | 10/2007 | Philipp |
| 7,286,115 B2 | 10/2007 | Longe et al. |
| 7,288,732 B2 | 10/2007 | Hashida |
| 7,289,111 B2 | 10/2007 | Asbill |
| 7,297,883 B2 | 11/2007 | Rochon et al. |
| 7,310,089 B2 | 12/2007 | Baker et al. |
| 7,312,785 B2 | 12/2007 | Tsuk et al. |
| 7,321,103 B2 | 1/2008 | Nakanishi et al. |
| 7,333,092 B2 | 2/2008 | Zadesky et al. |
| 7,345,670 B2 | 3/2008 | Armstrong |
| 7,345,671 B2 | 3/2008 | Robbin et al. |
| 7,348,898 B2 | 3/2008 | Ono |
| 7,382,139 B2 | 6/2008 | Mackey |
| 7,394,038 B2 | 7/2008 | Chang |
| 7,395,081 B2 | 7/2008 | Bonnelykke Kristensen et al. |
| 7,397,467 B2 | 7/2008 | Park et al. |
| 7,439,963 B2 | 10/2008 | Geaghan et al. |
| 7,466,307 B2 | 12/2008 | Trent et al. |
| 7,479,949 B2 | 1/2009 | Jobs et al. |
| 7,486,323 B2 | 2/2009 | Lee et al. |
| 7,499,040 B2 | 3/2009 | Zadesky et al. |
| 7,502,016 B2 | 3/2009 | Trent, Jr. et al. |
| 7,503,193 B2 | 3/2009 | Schoene et al. |
| 7,561,146 B1 | 7/2009 | Hotelling |
| 7,593,782 B2 | 9/2009 | Jobs et al. |
| 7,609,178 B2 | 10/2009 | Son et al. |
| 7,616,097 B1 | 11/2009 | Whang |
| 7,633,076 B2 | 12/2009 | Huppi et al. |
| 7,639,233 B2 | 12/2009 | Marks |
| 7,645,955 B2 | 1/2010 | Huang et al. |
| 7,663,607 B2 | 2/2010 | Hotelling et al. |
| 7,671,837 B2 | 3/2010 | Forsblad et al. |
| 7,708,051 B2 | 5/2010 | Katsumi et al. |
| 7,746,323 B1 | 6/2010 | Otsuki et al. |
| 7,746,325 B2 | 6/2010 | Roberts |
| 7,764,272 B1 | 7/2010 | Clifton-Bligh |
| 7,772,507 B2 | 8/2010 | Orr et al. |
| 7,834,855 B2 | 11/2010 | Hotelling et al. |

(56) References Cited

U.S. PATENT DOCUMENTS

| | | |
|---|---|---|
| 7,852,199 B2 | 12/2010 | Desai et al. |
| 7,911,455 B2 | 3/2011 | Nishikawa et al. |
| 7,932,893 B1 | 4/2011 | Berthaud |
| 7,986,307 B2 | 7/2011 | Zotov et al. |
| 8,001,488 B1 | 8/2011 | Lam |
| 8,022,935 B2 | 9/2011 | Hotelling |
| 8,044,314 B2 | 10/2011 | Weber et al. |
| 8,072,439 B2 | 12/2011 | Hillis et al. |
| 8,098,233 B2 | 1/2012 | Hotelling et al. |
| 8,125,453 B2 | 2/2012 | Shahoian et al. |
| 8,174,508 B2 | 5/2012 | Sinclair et al. |
| 8,253,698 B2 | 8/2012 | Chen et al. |
| 8,294,047 B2 | 10/2012 | Westerman et al. |
| 8,445,793 B2 | 5/2013 | Westerman et al. |
| 8,471,811 B2 | 6/2013 | Harley |
| 8,479,122 B2 | 7/2013 | Hotelling et al. |
| 8,645,827 B2 | 2/2014 | Beaver et al. |
| 8,749,493 B2 | 6/2014 | Zadesky et al. |
| 8,970,533 B2 | 3/2015 | Westerman et al. |
| 9,041,663 B2 | 5/2015 | Westerman et al. |
| 9,367,151 B2 | 6/2016 | Mckillop |
| 10,180,732 B2 | 1/2019 | Prest |
| 2001/0006388 A1 | 7/2001 | Kim et al. |
| 2001/0011991 A1 | 8/2001 | Wang et al. |
| 2001/0011993 A1 | 8/2001 | Saarinen |
| 2001/0033270 A1 | 10/2001 | Osawa et al. |
| 2001/0035854 A1 | 11/2001 | Rosenberg et al. |
| 2001/0043545 A1 | 11/2001 | Aratani |
| 2001/0047926 A1 | 12/2001 | Kozuma |
| 2001/0050673 A1 | 12/2001 | Davenport |
| 2001/0051046 A1 | 12/2001 | Watanabe et al. |
| 2001/0053692 A1 | 12/2001 | Ito et al. |
| 2002/0000978 A1 | 1/2002 | Gerpheide |
| 2002/0002039 A1 | 1/2002 | Qureshey et al. |
| 2002/0002643 A1 | 1/2002 | Yamamoto et al. |
| 2002/0009193 A1 | 1/2002 | Deguchi |
| 2002/0011993 A1 | 1/2002 | Lui et al. |
| 2002/0015024 A1 | 2/2002 | Westerman et al. |
| 2002/0027547 A1 | 3/2002 | Kamiio |
| 2002/0030665 A1 | 3/2002 | Ano |
| 2002/0033848 A1 | 3/2002 | Sciammarella et al. |
| 2002/0039493 A1 | 4/2002 | Tanaka |
| 2002/0045960 A1 | 4/2002 | Phillips et al. |
| 2002/0071550 A1 | 6/2002 | Pletikosa |
| 2002/0072394 A1 | 6/2002 | Muramatsu |
| 2002/0080123 A1 | 6/2002 | Kennedy et al. |
| 2002/0084721 A1 | 7/2002 | Walczak |
| 2002/0089545 A1 | 7/2002 | Levi Montalcini |
| 2002/0103796 A1 | 8/2002 | Hartley |
| 2002/0118131 A1 | 8/2002 | Yates et al. |
| 2002/0118169 A1 | 8/2002 | Hinckley et al. |
| 2002/0140668 A1 | 10/2002 | Crawford |
| 2002/0145594 A1 | 10/2002 | Derocher |
| 2002/0154090 A1 | 10/2002 | Lin |
| 2002/0158838 A1 | 10/2002 | Smith et al. |
| 2002/0158844 A1 | 10/2002 | McLoone et al. |
| 2002/0164156 A1 | 11/2002 | Bilbrey |
| 2002/0168947 A1 | 11/2002 | Lemley |
| 2002/0180701 A1 | 12/2002 | Hayama et al. |
| 2002/0196234 A1 | 12/2002 | Gray |
| 2002/0196239 A1 | 12/2002 | Lee |
| 2003/0002246 A1 | 1/2003 | Kerr |
| 2003/0025679 A1 | 2/2003 | Taylor et al. |
| 2003/0028346 A1 | 2/2003 | Sinclair et al. |
| 2003/0038776 A1 | 2/2003 | Rosenberg et al. |
| 2003/0038824 A1* | 2/2003 | Ryder ............... G06F 3/0421 345/684 |
| 2003/0043121 A1 | 3/2003 | Chen |
| 2003/0043174 A1 | 3/2003 | Hinckley et al. |
| 2003/0048262 A1 | 3/2003 | Wu et al. |
| 2003/0050092 A1 | 3/2003 | Yun |
| 2003/0070106 A1 | 4/2003 | Kosuda et al. |
| 2003/0076301 A1 | 4/2003 | Tsuk et al. |
| 2003/0076303 A1 | 4/2003 | Huppi |
| 2003/0080947 A1 | 5/2003 | Genest et al. |
| 2003/0091377 A1 | 5/2003 | Hsu et al. |
| 2003/0095095 A1 | 5/2003 | Pihlaja |
| 2003/0095096 A1 | 5/2003 | Robbin et al. |
| 2003/0098851 A1 | 5/2003 | Brink |
| 2003/0103043 A1 | 6/2003 | Mulligan et al. |
| 2003/0104839 A1 | 6/2003 | Kraft et al. |
| 2003/0122779 A1 | 7/2003 | Martin et al. |
| 2003/0122787 A1 | 7/2003 | Zimmerman et al. |
| 2003/0122792 A1 | 7/2003 | Yamamoto et al. |
| 2003/0135292 A1 | 7/2003 | Husgafvel et al. |
| 2003/0142081 A1 | 7/2003 | Iizuka et al. |
| 2003/0142288 A1 | 7/2003 | Kinrot et al. |
| 2003/0162569 A1 | 8/2003 | Arakawa et al. |
| 2003/0184517 A1 | 10/2003 | Senzui et al. |
| 2003/0197740 A1 | 10/2003 | Reponen |
| 2003/0202336 A1 | 10/2003 | Ostergard et al. |
| 2003/0206162 A1 | 11/2003 | Roberts |
| 2003/0206202 A1 | 11/2003 | Moriya |
| 2003/0210537 A1 | 11/2003 | Engelmann |
| 2003/0224831 A1 | 12/2003 | Engstrom et al. |
| 2004/0009788 A1 | 1/2004 | Mantyjarvi et al. |
| 2004/0012572 A1 | 1/2004 | Sowden et al. |
| 2004/0021643 A1 | 2/2004 | Hoshino et al. |
| 2004/0027341 A1 | 2/2004 | Derocher |
| 2004/0032393 A1 | 2/2004 | Brandenberg et al. |
| 2004/0055446 A1 | 3/2004 | Robbin et al. |
| 2004/0055860 A1 | 3/2004 | Huseman |
| 2004/0061677 A1 | 4/2004 | Litwiller |
| 2004/0062033 A1 | 4/2004 | Chu-Chia et al. |
| 2004/0066405 A1 | 4/2004 | Wessler et al. |
| 2004/0070567 A1 | 4/2004 | Longe et al. |
| 2004/0074756 A1 | 4/2004 | Kawakami et al. |
| 2004/0075676 A1 | 4/2004 | Rosenberg et al. |
| 2004/0080682 A1 | 4/2004 | Dalton |
| 2004/0104894 A1 | 6/2004 | Tsukada et al. |
| 2004/0108994 A1 | 6/2004 | Kato |
| 2004/0109357 A1 | 6/2004 | Cernea et al. |
| 2004/0119744 A1 | 6/2004 | Chan |
| 2004/0150619 A1 | 8/2004 | Baudisch et al. |
| 2004/0155865 A1 | 8/2004 | Swiader |
| 2004/0156192 A1 | 8/2004 | Kerr et al. |
| 2004/0165924 A1 | 8/2004 | Griffin |
| 2004/0178997 A1 | 9/2004 | Gillespie et al. |
| 2004/0185912 A1 | 9/2004 | Mason et al. |
| 2004/0196268 A1 | 10/2004 | Hsu et al. |
| 2004/0200699 A1 | 10/2004 | Matsumoto et al. |
| 2004/0207605 A1 | 10/2004 | Mackey et al. |
| 2004/0215986 A1 | 10/2004 | Shakkarwar |
| 2004/0218963 A1 | 11/2004 | Van Diepen et al. |
| 2004/0224638 A1 | 11/2004 | Fadell et al. |
| 2004/0227736 A1 | 11/2004 | Kamrath et al. |
| 2004/0233624 A1 | 11/2004 | Aisenberg |
| 2004/0239622 A1 | 12/2004 | Proctor et al. |
| 2004/0252109 A1 | 12/2004 | Trent, Jr. et al. |
| 2004/0252867 A1 | 12/2004 | Lan et al. |
| 2004/0253989 A1 | 12/2004 | Tupler et al. |
| 2004/0263388 A1 | 12/2004 | Krumm et al. |
| 2004/0267874 A1 | 12/2004 | Westberg et al. |
| 2005/0007339 A1 | 1/2005 | Sato |
| 2005/0012644 A1 | 1/2005 | Hurst et al. |
| 2005/0017957 A1 | 1/2005 | Yi |
| 2005/0024341 A1 | 2/2005 | Gillespie et al. |
| 2005/0030048 A1 | 2/2005 | Bolender |
| 2005/0042012 A1 | 2/2005 | Ward et al. |
| 2005/0052416 A1 | 3/2005 | Backman et al. |
| 2005/0052425 A1* | 3/2005 | Zadesky ............... G06F 3/0338 345/173 |
| 2005/0052426 A1 | 3/2005 | Hagermoser et al. |
| 2005/0052427 A1 | 3/2005 | Wu et al. |
| 2005/0052429 A1 | 3/2005 | Philipp |
| 2005/0068304 A1 | 3/2005 | Lewis et al. |
| 2005/0078093 A1 | 4/2005 | Peterson et al. |
| 2005/0081164 A1 | 4/2005 | Hama et al. |
| 2005/0083299 A1 | 4/2005 | Nagasaka |
| 2005/0083307 A1 | 4/2005 | Aufderheide et al. |
| 2005/0090288 A1 | 4/2005 | Stohr et al. |
| 2005/0104867 A1 | 5/2005 | Westerman et al. |
| 2005/0110768 A1 | 5/2005 | Marriott et al. |
| 2005/0125570 A1 | 6/2005 | Olodort et al. |

(56) References Cited

U.S. PATENT DOCUMENTS

| | | |
|---|---|---|
| 2005/0129199 A1 | 6/2005 | Abe |
| 2005/0139460 A1 | 6/2005 | Hosaka |
| 2005/0140657 A1 | 6/2005 | Park et al. |
| 2005/0143124 A1 | 6/2005 | Kennedy et al. |
| 2005/0146512 A1 | 7/2005 | Hill et al. |
| 2005/0156881 A1 | 7/2005 | Trent et al. |
| 2005/0156890 A1 | 7/2005 | Wierzoch |
| 2005/0162402 A1 | 7/2005 | Watanachote |
| 2005/0195159 A1 | 9/2005 | Hunleth et al. |
| 2005/0204309 A1 | 9/2005 | Szeto |
| 2005/0237308 A1 | 10/2005 | Autio et al. |
| 2005/0253818 A1 | 11/2005 | Nettamo |
| 2005/0283724 A1 | 12/2005 | Griffin |
| 2006/0007131 A1 | 1/2006 | Lane et al. |
| 2006/0032680 A1 | 2/2006 | Elias et al. |
| 2006/0033701 A1 | 2/2006 | Wilson |
| 2006/0034042 A1 | 2/2006 | Hisano et al. |
| 2006/0038791 A1 | 2/2006 | Mackey |
| 2006/0052885 A1 | 3/2006 | Kong |
| 2006/0060455 A1 | 3/2006 | Mimata et al. |
| 2006/0095848 A1 | 5/2006 | Naik |
| 2006/0097997 A1 | 5/2006 | Borgaonkar et al. |
| 2006/0131156 A1 | 6/2006 | Voelckers |
| 2006/0143574 A1 | 6/2006 | Ito et al. |
| 2006/0174568 A1 | 8/2006 | Kinoshita et al. |
| 2006/0181515 A1 | 8/2006 | Fletcher et al. |
| 2006/0181517 A1 | 8/2006 | Zadesky et al. |
| 2006/0197750 A1 | 9/2006 | Kerr et al. |
| 2006/0197753 A1 | 9/2006 | Hotelling |
| 2006/0232557 A1 | 10/2006 | Fallot-Burghardt |
| 2006/0236262 A1 | 10/2006 | Bathiche et al. |
| 2006/0250377 A1 | 11/2006 | Zadesky et al. |
| 2006/0274042 A1 | 12/2006 | Krah et al. |
| 2006/0274905 A1 | 12/2006 | Lindahl et al. |
| 2006/0279896 A1 | 12/2006 | Bruwer |
| 2006/0284836 A1 | 12/2006 | Philipp |
| 2007/0013671 A1 | 1/2007 | Zadesky et al. |
| 2007/0018970 A1 | 1/2007 | Tabasso et al. |
| 2007/0046641 A1 | 3/2007 | Lim |
| 2007/0052044 A1 | 3/2007 | Forsblad et al. |
| 2007/0052691 A1 | 3/2007 | Zadesky et al. |
| 2007/0075965 A1 | 4/2007 | Huppi et al. |
| 2007/0080936 A1 | 4/2007 | Tsuk et al. |
| 2007/0080938 A1 | 4/2007 | Robbin et al. |
| 2007/0080952 A1 | 4/2007 | Lynch et al. |
| 2007/0083822 A1 | 4/2007 | Robbin et al. |
| 2007/0085841 A1 | 4/2007 | Tsuk et al. |
| 2007/0097086 A1 | 5/2007 | Battles et al. |
| 2007/0097089 A1 | 5/2007 | Battles |
| 2007/0106732 A1 | 5/2007 | Weis |
| 2007/0120834 A1 | 5/2007 | Boillot |
| 2007/0126696 A1 | 6/2007 | Boillot |
| 2007/0152975 A1 | 7/2007 | Ogihara |
| 2007/0152977 A1 | 7/2007 | Ng et al. |
| 2007/0152983 A1 | 7/2007 | McKillop et al. |
| 2007/0155434 A1 | 7/2007 | Jobs et al. |
| 2007/0156364 A1 | 7/2007 | Rothkopf |
| 2007/0157089 A1 | 7/2007 | Van Os et al. |
| 2007/0182722 A1 | 8/2007 | Hotelling et al. |
| 2007/0242057 A1 | 10/2007 | Zadesky et al. |
| 2007/0247421 A1 | 10/2007 | Orsley et al. |
| 2007/0247429 A1 | 10/2007 | Westerman |
| 2007/0247443 A1 | 10/2007 | Philipp |
| 2007/0262968 A1 | 11/2007 | Kazuhito et al. |
| 2007/0268275 A1 | 11/2007 | Westerman et al. |
| 2007/0271516 A1 | 11/2007 | Carmichael |
| 2007/0273671 A1 | 11/2007 | Zadesky et al. |
| 2007/0276525 A1 | 11/2007 | Zadesky et al. |
| 2007/0279394 A1 | 12/2007 | Lampell |
| 2007/0285404 A1 | 12/2007 | Rimon et al. |
| 2007/0290990 A1 | 12/2007 | Robbin et al. |
| 2007/0291016 A1 | 12/2007 | Philipp |
| 2007/0296702 A1 | 12/2007 | Strawn et al. |
| 2007/0296709 A1 | 12/2007 | GuangHai |
| 2007/0298231 A1 | 12/2007 | Ito et al. |
| 2008/0006453 A1 | 1/2008 | Hotelling et al. |
| 2008/0006454 A1 | 1/2008 | Hotelling et al. |
| 2008/0007533 A1 | 1/2008 | Hotelling et al. |
| 2008/0018615 A1 | 1/2008 | Zadesky et al. |
| 2008/0018616 A1 | 1/2008 | Lampell et al. |
| 2008/0018617 A1 | 1/2008 | Ng et al. |
| 2008/0036473 A1 | 2/2008 | Jansson |
| 2008/0036734 A1 | 2/2008 | Forsblad et al. |
| 2008/0060925 A1 | 3/2008 | Weber et al. |
| 2008/0069412 A1 | 3/2008 | Champagne et al. |
| 2008/0079699 A1 | 4/2008 | Mackey |
| 2008/0087476 A1 | 4/2008 | Prest |
| 2008/0088582 A1 | 4/2008 | Prest |
| 2008/0088596 A1 | 4/2008 | Prest |
| 2008/0088597 A1* | 4/2008 | Prest ............... G06F 3/0338 345/173 |
| 2008/0088600 A1 | 4/2008 | Prest |
| 2008/0094352 A1 | 4/2008 | Tsuk et al. |
| 2008/0098330 A1 | 4/2008 | Tsuk et al. |
| 2008/0110739 A1 | 5/2008 | Peng et al. |
| 2008/0111795 A1 | 5/2008 | Bollinger |
| 2008/0136792 A1 | 6/2008 | Peng et al. |
| 2008/0143681 A1 | 6/2008 | XiaoPing |
| 2008/0158145 A1 | 7/2008 | Westerman |
| 2008/0165158 A1 | 7/2008 | Hotelling et al. |
| 2008/0196945 A1 | 8/2008 | Konstas |
| 2008/0202824 A1 | 8/2008 | Philipp et al. |
| 2008/0209442 A1 | 8/2008 | Setlur et al. |
| 2008/0215841 A1 | 9/2008 | Bolotin et al. |
| 2008/0264767 A1 | 10/2008 | Chen et al. |
| 2008/0280651 A1 | 11/2008 | Duarte |
| 2008/0284742 A1 | 11/2008 | Prest |
| 2008/0293274 A1 | 11/2008 | Milan |
| 2009/0021267 A1 | 1/2009 | Golovchenko et al. |
| 2009/0026558 A1 | 1/2009 | Bauer et al. |
| 2009/0033635 A1 | 2/2009 | Wai |
| 2009/0036176 A1 | 2/2009 | Ure |
| 2009/0058687 A1 | 3/2009 | Rothkopf et al. |
| 2009/0058801 A1 | 3/2009 | Bull |
| 2009/0058802 A1 | 3/2009 | Orsley et al. |
| 2009/0073130 A1 | 3/2009 | Weber et al. |
| 2009/0078551 A1 | 3/2009 | Kang |
| 2009/0101417 A1 | 4/2009 | Suzuki et al. |
| 2009/0109181 A1 | 4/2009 | Hui et al. |
| 2009/0141046 A1 | 6/2009 | Rathnam et al. |
| 2009/0160771 A1 | 6/2009 | Hinckley et al. |
| 2009/0179854 A1 | 7/2009 | Weber et al. |
| 2009/0197059 A1 | 8/2009 | Weber et al. |
| 2009/0229892 A1 | 9/2009 | Fisher et al. |
| 2009/0273573 A1 | 11/2009 | Hotelling |
| 2010/0058251 A1 | 3/2010 | Rottler et al. |
| 2010/0060568 A1 | 3/2010 | Fisher et al. |
| 2010/0073319 A1 | 3/2010 | Lyon et al. |
| 2010/0099394 A1 | 4/2010 | Hainzl |
| 2010/0149127 A1 | 6/2010 | Fisher et al. |
| 2010/0289759 A1 | 11/2010 | Fisher et al. |
| 2010/0313409 A1 | 12/2010 | Weber et al. |
| 2011/0005845 A1 | 1/2011 | Hotelling et al. |
| 2011/0163996 A1 | 7/2011 | Wassvik et al. |
| 2011/0199624 A1 | 8/2011 | Iwaki |
| 2011/0285662 A1 | 11/2011 | Maenpaa |
| 2012/0075242 A1 | 3/2012 | Hotelling |
| 2012/0106728 A1 | 5/2012 | Ghaffari |
| 2014/0306911 A1 | 10/2014 | Zadesky et al. |
| 2015/0049059 A1 | 2/2015 | Zadesky et al. |
| 2015/0062050 A1 | 3/2015 | Zadesky et al. |
| 2015/0212608 A1 | 7/2015 | McKillop et al. |
| 2015/0331589 A1* | 11/2015 | Kawakita ............... G06F 1/163 715/834 |
| 2016/0004355 A1 | 1/2016 | Zadesky et al. |
| 2016/0154504 A1 | 6/2016 | Zadesky et al. |
| 2017/0010748 A1 | 1/2017 | Zadesky et al. |
| 2017/0010749 A1 | 1/2017 | Zadesky et al. |
| 2018/0307392 A1 | 10/2018 | Zadesky et al. |
| 2019/0034007 A1 | 1/2019 | Zadesky |

(56) References Cited

U.S. PATENT DOCUMENTS

FOREIGN PATENT DOCUMENTS

| | | |
|---|---|---|
| CN | 1455615 | 11/2003 |
| CN | 1499356 | 5/2004 |
| CN | 1659506 | 8/2005 |
| DE | 3615742 | 11/1987 |
| DE | 9316194 U1 | 2/1995 |
| DE | 19722636 | 12/1998 |
| DE | 10022537 | 11/2000 |
| DE | 20019074 | 2/2001 |
| DE | 103 04 704 | 8/2004 |
| DE | 103 08 514 A1 | 9/2004 |
| DE | 10 2004 043 663 | 4/2006 |
| EP | 0 178 157 | 4/1986 |
| EP | 0 419 145 | 3/1991 |
| EP | 0 498 540 | 8/1992 |
| EP | 0 521 683 | 1/1993 |
| EP | 0 551 778 | 7/1993 |
| EP | 0 588 210 | 3/1994 |
| EP | 0 674 288 | 9/1995 |
| EP | 0 731 407 | 9/1996 |
| EP | 0 880 091 | 11/1998 |
| EP | 1 018 680 | 7/2000 |
| EP | 1 026 713 | 8/2000 |
| EP | 1 081 922 | 3/2001 |
| EP | 1 098 241 | 5/2001 |
| EP | 1 133 057 | 9/2001 |
| EP | 1 162 826 | 12/2001 |
| EP | 1 168 396 | 1/2002 |
| EP | 1 184 804 | 3/2002 |
| EP | 1 197 835 A2 | 4/2002 |
| EP | 1 205 836 | 5/2002 |
| EP | 1 244 053 | 9/2002 |
| EP | 1 251 455 | 10/2002 |
| EP | 1 263 193 | 12/2002 |
| EP | 1 347 481 | 9/2003 |
| EP | 1 376 326 | 1/2004 |
| EP | 1 467 392 | 10/2004 |
| EP | 1 482 401 | 12/2004 |
| EP | 1 496 467 | 1/2005 |
| EP | 1 510 911 | 3/2005 |
| EP | 1 513 049 | 3/2005 |
| EP | 1 517 228 | 3/2005 |
| EP | 1 521 683 A2 | 4/2005 |
| EP | 1 542 437 | 6/2005 |
| EP | 1 589 407 | 10/2005 |
| EP | 1 784 058 | 5/2007 |
| EP | 1 841 188 | 10/2007 |
| EP | 1 850 218 | 10/2007 |
| EP | 1 876 711 | 1/2008 |
| FR | 2 686 440 | 7/1993 |
| GB | 2015167 | 9/1979 |
| GB | 2072389 | 9/1981 |
| GB | 2315186 | 1/1998 |
| GB | 2333215 | 7/1999 |
| GB | 2 344 894 A | 6/2000 |
| GB | 2391060 | 1/2004 |
| GB | 2 402 105 | 12/2004 |
| JP | 57-95722 | 6/1982 |
| JP | 57-097626 A | 6/1982 |
| JP | 61-075981 | 4/1986 |
| JP | 61-117619 | 6/1986 |
| JP | 61-124009 | 6/1986 |
| JP | 62-20411 | 1/1988 |
| JP | 63-106826 | 5/1988 |
| JP | 63-181022 | 7/1988 |
| JP | 63-298518 | 12/1988 |
| JP | 2-307114 A | 12/1990 |
| JP | 3-57617 | 6/1991 |
| JP | 3-192418 | 8/1991 |
| JP | 03-237520 A | 10/1991 |
| JP | 4-32920 | 2/1992 |
| JP | 4-205408 | 7/1992 |
| JP | 5-41135 | 2/1993 |
| JP | 5-80938 | 4/1993 |
| JP | 5-101741 | 4/1993 |
| JP | 5-36623 | 5/1993 |
| JP | 5-189110 | 7/1993 |
| JP | 5-205565 | 8/1993 |
| JP | 5-211021 | 8/1993 |
| JP | 5-217464 | 8/1993 |
| JP | 5-233141 | 9/1993 |
| JP | 05-257594 A | 10/1993 |
| JP | 5-262276 | 10/1993 |
| JP | 5-265656 | 10/1993 |
| JP | 5-274956 | 10/1993 |
| JP | 5-289811 | 11/1993 |
| JP | 5-298955 | 11/1993 |
| JP | 5-325723 | 12/1993 |
| JP | 6-20570 | 1/1994 |
| JP | 6-84428 | 3/1994 |
| JP | 6-89636 | 3/1994 |
| JP | 6-96639 | 4/1994 |
| JP | 6-111695 | 4/1994 |
| JP | 6-139879 | 5/1994 |
| JP | 06-149466 A | 5/1994 |
| JP | 6-187078 | 7/1994 |
| JP | 6-208433 | 7/1994 |
| JP | 6-267382 | 9/1994 |
| JP | 6-283993 | 10/1994 |
| JP | 06-289969 A | 10/1994 |
| JP | 6-333459 | 12/1994 |
| JP | 07-073278 A | 3/1995 |
| JP | 7-107574 | 4/1995 |
| JP | 7-41882 | 7/1995 |
| JP | 7-201249 | 8/1995 |
| JP | 7-201256 | 8/1995 |
| JP | 7-253838 | 10/1995 |
| JP | 7-261899 | 10/1995 |
| JP | 7-261922 | 10/1995 |
| JP | 7-296670 | 11/1995 |
| JP | 7-319001 | 12/1995 |
| JP | 8-16292 | 1/1996 |
| JP | 8-115158 | 5/1996 |
| JP | 8-203387 | 8/1996 |
| JP | 8-293226 | 11/1996 |
| JP | 8-298045 | 11/1996 |
| JP | 8-299541 | 11/1996 |
| JP | 8-316664 | 11/1996 |
| JP | 9-44289 | 2/1997 |
| JP | 9-62448 A | 3/1997 |
| JP | 9-69023 | 3/1997 |
| JP | 9-128148 | 5/1997 |
| JP | 9-134248 | 5/1997 |
| JP | 9-218747 | 8/1997 |
| JP | 9-230993 | 9/1997 |
| JP | 9-231858 | 9/1997 |
| JP | 09-233161 | 9/1997 |
| JP | 9-251347 | 9/1997 |
| JP | 9-258895 | 10/1997 |
| JP | 9-282987 A | 10/1997 |
| JP | 9-288926 | 11/1997 |
| JP | 9-512979 | 12/1997 |
| JP | 10-003349 A | 1/1998 |
| JP | 10-63467 | 3/1998 |
| JP | 10-74127 | 3/1998 |
| JP | 10-074429 | 3/1998 |
| JP | 10-198507 | 7/1998 |
| JP | 10-227878 | 8/1998 |
| JP | 10-289061 A | 10/1998 |
| JP | 10-293644 A | 11/1998 |
| JP | 10-320322 | 12/1998 |
| JP | 10-326149 | 12/1998 |
| JP | 11-24834 | 1/1999 |
| JP | 11-184607 | 7/1999 |
| JP | 11-194863 | 7/1999 |
| JP | 11-194872 | 7/1999 |
| JP | 11-194882 | 7/1999 |
| JP | 11-194883 | 7/1999 |
| JP | 11-194891 | 7/1999 |
| JP | 11-195353 | 7/1999 |
| JP | 11-203045 | 7/1999 |
| JP | 11-212725 | 8/1999 |
| JP | 11-272378 A | 10/1999 |

(56) References Cited

FOREIGN PATENT DOCUMENTS

| | | |
|---|---|---|
| JP | 11-327788 A | 11/1999 |
| JP | 11-338628 | 12/1999 |
| JP | 2000-039964 A | 2/2000 |
| JP | 2000-163031 | 6/2000 |
| JP | 2000-163211 A | 6/2000 |
| JP | 2000-172441 A | 6/2000 |
| JP | 2000-194507 A | 7/2000 |
| JP | 2000-200147 | 7/2000 |
| JP | 2000-215549 | 8/2000 |
| JP | 2000-267777 | 9/2000 |
| JP | 2000-267786 | 9/2000 |
| JP | 2000-267797 | 9/2000 |
| JP | 2000-353045 | 12/2000 |
| JP | 2001-22508 | 1/2001 |
| JP | 2001-051790 A | 2/2001 |
| JP | 2001-184158 | 7/2001 |
| JP | 2001-265519 A | 9/2001 |
| JP | 2002-56747 | 2/2002 |
| JP | 3085481 | 2/2002 |
| JP | 2002-210863 A | 7/2002 |
| JP | 2002-215311 | 8/2002 |
| JP | 2002-287889 A | 10/2002 |
| JP | 2002-287903 A | 10/2002 |
| JP | 2002-342033 A | 11/2002 |
| JP | 2003-15796 | 1/2003 |
| JP | 2003-029919 A | 1/2003 |
| JP | 2003-60754 | 2/2003 |
| JP | 2003-99198 | 4/2003 |
| JP | 2003-150303 | 5/2003 |
| JP | 2003-517674 | 5/2003 |
| JP | 2003-173237 A | 6/2003 |
| JP | 2003-280799 | 10/2003 |
| JP | 2003-280807 | 10/2003 |
| JP | 2003-530772 A | 10/2003 |
| JP | 2004-170941 | 6/2004 |
| JP | 2004-184396 A | 7/2004 |
| JP | 2004-362097 | 12/2004 |
| JP | 2005-082086 A | 3/2005 |
| JP | 2005-099635 A | 9/2005 |
| JP | 2005-251218 A | 9/2005 |
| JP | 2005-133824 | 10/2005 |
| JP | 2005-134953 | 10/2005 |
| JP | 2005-285140 A | 10/2005 |
| JP | 2005-293606 A | 10/2005 |
| JP | 2005-235579 | 1/2006 |
| JP | 2006-004453 A | 1/2006 |
| JP | 2006-512626 A | 4/2006 |
| JP | 2005-358970 | 7/2006 |
| JP | 2006-178962 | 7/2006 |
| JP | 2006-178962 A | 7/2006 |
| JP | 3852854 | 12/2006 |
| JP | 2005-312433 | 5/2007 |
| JP | 2007-123473 A | 5/2007 |
| JP | 2007-242035 A | 9/2007 |
| JP | 2007-304757 A | 11/2007 |
| JP | 2008-140182 A | 6/2008 |
| JP | 2008-234212 A | 10/2008 |
| KR | 1998-71394 | 10/1998 |
| KR | 1999-50198 | 7/1999 |
| KR | 2000-08579 | 2/2000 |
| KR | 2001-0052016 | 6/2001 |
| KR | 2001-108361 | 12/2001 |
| KR | 2002-65059 | 8/2002 |
| KR | 2004-0103125 A | 12/2004 |
| KR | 10-2005-0006068 | 1/2005 |
| KR | 10-2006-0021678 | 3/2006 |
| TW | 431607 | 4/2001 |
| TW | 434606 B | 5/2001 |
| TW | 00470193 | 12/2001 |
| TW | 547716 | 8/2003 |
| TW | I220491 | 8/2004 |
| TW | 200622841 A | 7/2006 |
| WO | WO-92/11623 A1 | 7/1992 |
| WO | WO-94/17494 | 8/1994 |
| WO | WO-95/00897 | 1/1995 |
| WO | WO-1996/27968 | 9/1996 |
| WO | WO-98/14863 | 4/1998 |
| WO | WO-98/29886 | 7/1998 |
| WO | WO-98/43202 A1 | 10/1998 |
| WO | WO-99/49443 | 9/1999 |
| WO | WO-00/79772 | 12/2000 |
| WO | WO-01/002949 | 1/2001 |
| WO | WO-01/44912 | 6/2001 |
| WO | WO-2001/74133 A1 | 10/2001 |
| WO | WO-02/08881 | 1/2002 |
| WO | WO-02/080210 | 10/2002 |
| WO | WO-02/089047 A1 | 11/2002 |
| WO | WO-02/095564 A1 | 11/2002 |
| WO | WO-03/025960 | 3/2003 |
| WO | WO-03/044645 | 5/2003 |
| WO | WO-03/044956 | 5/2003 |
| WO | WO-03/088176 | 10/2003 |
| WO | WO-03/090008 | 10/2003 |
| WO | WO-2004/001573 | 12/2003 |
| WO | WO-2004/025449 A2 | 3/2004 |
| WO | WO-2004/025449 A3 | 3/2004 |
| WO | WO-04/040606 | 5/2004 |
| WO | WO-2004/091956 | 10/2004 |
| WO | WO-2005/055620 | 6/2005 |
| WO | WO-2005/064442 | 7/2005 |
| WO | WO-05/076117 | 8/2005 |
| WO | WO-2005/114369 | 12/2005 |
| WO | WO-2005/124526 | 12/2005 |
| WO | WO-2006/020305 | 2/2006 |
| WO | WO-2006/021211 | 3/2006 |
| WO | WO-2006/037545 | 4/2006 |
| WO | WO-2006/104745 | 10/2006 |
| WO | WO-2006/135127 | 12/2006 |
| WO | WO-07/025858 | 3/2007 |
| WO | WO-2007/078477 | 7/2007 |
| WO | WO-2007/084467 | 7/2007 |
| WO | WO-2007/089766 | 8/2007 |
| WO | WO-2008/007372 | 1/2008 |
| WO | WO-2008/045414 | 4/2008 |
| WO | WO-2008/045833 | 4/2008 |
| WO | WO-2008/094791 A2 | 8/2008 |
| WO | WO-2008/094791 A3 | 8/2008 |
| WO | WO-2009/088672 A2 | 7/2009 |
| WO | WO-2009/088672 A3 | 7/2009 |

OTHER PUBLICATIONS

"Der Klangmeister," Connect Magazine, Aug. 1998.

"Design News literature plus," Design News 51(24) (Dec. 18, 1995).

"How do touchscreen monitors know where you're touching?" obtained from http://www.electronics.howstuffworks.com/question716.html generated Jul. 7, 2008; 2 pages.

"Logitech's MX Air Is No Longer Vapor," Gizmodo Australia, retrieved from http://www.gizmodo.com.au/2007/07/logitechs_mx_air_is_no_longer.html on Jan. 11, 2008.

"T9® Txt Input for Keypad Devices," http://tegic.com, Nov. 18, 2005, one page.

Ahl, David, "Controller Update," Creative Computing Vo. 9, No. 12, Dec. 1983.00.

Ahmad, "A Usable Real-Time 3D Hand Tracker," Proceedings of the 28th Asilomar Conference on Sionals, Systems and Computers—Part 2 (of 2) vol. 2 (Oct. 1994), 5 pages.

Alps Electric introduces the GlidePoint Wave Keyboard; combines a gently curved design with Alps' advanced GlidePoint Technology, Business Wire, (Oct. 21, 1996).

Alps Electric Ships GlidePoint Keyboard for the Macintosh; Includes a GlidePoint Touchpad, Erase-Eaze Backspace Key and Contoured Wrist Rest, Business Wire, (Jul. 1, 1996).

Apple Computer, Inc., "Block Diagram and Buses" Apple Developer Connection, Aug. 3, 2004 downloaded from the Internet from http://developer.apple.com/documentation/Hardware/Developer_Notes/Macintosh_CPUs-G . . . (4 pages).

Apple Computer, Inc., "Powerbook G4" Technology Overview, Apr. 2004 (29 pages).

"Apple IPod Mini," www.apple.com (Jan. 6, 2004) (42.02 892).

(56) References Cited

OTHER PUBLICATIONS

Apple Presents iPod: Ultra-Portable MP3 Music Player Puts 1,000 Songs in Your Pocket, retreived from htto:l/www.annle.com/or/librarv/2001/oct/23iood.html on Oct. 23, 2001.
Apple Unveils Optical Mouse and New Pro Keyboard, Press Release, Jul. 19, 2000.
APS show guide to exhibitors, Physics Today, 49(3) (Mar. 1996).
Atari VCS/2600 Peripherals, www.classicgaming.com, downloaded Feb. 28, 2007, pp. 1-15.
Baig, E.C., "Your PC Might Just Need a Mouse," U.S. News and World Report, 108(22) (Jun. 4, 1990).
Bang & Olufsen Telecom a/s, "BeoCom 6000 User Guide 2000." BeoCom 6000, Sales Training Brochure, date unknown.
Bartimo, Jim, "The Portables: Traveling Quickly", Computerworld (Nov. 14, 1983).
Boling, Douglas (1993) "Programming Microsoft Windows CE.NET," p. 109.
Bray, "Phosphors help switch on xenon," Physics in Action, pp. 1-3, Apr. 1999.
Brink et al., "Pumped-up portables", U.S. News & World Report, 116(21) (May 30, 1994).
Brown et al., "Windows on Tablets as a Means of Achieving Virtual Input Devices", Human-Computer Interaction—Interact '90 (1990).
Buxton et al., "Issues and Techniques in Touch-Sensitive Tablet Input", Computer Graphics, 19(3), Proceedings of SIGGRAPH '85 (1985).
Casario, M., "Hands on Macromedia World: Touch Screen Keypad for Mobile Phone by DoCoMo," printed Nov. 18, 2005, 1 page.
Chapweske, Adam "PS/2 Mouse/Keyboard Protocol," 1999, http://panda.cs.ndsu.nodak.edu/~achapwes/PICmicro/PS2/ps2.htm.
Chen et al., "A Study in Interactive 3-D Rotation Using 2-D Control Devices", Computer Graphics 22(4) (Aug. 1988).
Day, B. "Will Cell Phones Render iPods Obsolete?" http://webblogs.javanet/pub/wig/883, printed Dec. 12, 2005, 3 pages.
De Meyer, Kevin, "Crystal Optical Mouse," Feb. 14, 2002, Heatseekerz, Web Article 19.
Delta II™ Keypads, "Introducing the Ultimate Smartphone Keypad," http://www.chicagologic.com, printed Nov. 18, 2005, 2 pages.
Der Klanomeister, Connect Maoazine, Aug. 1998.
Diamond Multimedia Announces Rio PMP300 Portable MP3 Music Player, located at http://news.harmony-central.com/Newp/1998/Rio-PMP300.html visited on May 5, 2008. (4 pages).
DigitWireless, Fastap™ http://www/digitwireless.com/about/faq.html, Dec. 6, 2005; 5pages.
DigitWireless, "Fastap™ Keypads Redefine Mobile Phones," http://www/digitwireless.com printed Nov. 18, 2005; ten pages.
Evans et al., "Tablet-based Valuators that Provide One, Two, or Three Degrees of Freedom", Computer Graphics 15(3) (Aug. 1981).
EVB Elektronik "TSOP6238 IR Receiver Modules for Infrared Remote Control Systems" dated Jan. 2004, 1 page.
Extended European Search Report dated Sep. 6, 2011, directed to EP Patent Application No. 10011508.8; 10 pages.
Extended European Search Report dated Mar. 4, 2015, for EP Patent Application No. 14188138.3; nine pages.
Final Office Action dated Aug. 19, 2008, for U.S. Appl. No. 11/057,050, filed Feb. 11, 2005, 22 pages.
Final Office Action dated Dec. 24, 2008, for U.S. Appl. No. 11/057,050, filed Feb. 11, 2005, 24 pages.
Final Office Action dated Aug. 6, 2009, for U.S. Appl. No. 11/057,050, filed Feb. 11, 2005, 29 pages.
Final Office Action dated Feb. 4, 2010, for U.S. Appl. No. 11/477,469, filed Jun. 28, 2006, 13 pages.
Final Office Action dated Oct. 4, 2010, for U.S. Appl. No. 11/057,050, filed Feb. 11, 2005, 31 pages.
Final Office Action dated Mar. 24, 2011, for U.S. Appl. No. 11/591,752, filed Nov. 1, 2006, 11 pages.
Final Office Action dated Sep. 27, 2011, for U.S. Appl. No. 11/057,050, filed Feb. 11, 2005, 37 pages.
Final Office Action dated Oct. 26, 2011, for U.S. Appl. No. 11/057,050, filed Feb. 11, 2005, 37 pages.
Final Office Action dated Oct. 25, 2012, for U.S. Appl. No. 11/882,005, filed Jul. 30, 2007, 12 pages.
Final Office Action dated Apr. 15, 2013, for U.S. Appl. No. 11/882,004, filed Jul. 30, 2007, 18 pages.
Final Office Action dated Jun. 25, 2015, for U.S. Appl. No. 11/477,469, filed Jun. 28, 2006, 14 pages.
Final Office Action dated Aug. 24, 2015, for U.S. Appl. No. 14/527,585, filed Oct. 29, 2014, 12 pages.
Final Office Action dated Jan. 12, 2016, for U.S. Appl. No. 14/678,578, filed Apr. 3, 2015, 10 pages.
Final Office Action dated Feb. 4, 2016, for U.S. Appl. No. 14/535,101, filed Nov. 06, 2014, seven pages.
Final Office Action dated Feb. 24, 2016, for U.S. Appl. No. 14/850,905, filed Sep. 10, 2015, 10 pages.
Final Office Action dated Apr. 20, 2016, for U.S. Appl. No. 14/850,901, filed Sep. 10, 2015, 11 pages.
Final Office Action dated Aug. 23, 2016, for U.S. Appl. No. 11/057,050, filed Feb. 11, 2005, 22 pages.
Final Office Action dated Sep. 22, 2016, for U.S. Appl. No. 14/527,585, filed Oct. 29, 2014, 14 pages.
Final Office Action dated Oct. 24, 2016, for U.S. Appl. No. 14/850,905, filed Sep. 10, 2015, 12 pages.
Final Office Action dated Oct. 28, 2016, for U.S. Appl. No. 14/678,578, filed Apr. 3, 2015, 10 pages.
Final Office Action dated Mar. 21, 2017, for U.S. Appl. No. 15/017,371, filed Feb. 5, 2016, 42 pages.
Final Office Action dated Apr. 28, 2017, for U.S. Appl. No. 14/535,101, filed Nov. 6, 2014, nine pages.
Final Office Action dated May 15, 2017, for U.S. Appl. No. 14/850,901, filed Sep. 10, 2015, fourteen pages.
Final Office Action dated Sep. 22, 2017, for U.S. Appl. No. 14/527,585, filed Oct. 29, 2014, eight pages.
Final Office Action dated Oct. 5, 2017, for U.S. Appl. No. 14/850,905, filed Sep. 10, 2015, 16 pages.
Final Office Action dated Dec. 15, 2017, for U.S. Appl. No. 14/678,578, filed Apr. 3, 2015, eleven pages.
Final Office Action dated Jan. 29, 2018, for U.S. Appl. No. 11/882,004, filed Jul. 30, 2007, 15 pages.
Final Office Action dated Jan. 31, 2018, for U.S. Appl. No. 14/253,299, filed Apr. 15, 2014, 30 pages.
Final Office Action dated May 18, 2018, for U.S. Appl. No. 14/535,101, filed Nov. 6, 2014, nine pages.
Final Office Action dated Jul. 31, 2018, for U.S. Appl. No. 15/274,747, filed Sep. 23, 2016, 19 pages.
Final Office Action dated Aug. 27, 2018, for U.S. Appl. No. 15/274,754, filed Sep. 23, 2016, 12 pages.
Final Office Action dated Nov. 2, 2018, for U.S. Appl. No. 14/850,901, filed Sep. 10, 2015, nine pages.
Fiore, "Zen Touchpad," Cornell University, May 2000, 6 pages.
Gadgetboy, "Point and click with the latest mice," CNET Asia Product Review, www.asia.cnet.com/reviews ...are/gadgetbol£/O 39001770 380235900,00.htm, downloaded Dec. 5, 2001.
Gfroerer, "Photoluminescence in Analysis of Surfaces and Interfaces," Encyclopedia of Analytical Chemistry, pp. 1-23, Copyright John Wiley & Sons Ltd, Chichester, 2000.
Gibbs, K. "I've Got a Suggestion," posted on the Google Blog, Dec. 10, 2004, http://googleblog.blogspot.com.
Google, "Google Suggest FAQ," Google.com, retrieved on Apr. 1, 2009, from http://labs.google.com/suggestfaq.
Hotelling et al., U.S. Office Action dated Jul. 24, 2009, directed to U.S. Appl. No. 11/483,008; 17, pages.
Hotelling et al., U.S. Office Action dated Jul. 27, 2009, directed to U.S. Appl. No. 11/882,420; 17 pages.
Hotelling et al., U.S. Office Action dated Mar. 30, 2010, directed to U.S. Appl. No. 11/483,008; 20 pages.
Hotelling et al., U.S. Office Action dated Oct. 27, 2010, directed to U.S. Appl. No. 11/483,008; 23 pages.
Hotelling et al., U.S. Office Action dated Apr. 12, 2012, directed to U.S. Appl. No. 13/236,255; 20 pages.
Hotelling et al., U.S. Office Action dated Oct. 1, 2012, directed to U.S. Appl. No. 13/236,255; 21 pages.
Interlink Electronics, VersaPad: Integration Guide, © 1998 (VersaPad), pp. 1-35.

(56) References Cited

OTHER PUBLICATIONS

ISR dated Oct. 15, 2003 directed to corresponding application No. PCT/US2002/33805; 3 pages.
ISR dated Oct. 16, 2003 directed to corresponding application No. PCT/US02/33861; 3 pages.
ISR dated May 7, 2007, directed to corresponding application No. PCT/US2006/045682; 2 pages.
Jesitus, John , "Broken promises?", Industry Week/IW, 246(20) (Nov. 3, 1997).
Kobayashi (1996) "Design of Dynamic Soundscape: Mapping Time to Space for Audio Browsing with Simultaneous Listening," Thesis submitted to Program in Media Arts and Sciences at the Massachusetts Institute of Technolociv, {58 pages).
Kobayashi et al. (1994) "Development of the Touch Switches with the Click Response," Koukuu Denshi Gihou No. 17, pp. 44-48 (published by the Japan Aviation Electronics Industry, Ltd.).
Kobayashi et al. (1997) "Dynamic Soundscape: Mapping Time to Space for Audio Browsing," Computer Human Interaction: 8 pages.
Lee, S.K. et al. (Apr. 1985). "A Multi-Touch Three Dimensional Touch-Sensitive Tablet," Proceedings of CHI: ACM Conference on Human Factors in Computing Systems, pp. 21-25.
Letter re: Bang & Olufsen a/s by David Safran, Nixon Peabody, LLP, May 21, 2004, with BeoCom 6000 Sales Training Brochure, 7 pages .
Luna Technologies International, Inc., LUNA Photoluminescent Safety Products, "Photoluminescence—What is Photoluminescence?" from website at htto://www.lunaolast.com/ohotoluminescence.com on Dec. 27, 2005.
Manufacturers Listing. (Dec. 1995). *Laser Focus World, Buyers Guide '96*, 31(12), 151 pp.
Mattel. (2002). "System Service and Troubleshooting Manual descriptions," *Mattel Electronics Intellivision Intelligent Television*, located at www.dsplib.com/i ntv . . . , last visited Dec. 11, 2002, one page. (Originally cited as "System Service and Troubleshooting Manual," www.dsplib.com/intv/Master downloaded Dec. 11, 2002.).
McAlister, J. "News + Suggest Join Forces," Apr. 28, 2006, posted on the Google Blog, http://googleblog.blogspot.com.
McKillop et al., U.S. Office Action dated Sep. 16, 2010, directed to U.S. Appl. No. 11/591,752; 13 pages.
McKillop et al., U.S. Office Action dated Oct. 25, 2012, directed to U.S. Appl. No. 11/591,752; 11 pages.
Mims, Forrest M. III, "A Few Quick Pointers; Mouses, Touch Screens, Touch Pads, Light Pads, and the Like Can Make Your System Easier to Use," Computers and Electronics, 22 (May 1984).
MobileTouch "Synaptics: Handy Wie Einen iPod Bedienen," Sep. 21, 2004, 1 page, http://www.golem.de/0409/33706.html.
Nass, Richard, "Touchpad input device goes digital to give portable systems a desktop "mouse-like" feel", Electronic Design, 44(18) (Sep. 3, 1996).
National Design Engineering Show, Design News, 52(5) (Mar. 4, 1996).
Neuros MP3 Digital Audio Computer, www.neurosaudio.com, downloaded Apr. 9, 2003.
Nokia, "7280 Bedienungsanleitung" 2005, pp. 1-149, http://web.archive.org/web/20051222023851/http://nds1.nikia.com/phones/files/guides/nokia7280_UDG-de.pdf.
Nokia, "7280 Interaktive Demos" screenshot Nov. 25, 2005, 1 page, http://web.archive.org/web/2005112502636/europe.nokia.com/support/tutorials/7280/german/index.htm.
Nokia, "Nokia 7280 User manual," Nov. 25, 2004, 132 pages, http://nds1.nokia.com/phones/files/guides/Nokia_7280_UG-en.pdf.
Nokia, "Nokia 7280: Interactive Demonstrations," 7 pages, 2004, http://nokia.com/EUROPE_NOKIA_COM_3/r2/support/tutorials/7280/english/indes.html.
Non-Final Office Action dated Nov. 20, 2007, for U.S. Appl. No. 11/057,050, filed Feb. 11, 2005, 33 pages.
Non-Final Office Action dated Nov. 26, 2008, for U.S. Appl. No. 11/057,050, filed Feb. 11, 2005, 24 pages.
Non-Final Office Action dated Feb. 20, 2009, for U.S. Appl. No. 11/057,050, filed Feb. 11, 2005, 24 pages.
Non-Final Office Action dated Mar. 5, 2009, for U.S. Appl. No. 11/477,469, filed Jun. 28, 2006, 11 pages.
Non-Final Office Action dated Nov. 16, 2010, for U.S. Appl. No. 11/477,469, filed Jun. 28, 2006, 12 pages.
Non-Final Office Action dated May 25, 2011, for U.S. Appl. No. 11/057,050, filed Feb. 11, 2005, 32 pages.
Non-Final Office Action dated Mar. 6, 2012, for U.S. Appl. No. 11/591,752, filed Nov. 1, 2006, 11 pages.
Non-Final Office Action dated Jun. 7, 2012, for U.S. Appl. No. 11/882,005, filed Jul. 30, 2007, 11 pages.
Non-Final Office Action dated Jul. 11, 2013, for U.S. Appl. No. 11/882,005, filed Jul. 30, 2007, 12 pages.
Non-Final Office Action dated Dec. 19, 2014, for U.S. Appl. No. 14/166,784, filed Jan. 28, 2014, 11 pages.
Non-Final Office Action dated Jan. 2, 2015, for U.S. Appl. No. 11/477,469, filed Jun. 28, 2006, 13 pages.
Non-Final Office Action dated Feb. 3, 2015, for U.S. Appl. No. 14/527,585, filed Oct. 29, 2014, 11 pages.
Non-Final Office Action dated May 12, 2015, for U.S. Appl. No. 14/535,101, filed Nov. 6, 2014, seven pages.
Non-Final Office Action dated Jun. 29, 2015, for U.S. Appl. No. 14/678,578, filed Apr. 3, 2015, 13 pages.
Non-Final Office Action dated Nov. 12, 2015, for U.S. Appl. No. 14/850,901, Sep. 10, 2015, 10 pages.
Non-Final Office Action dated Nov. 16, 2015, for U.S. Appl. No. 14/850,905, filed Sep. 10, 2015, 8 pages.
Non-Final Office Action dated Mar. 11, 2016, for U.S. Appl. No. 11/057,050, filed Feb. 11, 2005, 18 pages.
Non-Final Office Action dated Mar. 14, 2016, for U.S. Appl. No. 14/527,585, filed Oct. 29, 2014, 13 pages.
Non-Final Office Action dated Jul. 18, 2016, for U.S. Appl. No. 14/850,905, filed Sep. 10, 2015, twelve pages.
Non-Final Office Action dated Aug. 11, 2016, for U.S. Appl. No. 14/535,101, filed Nov. 6, 2014, eight pages.
Non-Final Office Action dated Sep. 9, 2016, for U.S. Appl. No. 14/850,901, filed Sep. 10, 2015, 12 pages.
Non-Final Office Action dated Mar. 24, 2017, for U.S. Appl. No. 14/527,585, filed Oct. 29, 2014, eight pages.
Non-Final Office Action dated Mar. 27, 2017, for U.S. Appl. No. 14/850,905, filed Sep. 10, 2015, twelve pages.
Non-Final Office Action dated May 11, 2017, for U.S. Appl. No. 14/678,578, filed Apr. 3, 2015, 14 pages.
Non-Final Office Action dated Jun. 16, 2017, for U.S. Appl. No. 11/882,004, filed Jul. 30, 2007, 15 pages.
Non-Final Office Action dated Jul. 25, 2017, for U.S. Appl. No. 14/253,299, filed Apr. 15, 2014, 29 pages.
Non-Final Office Action dated Nov. 15, 2017, for U.S. Appl. No. 14/535,101, filed Nov. 6, 2014, eight pages.
Non-Final Office Action dated Nov. 17, 2017, for U.S. Appl. No. 15/274,747, filed Sep. 23, 2016, 27 pages.
Non-Final Office Action dated Nov. 30, 2017, for U.S. Appl. No. 15/274,754, filed Sep. 23, 2016, 13 pages.
Non-Final Office Action dated Feb. 8, 2018, for U.S. Appl. No. 14/850,901, filed Sep. 10, 2015, seven pages.
Non-Final Office Action dated Apr. 4, 2018, for U.S. Appl. No. 14/678,578, filed Apr. 3, 2015, ten pages.
Non-Final Office Action dated Apr. 9, 2018, for U.S. Appl. No. 14/527,585, filed Oct. 29, 2014, ten pages.
Non-Final Office Action dated Sep. 5, 2018, for U.S. Appl. No. 16/011,517, filed Jun. 18, 2018, eleven pages.
Notice of Allowance dated Sep. 14, 2015, for U.S. Appl. No. 14/166,784, filed Jan. 28, 2014, eight pages.
Notice of Allowance dated Dec. 18, 2015, for U.S. Appl. No. 11/057,050, filed Feb. 11, 2005, nine pages.
Notice of Allowance dated Feb. 26, 2016, for U.S. Appl. No. 14/166,784, filed Jan. 28, 2014, seven pages.
Notice of Allowance dated Feb. 9, 2018, for U.S. Appl. No. 14/850,905, filed Sep. 10, 2015, eight pages.
Notice of Allowance dated Apr. 12, 2018, for U.S. Appl. No. 13/605,544, filed Sep. 6, 2012, nine pages.
Notice of Allowance dated Jul. 3, 2018, for U.S. Appl. No. 14/850,905, filed Sep. 10, 2015, five pages.

(56) References Cited

OTHER PUBLICATIONS

Notice of Allowance dated Oct. 11, 2018, for U.S. Appl. No. 14/850,905, filed Sep. 10, 2015, five pages.
Notice of Allowance dated Oct. 29, 2018, for U.S. Appl. No. 13/605,544, filed Sep. 6, 2012, eight pages.
O'Neal, W., Sr. E., et al., "Smart Phones with Hidden Keybaords," printed Nov. 18, 2005, 3 pages, http://msc.com/4250-6452_16-6229969-1.html.
Perenson, Melissa, "New & Improved: Touchpad Redux", PC Magazine (Sep. 10, 1996).
Petersen, Marty, "KoalapadTouch Tablet & Micro Illustrator Software," InfoWorld, (Oct. 10, 1983).
Petruzzellis, "Force-Sensing Resistors" Electronics Now, 64(3), (Mar. 1993).
Phoneyworld, "You heard of Touch Screens Now Check Out Touch Keys" printed Nov. 18, 2005, 2 pages, http://www.phoneyworld.com.
Photographs of Innovation 2000 Best of Show Award Presented at the 2000 Int'l CES Innovations Design & Engineering Showcase, Jan. 6, 2000, 1 page.
Prest et al., U.S. Office Action dated Jan. 11, 2013, directed to U.S. Appl. No. 13/544,527; 7 pages.
Prest et al., U.S. Office Action dated May 16, 2013, directed to U.S. Appl. No. 13/605,544; 5 pages.
Prest et al., U.S. Office Action dated May 16, 2013, directed to U.S. Appl. No. 13/544,527; 7 pages.
Prest et al., U.S. Office Action dated Sep. 27, 2013, directed to U.S. Appl. No. 13/544,527; 7 pages.
Prest et al., U.S. Office Action dated Oct. 10, 2013, directed to U.S. Appl. No. 13/605,544; 8 pages.
Prest et al., U.S. Office Action dated Jan. 24, 2014, directed to U.S. Appl. No. 13/605,544; 10 pages.
Prest et al., U.S. Office Action dated Feb. 6, 2014, directed to U.S. Appl. No. 13/544,527; 9 pages.
Prest et al., U.S. Office Action dated May 9, 2014, directed to U.S. Appl. No. 13/605,544; 11 pages.
Prest et al., U.S. Office Action dated Oct. 31, 2014, directed to U.S. Appl. No. 13/605,544; 8 pages.
Prest et al., U.S. Office Action dated Mar. 4, 2015, directed to U.S. Appl. No. 13/605,544; 8 pages.
Prest et al., U.S. Office Action dated Apr. 30, 2015, directed to U.S. Appl. No. 13/605,544; 8 pages.
Prest et al., U.S. Office Action dated Dec. 10, 2015, directed to U.S. Appl. No. 13/605,544; 8 pages.
Prest et al., U.S. Office Action dated Apr. 27, 2016, directed to U.S. Appl. No. 13/605,544; 10 pages.
Prest et al., U.S. Office Action dated Jan. 31, 2017, directed to U.S. Appl. No. 13/605,544; nine pages.
Prest et al., U.S. Office Action dated Sep. 8, 2017, directed to U.S. Appl. No. 13/605,544; 19 pages.
Preview of exhibitor booths at the Philadelphia show, Air Conditioning Heating & Refrigerator News, 200(2) (Jan. 13, 1997).
Product news, Design News, 53(11) (Jun. 9, 1997).
Product news, Design News, 53(9) (May 5, 1997).
Product Overview—ErgoCommander®, www.logi cad3d.com/products/ErgoCommander.html, downloaded Apr. 8, 2002.
Product Overview—SpaceMouse® Classic, www.logicad3d.com/products/Classic.htm downloaded Apr. 8, 2002.
Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.
Rubine, D.H. (May 1992). "Combining Gestures and Direct Manipulation," CHI '92, pp. 659-660.
SanDisk Sansa Connect User Guide, 2007; 29 pages.
Sears, A., et al., "Data Entry for Mobile Devices Using Soft Keyboards: Understanding the Effects of Keyboard Size and User Tasks," Abstract, Int'l Journal of Human-Computer Interaction, 2003, vol. 16, No. 2, 23 pages.

Soderholm, Lars D., "Sensing Systems for 'Touch and Feel,'" Design News (May 8, 1989) pp. 72-76.
Solutions for Humans, "Compare Keyboards with the Keyboard Compatibility Chart, Learn More About Alternative Keyboards," printed Dec. 8, 2005, 5 pages, http://www.keyalt.com/kkeybrdp.htm.
Sony presents "Choice Without Compromise" at IBC '97 M2 Presswire (Jul. 24, 1997.).
Spiwak, Marc, "A Great New Wireless Keyboard", Popular Electronics, 14(12) (Dec. 1997).
Spiwak, Marc, "A Pair of Unusual Controllers", Popular Electronics 14(4) (Apr. 1997).
Subatai Ahmad, "A Usable Real-Time 3D Hand Tracker," Proceedings of the $28^{th}$ Asilomar Conference on Signals, Systems and Computers—Part 2 (of 2), vol. 2 (Oct. 1994) (from 93.xx).
Sylvania, "Intellvision™ Intelligent Television Master Component Service Manual," pp. 1, 2 and 8, 1979.
Synaptics Touch Pad Interfacing Guide, Second Edition, Mar. 25, 1998, Synaptics, Inc., San Jose, CA, pp. 1-90.
Technology Loan Catalog, "Devices," printed Jun. 6, 2008, 9 pages.
Tessler, Franklin, "Point Pad", Macworld 12(10) (Oct. 1995).
Tessler, Franklin, "Smart Input: How to Chose from the New Generation of Innovative Input Devices," Macworld 13(5) (May 1996).
Tessler, Franklin, "Touchpads", Macworld 13(2) (Feb. 1996).
Textually, "LG Develops New Touch Pad Cell Phones," printed Nov. 18, 2005, 1 page, http://textually.org/textually/archives/2005/06/009903.htm.
Textually, "Microsoft New-Smart Phone Interface: Your Thumb," printed Nov. 18, 2005, 2 pages, http://www.textually.org.
Textually, "Samsung Releases Keyboard Phone in US," printed Nov. 18, 2005, 1 page, http://www.textually.org/textually/archives/2005/11/010482.htm.
Torrone, P., "Google Suggest: The Movie," Dec. 11, 2004, posted on www.Engadget.com.
TouchPad Advanced Features, Synaptics, "Enriching the Interaction Between Humans and Intelligent Devices," Downloaded Aug. 16, 2004 (2 pages) http://www.synaptics.com/products/touchpad_features.cfm.
Touchpad, Notebook PC Manual, ACER Information Co. Ltd., Feb. 16, 2005, pp. 11-12.
Trackpad, Apple Developer Connection (last updated Apr. 19, 2004, printed Aug. 19, 2004) (3 pages) http://developer.apple.com/documentation/Hardware/Developer_Notes/Macintosh_CPUs-. . . .
Translation of Trekstor's Defense Statement to the District Court Mannheim of May 23, 2008; 37 pages.
Triax Custom Controllers Due; Video Game Controllers, HFD—The Weekly Home Furnishings Newspaper 67(1) (Jan. 4, 1993).
Web Archive: web.archive.org/web/*/http://nds1.nokia.com/phones/files/guides/Nokia_7280_UG_en.pdf; Jun. 19, 2009.
Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.
WikiPodLinux, "Four-Button Keyboard," printed Dec. 5, 2005, 2 pages, http://ipodlinux.org/Four-Button_Keyboard.
WikiPodLinux, "Text Input (legacy)," downloaded Dec. 5 2005, 8 pages, http://ipodlinux.org/Text_Input_%28legacy%29.
WikiPodLinux, "Text Input Concepts," Dec. 2005, printed Jun. 17, 2008, 3 pages, http://web/archive.org/web/20051211162524/http://ipodlinux.org/Text_Input_Concepts.
WikiPodLinux, "Text Input Methods," printed Dec. 5, 2005, 8 pages, http://ipodlinux.org/Text_Input_Methods.
Zadesky et al., U.S. Office Action dated Oct. 27, 2006, directed to U.S. Appl. No. 10/643,256; 14 pages.
Zadesky et al., U.S. Office Action dated Mar. 23, 2007, directed to U.S. Appl. No. 10/643,256; 11 pages.
Zadesky et al., U.S. Office Action dated Jul. 13, 2007, directed to U.S. Appl. No. 10/643,256; 13 pages.
Zadesky et al., U.S. Office Action dated Dec. 12, 2007, directed to U.S. Appl. No. 10/643,256; 12 pages.

(56) References Cited

OTHER PUBLICATIONS

Zadesky et al., U.S. Office Action dated Jul. 9, 2008, directed to U.S. Appl. No. 10/643,256; 12 pages.
Zadesky et al., U.S. Office Action dated Mar. 30, 2010, directed to U.S. Appl. No. 11/592,679; 13 pages.
Zadesky et al., U.S. Office Action dated Mar. 31, 2011, directed to U.S. Appl. No. 11/882,005; 7 pages.
Zadesky, S. P. et al., U.S. Office Action dated Dec. 14, 2011, directed to U.S. Appl. No. 11/882,003; 11 pages.
Zadesky et al, U.S. Office Action dated Jan. 17, 2012, directed to U.S. Appl. No. 11/882,004; 13 pages.
Zadesky et al., U.S. Office Action dated Jun. 15, 2012, directed to U.S. Appl. No. 11/882,003; 12 pages.
Zadesky et al, U.S. Office Action dated Jun. 19, 2012, directed to U.S. Appl. No. 11/882,004; 13 pages.
Zadesky et al, U.S. Office Action dated Oct. 26, 2012, directed to U.S. Appl. No. 11/882,004; 16 pages.
Zadesky et al., U.S. Office Action dated Feb. 7, 2014, directed to U.S. Appl. No. 11/882,004; 20 pages.
Zadesky et al., U.S. Office Action dated Jul. 10, 2014, directed to U.S. Appl. No. 11/882,004; 18 pages.
Zadesky et al., U.S. Office Action dated Nov. 21, 2014, directed to U.S. Appl. No. 11/882,004; 18 pages.
Zadesky et al., U.S. Office Action dated Mar. 24, 2015, directed to U.S. Appl. No. 11/882,004; 20 pages.
Zadesky et al., U.S. Office Action dated Jun. 10, 2015, directed to U.S. Appl. No. 11/882,004; 21 pages.
Zadesky et al., U.S. Office Action dated Sep. 10, 2015, directed to U.S. Appl. No. 14/253,299; 19 pages.
Zadesky et al., U.S. Office Action dated Feb. 4, 2016, directed to U.S. Appl. No. 14/253,299; 18 pages.
Zadesky et al., U.S. Office Action dated Jun. 20, 2016, directed to U.S. Appl. No. 14/253,299; 25 pages.
Zadesky et al., U.S. Office Action dated Nov. 25, 2016, directed to U.S. Appl. No. 14/253,299; 28 pages.
Zadesky et al., U.S. Office Action dated Sep. 21, 2016, directed to U.S. Appl. No. 15/017,371; 24 pages.
Final Office Action dated Dec. 20, 2018, for U.S. Appl. No. 14/678,578, filed Apr. 3, 2015, 12 pages.
Notice of Allowance dated Mar. 4, 2019, for U.S. Appl. No. 16/011,517, filed Jun. 18, 2018, ten pages.

\* cited by examiner

CAPACITANCE SENSING ELECTRODE WITH INTEGRATED I/O MECHANISM

CROSS REFERENCE TO RELATED APPLICATIONS

This application is a continuation of U.S. patent application Ser. No. 14/850,905, (now U.S. Publication No. 2016-0004278), filed Sep. 10, 2015, which is a continuation of U.S. patent application Ser. No. 13/236,255, (now U.S. Publication No. 2016-0004278), filed Sep. 19, 2011, which is a continuation of U.S. patent application Ser. No. 11/483,008, (now U.S. Pat. No. 8,022,935), filed Jul. 6, 2006, the entire contents of which are incorporated herein by reference.

This application is related to the following applications, all of which are herein incorporated by reference:

U.S. patent application Ser. No. 10/188,182, titled "TOUCH PAD FOR HANDHELD DEVICE", filed Jul. 1, 2002; U.S. patent application Ser. No. 10/722,948, titled "TOUCH PAD FOR HANDHELD DEVICE", filed Nov. 25, 2003; U.S. patent application Ser. No. 10/643,256, titled "MOVABLE TOUCH PAD WITH ADDED FUNCTIONALITY", filed Aug. 18, 2003; U.S. patent application Ser. No. 10/840,862, titled "MULTIPOINT TOUCHSCREEN", filed May 6, 2004; U.S. patent application Ser. No. 11/057,050, titled "DISPLAY ACTUATOR", filed Feb. 11, 2005; U.S. patent application Ser. No. 11/115,539, titled "HAND HELD ELECTRONIC DEVICE WITH MULTIPLE TOUCH SENSING DEVICES", filed Apr. 26, 2005, U.S. patent application Ser. No. 11/394,493, titled "ILLUMINATED TOUCHPAD", filed Mar. 31, 2006, and U.S. Patent Application No. 60/755,656, titled "TOUCH PAD WITH FEEDBACK", filed Dec. 30, 2005.

BACKGROUND OF THE INVENTION

Field of the Invention

The present invention relates generally to capacitance sensing touch devices. More particularly, the present invention relates to capacitance sensing electrodes with one or more integrated I/O devices.

Description of the Related Art

There are many factors that determine the size of compact portable electronic devices such as laptops, PDAs, media players, cell phones, etc. In most cases, the size of the portable electronic device is limited by the size of the operational components used therein. These components include for example microprocessor chips, printed circuit boards, displays, memory chips, hard drives, batteries, interconnectivity circuitry, indicators, input mechanisms and the like. As such, there is a desired to make these operational components smaller and smaller while maintaining or increasing their power and functionality to perform operations as well as decreasing their cost.

The placement of these components inside the electronic device is also a factor in determining the size of the portable electronic device. For thin devices such as cell phones, PDAs and media players, stacking operational components on top of each other is limited and therefore the operational components may be placed side by side. In some cases, the operational components may even communicate through wires or flex circuits so that they may be spaced apart from one another (e.g., not stacked).

Furthermore, each operational component included in the device requires a certain number of I/O contacts. As a result, increasing the number of operational components also increases the number of I/O contacts. Large numbers of I/O contacts create design difficulties especially in portable devices that are small. For example, they may require large chips and/or additional chips in order to process the large number of I/O contacts. These chips however take up valuable space inside the device and create stack up such that the device needs to be made larger to accommodate the chip(s). Furthermore, routing the I/O through traces or wires from the operational components to the chips may further exacerbate this problem as well as create new ones.

Therefore integrated operational components are desired.

SUMMARY OF THE INVENTION

The invention relates, in one embodiment, to a touch sensing device. The touch sensing device includes one or more multifunctional nodes each of which represents a single touch pixel. Each multifunctional node includes a touch sensor with one or more integrated I/O mechanisms. The touch sensor and integrated I/O mechanisms share the same communication lines and I/O pins of a controller during operation of the touch sensing device.

The invention relates, in another embodiment, to an I/O device for use in a user interface of an electronic device. The I/O device includes a capacitive sensing electrode. The I/O device also includes one or more I/O mechanisms that are integrated with the capacitive sensing electrode such that the electrode and I/O mechanisms are incorporated into a single defined node of the I/O device.

The invention relates, in another embodiment, to a touch device that includes a plurality of touch sensing nodes positioned in an array within a touch plane. At least one of the touch sensing nodes is embodied as a multifunctional touch sensing node that performs touch sensing operations in addition to one or more I/O operations.

BRIEF DESCRIPTION OF THE DRAWINGS

The invention may best be understood by reference to the following description taken in conjunction with the accompanying drawings in which.

DETAILED DESCRIPTION OF THE INVENTION

Figure 1:
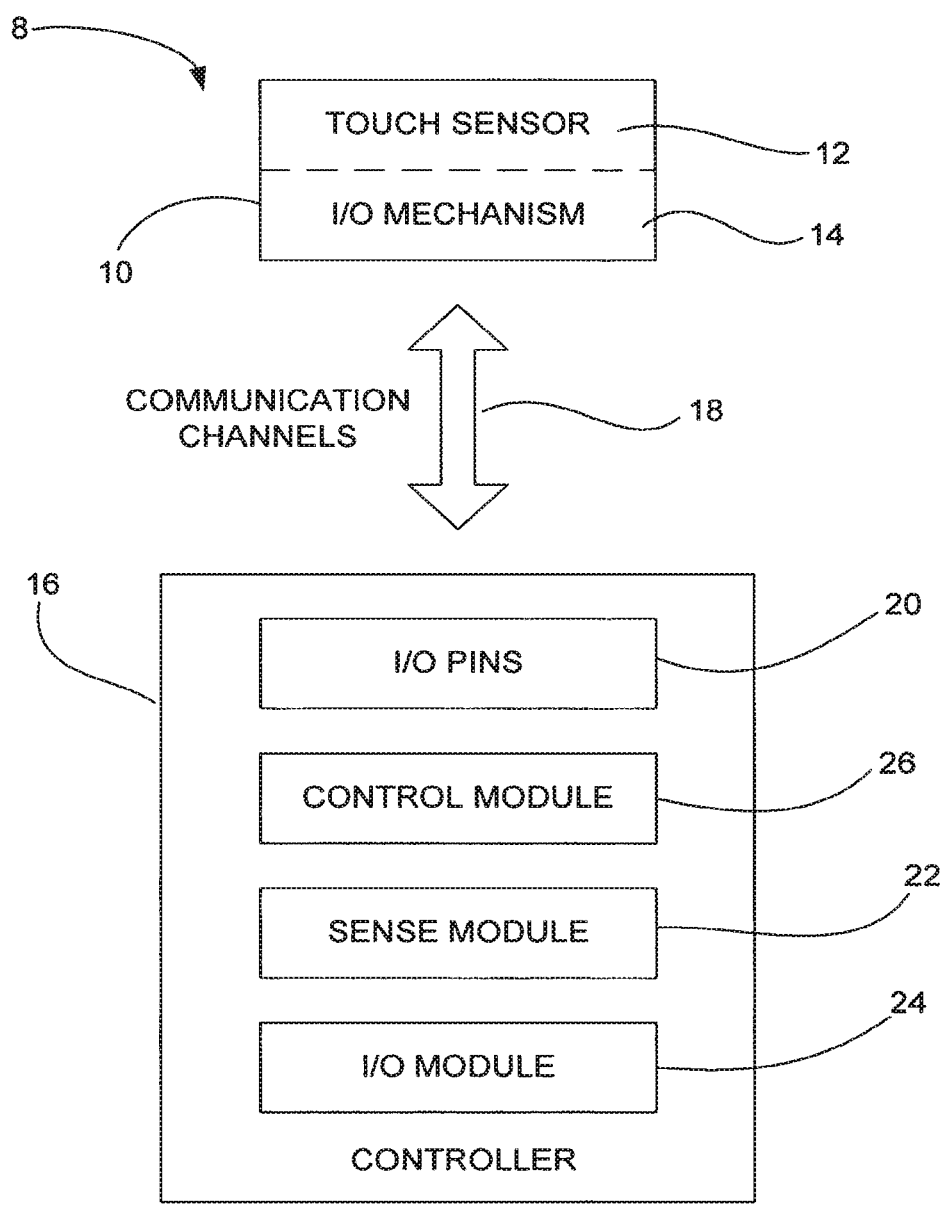
FIG. 1 is a diagram of a touch sensing device including one or more multifunctional nodes, in accordance with one embodiment of the present invention

The user interface is believed to be one or the more important features of an electronic device since it deals directly with the user experience. It typically provides the form, feel and functionality of the device. If the user thinks the user interface is low grade, the user typically thinks the quality of the electronic device as a whole is also low grade. In contrast, if the user thinks the user interface is high grade, the user typically thinks the quality of the electronic device as a whole is also high grade. As such, designers have been making great efforts to improve the design (form, feel and functionality) of the user interface.

There exist today many styles of input devices for use in the user interface. The operations generally correspond to moving objects and making selections and entering data. By way of example, the input devices may include buttons, keys, dials, wheels, mice, trackballs, touch pads, joy sticks, touch screens and the like.

Touch devices such as touch buttons, touch pads and touch screens are becoming increasingly popular in portable electronic devices because of their ease and versatility of operation, their declining price as well as their space saving ability (e.g., planarity). Touch devices allow a user to make selections and move objects by simply moving their finger (or stylus) relative to a touch sensing surface. In general, the touch device recognizes a touch and in some circumstances the characteristics of the touch and a host controller of the portable electronic device interprets the touch data and thereafter performs action based on the touch data.

There are several types of technologies for implementing a touch device including for example resistive, capacitive, infrared, surface acoustic wave, electromagnetic, near field imaging, etc. Capacitive touch sensing devices have been found to work particularly well in portable electronic devices.

Generally speaking, whenever two electrically conductive members come close to one another without actually touching, their electric field interact to form capacitance. In the case of a capacitive touch device, as an object such as a finger approaches the touch sensing surface, a tiny capacitance forms between the object and the sensing points in close proximity to the object. by detecting changes in capacitance at each of the sensing points and noting the position of the sensing points, the sensing circuit can recognize multiple objects and determine the location, pressure, direction, speed and acceleration of the object as it is moved across the touch surface. Examples of capacitive touch devices can be found in U.S. patent application Ser. Nos. 10/722,943, and 10/840,862, both of which are herein incorporated by reference.

More recently, there has been a desire to provide more unique touch devices thereby enhancing the user interface of the portable electronic device. By way of example, U.S. patent application Ser. Nos. 10/643,256 and 11/057,050 describe techniques for creating one or more buttons, switches, etc. with a movable touch device such as a touch pad or touch screen. In addition, U.S. patent application Ser. Nos. 11/394,493 and 60/755,656 describe techniques for providing visual feedback at the touch surface of the touch device such as a touch pad. Moreover, U.S. patent application Ser. No. 11/115,539 describes techniques for incorporating a touch device within a housing wall of a portable electronic device. All of these applications are herein incorporated by reference.

Although these new touch devices work well, there is still a desire to improve their form, feel and functionality as well as to reduce their impact on the size of a portable electronic device. It is generally believed that this can be accomplished through integration. Integration provides many benefits for electronic devices and particularly handheld electronic devices with limited space. Some of the benefits include multiple functionality from the same location and a reduced number of communication lines, both of which save space.

The present invention relates generally to I/O devices with one or more multifunctional nodes including at least a touch or proximity sensor and one or more secondary functional mechanisms integrated with the touch sensor. The secondary functional mechanisms may be used to provide one or more additional input means and/or output means to the touch sensor. The input means may for example include a switch or a sensor, etc., and the output means may for example include an illumination or visual source, an auditory source, a haptics mechanism, etc.

One embodiment of the invention pertains to a touch/proximity sensor with an integrated illumination mechanism such as an LED. The illumination mechanism can be used to provide illumination thereby giving visual feedback at the node. Some arrangements where this type of system may be used can be found in U.S. patent application Ser. Nos. 11/394,493 and 60/755,656, both of which are herein incorporated by reference.

Another embodiment of the invention pertains to a touch sensor with an integrated switching mechanism. The switching mechanism can be used to provide additional inputs at the node. Some arrangements where this type of system may be used can be found in U.S. patent application Ser. Nos. 10/643,256 and 11/057,050, both of which are herein incorporated by reference.

Yet another embodiment of the invention pertains to a touch sensor with an integrated illumination mechanism and a switching mechanism. The node therefore provides visual feedback, and switching features along with touch sensing at the same node.

Although the touch sensors may be widely varied, in most embodiments, the touch sensor mentioned above corresponds to a capacitive sensing electrode.

These and other embodiments of the invention are discussed below with reference to FIGS. 1-28. However, those skilled in the art will readily appreciate that the detailed description given herein with respect to these figures is for explanatory purposes as the invention extends beyond these limited embodiments.

FIG. 1 is a diagram of a touch sensing (or near touch sensing) device 8 including one or more multifunctional nodes 10, in accordance with one embodiment of the present invention. The touch sensing device 8 may for example be a touch button, touch pad, touch screen, touch sensing housing, and/or the like. The multifunctional node 10 represents a single touch pixel. In some cases, the single touch pixel is among many touch pixels in a touch sensing plane of the touch sensing device (e.g., array of pixels of a touch pad, touch screen or other related mechanism). In other cases, the single touch pixel stands alone or with a limited number of other touch pixels to form a touch button or other related mechanism.

As the name implies, the multifunctional node 10 is capable of performing more than one function. For example, in addition to touch sensing (or near touch sensing), the node 10 may provide additional input functionality and/or output functionality. For example, besides touch sensing, the node may include additional sensing functionality, switch functionality, feedback functionality, etc.

As shown, the multifunctional node 10 includes a touch/proximity sensor 12 and one or more I/O mechanisms 14 that are integrated with the touch sensor 12. Integration is the process of merging or joining different devices so that multiple devices become one (incorporating disparate parts into a single defined unit). As a result of integration, the number of I/O contacts for each node 10 can be reduced. The touch sensor 12 enables touch sensing at the node 10 while the one or more I/O mechanisms 14 enable input and/or output functionality at the node 10. By way of example, and not by way of limitation, the touch sensor 12 may be an electrode of a capacitive sensing touch device. Further, the I/O mechanism(s) 14 may be selected from an illumination or visual source, an auditory source, a switch, a sensor, a haptics mechanism and/or the like.

Both the touch sensor 12 and the integrated I/O mechanisms 14 communicate with a controller 16 via the same communication channel 18. That is, they use the same communication lines for operation thereof (e.g., they share communication lines). Any number of shared lines may be used. The shared communication lines may be embodied as traces or other well-known routing technologies such as those associated with printed circuit boards, flex circuits and integrated chips. Furthermore, the controller 16 may be embodied as an application specific integrated circuit chip or it may represent a portion of a host controller.

As shown, the controller 16 includes a set of configurable I/O pins 20 for each multifunctional node 10 of the touch device 8. The number of pins typically corresponds to the number of shared communication lines (e.g., a pin for each line). Because they are configurable, the I/O pins 20 can be rearranged for operations associated with the touch sensor 12 or the I/O mechanism(s) 14 of the node 10. By way of example, the I/O pins functionality may be switched between ground, a voltage source, various digital inputs, sensing inputs, detection inputs, driving outputs, etc.

The controller 16 also includes a sense module 22 and an I/O module 24. The sense module 22 performs sensing operations associated with the touch sensor 12. By way of example, the sense module 22 may monitor touch data generated at each node 10. In the case of a capacitive electrode, the sense module 22 may for example include capacitive sensing circuitry that monitors changes in capacitance at each node 10. The I/O module 24, on the other hand, performs I/O operations associated with the I/O mechanism(s). By way of example, the I/O module 24 may monitor the state of an input mechanism (e.g., switch), and/or provide signals for driving an output mechanism (e.g., light source).

The controller 16 further includes a control module 26 that is operatively coupled to all the various components. During operation, the control module 26 selectively switches the operation between the sense and each of the I/O operations, and also reconfigures the functionality of the I/O pins 20 based on the mode of operation (I/O pins 20 are arranged according to which operation is being performed). In a touch sensing mode, the I/O contacts 20 are configured for monitoring the touch sensor 12 to determine if a touch has taken place at the node 10. In input mode, the I/O contacts 20 are configured for monitoring the input mechanism 14 to determine if an input has been made at the node 10. In the output mode, the I/O contacts 20 are configured to drive the output on the output mechanism 14 at the node 10.

In one embodiment, the control module 26 uses time multiplexing when switching between operations. Time multiplexing is the technique of operating several devices at one node or through the same communication channel by sequentially switching the control of the devices using a time interval delay. Although delayed, time multiplexing allows almost simultaneous transmission of multiple signals over a single channel. In most cases, the delay is so fast it cannot be seen by the user.

By way of example, the control module 26 may activate the sense module 22, and arrange the I/O pins 20 for touch sensing while deactivating the I/O module 24 in order to perform sense operations, and may activate the I/O module 24 and arrange the I/O pins 20 for I/O operations while deactivating the sense module 22 in order to perform I/O operations. This is repeated or cycled back and forth in order to perform each operation in an effective manner.

As mentioned above, the I/O mechanism(s) can be widely varied. Several examples will now be described. In one embodiment, the I/O mechanism is one or more switches. Examples of switches include dome switches, momentary switches, and the like. In another embodiment, the I/O mechanism is one or more separate sensors that are distinct from the touch sensor. Examples of sensors include touch, image, biometric, temperature, microphone, optical proximity detectors and the like. In another embodiment, the I/O mechanism is one or more light sources. Examples of light sources include LEDs, OLEDs, electroluminescent (EL), CCFL (cold second connection point fluorescent lamp), LCD (liquid crystal display and the like. In another embodiment, the I/O mechanism is a speaker. In another embodiment, the I/O mechanism is a vibrator or click mechanism. In another embodiment, the IO mechanism is a resistive heating element.

It should also be noted that various combinations of I/O mechanism can be used. Several examples will now be described. In one embodiment, the I/O mechanism includes one or more switches and one or more sensors. In another embodiment, the I/O mechanism includes one or more switches and one or more light sources. In another embodiment, the I/O mechanism includes one or more sensors and one or more light sources. In another embodiment, the I/O mechanism includes one or more switches and one or more speakers. In another embodiment, the I/O mechanism includes one or more sensors and one or more speakers. In another embodiment, the I/O mechanism includes one or more switches and one or more vibrators. In another embodiment, the I/O mechanism includes one or more sensors and one or more vibrators.

It should also be noted that more than two distinct I/O mechanism can be used. For example, a single node may include a switch, sensor, light source, or switch, light source, vibrator. In a nut shell, any combination of these elements can be created to generate the desired node.

Figure 2:
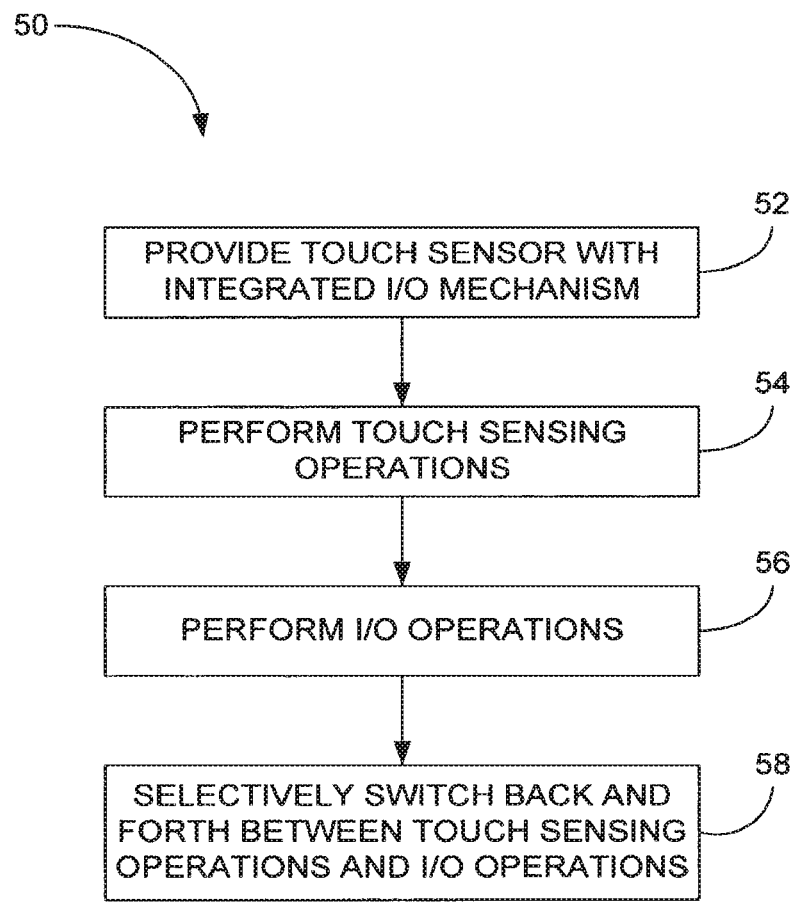
FIG. 2 is a method of operating a touch device, in accordance with one embodiment of the present invention.

FIG. 2 is a method 50 of operating a touch device, in accordance with one embodiment of the present invention. The touch device may for example correspond to the touch device described in FIG. 1. The method 50 begins at block 52 where a touch sensor (or proximity sensor) with an integrated I/O mechanism is provided. The touch sensor and integrated I/O mechanism are configured to share a communication channel in order to communicate with a controller (e.g., they utilize the same communication channel when operating).

The method 50 also includes block 54 where a touch sensing (or proximity sensing) operation is performed at the node via the shared communication channel and touch sensor. By way of example, in the case of capacitive touch or proximity sensing, the electrode may be charged and the capacitance at the charged electrode monitored.

The method 50 also includes block 56 where an I/O operation is performed at the node via the shared communication channel and the I/O mechanism. By way of example, in case of a light source, the light source may be charged or in the case of a switch, the electrical loop may be monitored for open or closed state.

The method 50 also includes block 58 where the touch sensing and I/O operations are selectively switched back and forth via time multiplexing so that touch sensing and I/O can take place at the same node over the same communication channel. By way of example, this may include reconfiguring the functionality of the I/O contacts operatively coupled to the shared communication channel, and then performing the desired operations. By way of example, touch sensing may be activated at T1 for a predetermined amount of time while deactivating I/O operations during that time, and thereafter the I/O mechanism may be activated at T2 for a predetermined amount of time while deactivating sensing operations during that time. These steps are then continuously repeated (e.g., T3=touch sensing, T4=I/O operations, and so on).

FIG. 3 is a diagram of an I/O device 100, in accordance with one embodiment of the present invention. The I/O device may for example be used in a user interface of an electronic device. The I/O device 100 includes one or more multifunctional nodes 102 and a controller 104 in communication with the multifunctional nodes 102. For ease of illustration, a single multifunctional node 102 is shown. It should be appreciated however that multiple multifunctional nodes 102 may be used as for example in a touch plane of a touch pad, touch display or touch housing. Furthermore, it should be noted that the multifunctional nodes may be used solely or in combination with other types of nodes (such as conventional single functionality nodes). By way of example, the I/O device may be composed of only the multifunctional nodes or alternatively it may be composed of some multifunctional nodes and some conventional nodes (e.g., touch sensors with integrated I/O and plain old touch sensors). The arrangement of nodes generally depends on the desired needs of the I/O device.

In the illustrated embodiment, the multifunctional I/O node 102 includes a capacitive sensing electrode 106 for detecting capacitive changes at the multifunctional I/O node 102. The capacitive changes can be used to determine touches or near touches (e.g., proximity) around the multifunctional I/O node 102. The electrode 106 may for example operate under the principal of self capacitance. In self capacitance, the electrode 106 is charged by a voltage source 108, and when an object such as a finger comes in close proximity to the electrode 106, the object steals charge thereby affecting the capacitance at the multifunctional I/O node 102. The capacitance at the multifunctional I/O node 102 is monitored by a capacitive sensing circuit I/O of the controller.

The electrode 106 may be formed from almost any shape and size. For example they may be formed as squares, rectangles, circles, semi-circles, ovals, triangles, trapezoids, other polygons and or more complicated shapes such as wedges, crescents, stars, lightning bolts, etc. The size may be smaller than a finger tip, larger than a finger tip, or just about the size of a finger tip. The size and shape generally depends on the desired needs of the I/O device.

The multifunctional I/O node 102 also includes a secondary I/O mechanism 112 that is integrated with the capacitive sensing electrode 106. That is, the electrode and I/O mechanism are incorporated into a single defined node. The I/O mechanism 112 can be an input mechanism such as a switch or a sensor, etc. and/or an output mechanism such as light source, display, auditory source, haptics mechanism, etc. During operation, the I/O mechanism 112 is driven by an I/O circuit 111, which is part of the controller 104.

Figure 3A:
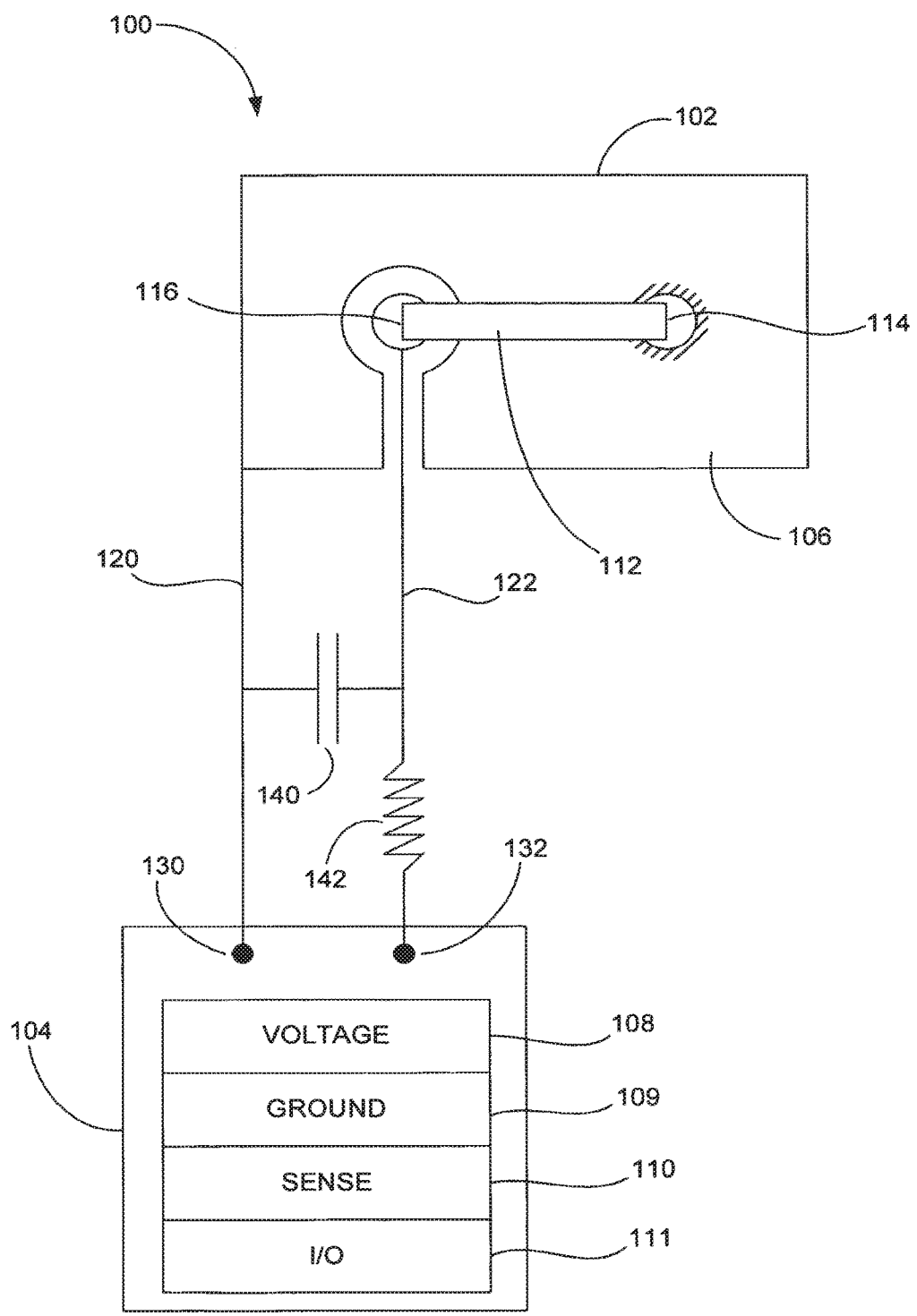
FIG. 3A is a diagram of an I/O device, in accordance with one embodiment in which the I/O mechanism may be placed completely within the edges of the electrode.
Figure 3B:
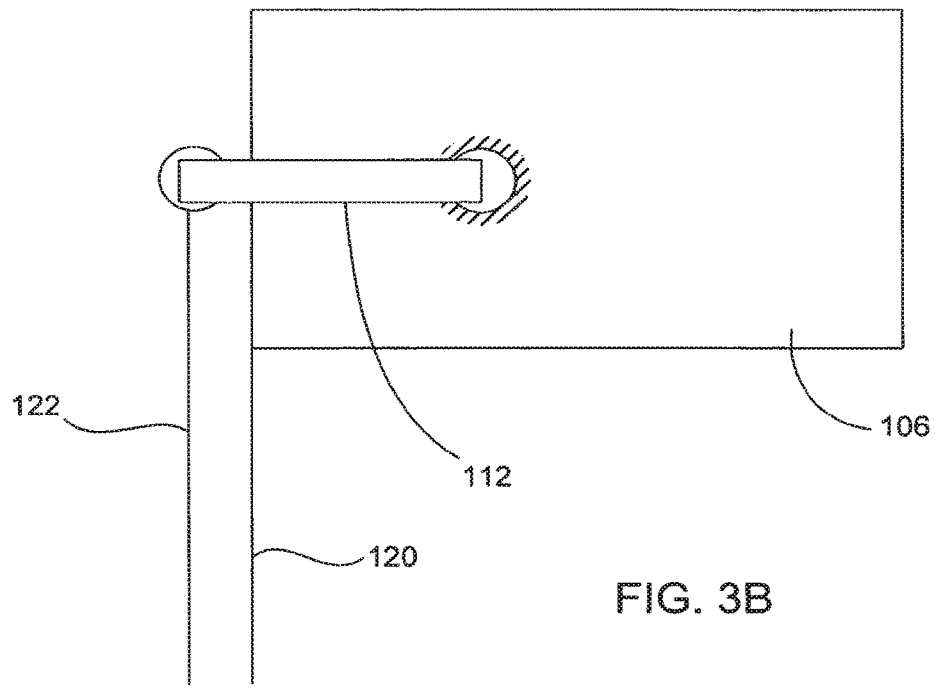
FIG. 3B is a diagram of an I/O device in accordance with one embodiment in which the I/O mechanism may be placed partially within the edges and partially outside of the edge of the electrode.
Figure 3C:
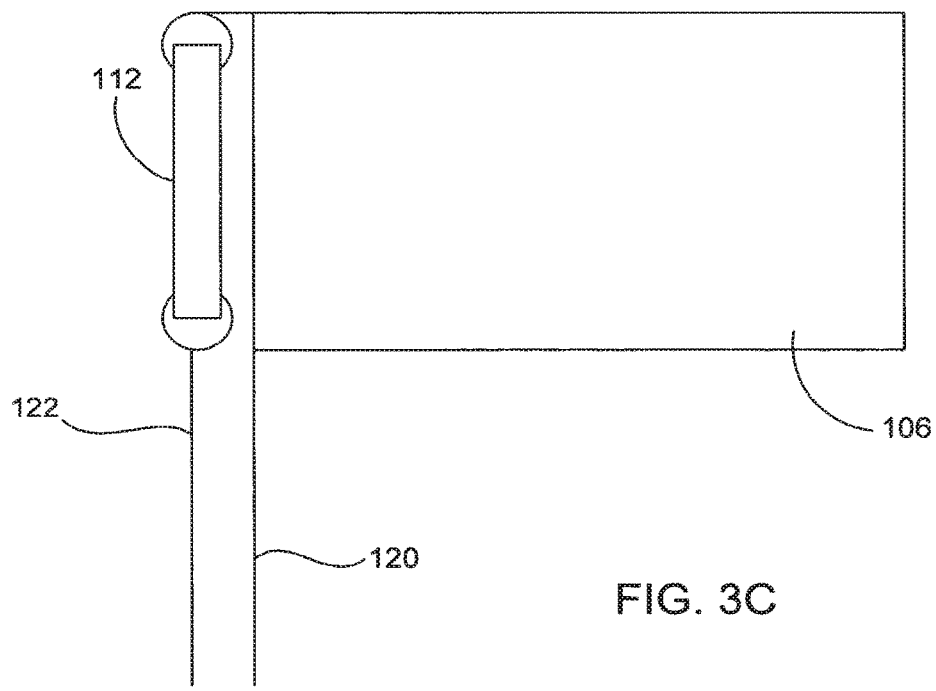
FIG. 3C is a diagram of an I/O device in accordance with one embodiment in which the I/O mechanism may be placed entirely outside the edges of the electrode.

The position of the second I/O mechanism 112 relative to the electrode 106 may be widely varied. It is generally preferred to place the I/O mechanism 112 in close proximity and more particularly entirely within the confines of the electrode 106 in order to save space as well as to provide multiple functions at the same location (overlaid functionality). For example, the I/O mechanism 112 may be placed completely within the edges of the electrode 106 (as shown in FIG. 3A). Alternatively, the I/O mechanism 112 may be placed partially within the edges and partially outside of the edge of the electrode 106 (as shown in FIG. 3B) or entirely outside the edges of the electrode 106 such as next to or juxtaposed the edge(s) (as shown in FIG. 3C). Moreover, the I/O mechanism 112 may be placed underneath, above or in the same plane as the electrode 106. The placement generally depends on the desired needs of the I/O device 100 and the manufacturing techniques employed.

To elaborate on integration, the I/O mechanism 112 generally includes a first connection point 114 (or contact, terminal, pad, etc.) and a second connection point 116 (or contact, terminal, pad, etc.). The first connection point 114 is electrically coupled to the electrode 106 while the second connection point 116 is electrically isolated from the electrode 106. Furthermore, a first communication line 120 is electrically coupled to the electrode 106 and a second communication line 122 is electrically isolated from the electrode 106 (and the other communication line) and electrically coupled to the second connection point 116 of the I/O mechanism 112. For example, the second connection point 116/second communication line 122 may be positioned in an open area found within the electrode (as shown in FIG. 3A). Alternatively, the second connection point 116/second communication line 122 may be spaced apart from the outside edge of the electrode (as shown in FIGS. 3B and 3C).

The first communication line 120 is also connected to a first adjustable I/O 130 contact of the controller 104, and the second communication line 122 is connected to a second adjustable I/O contact 132 of the controller 104. The I/O contacts 130 and 132 can be adjusted between ground, voltage, digital inputs, sense circuit blocks, or other activation block such as amps, etc. depending on whether the node is being used for capacitive sensing or I/O operations. Any type of source, sense, block may be used.

As mentioned above the I/O mechanism can be widely varied. In accordance with one particular embodiment, the I/O mechanism is a switch such as a dome switch or momentary switch. For example, the switch may be connected via its terminals (connection points). By integrating a switch with an electrode, a separate switch circuit is avoided as well as saving space within an electronic device. In accordance with another embodiment, the I/O mechanism is a light source such as an LED. For example, the LED may be connected via its anode and cathode (connection points). By integrating an LED with an electrode, the need to cut a large hole in the electrode in order to provide illumination to the node, and having the LED on a separate circuit is avoided. As should be appreciated, in some cases, in order to illuminate a node, a hole is cut in the electrode and an LED, which is operated on a separate circuit is placed behind the hole. This is believed to degrade the ability to sense capacitively at the LED region. The step of integrating the LED and/or switch with the electrode as disclosed herein avoids this by allowing a smaller total solution that enables capacitive sensing in the same region as the LED and using the same circuit.

It should be appreciated, that the present invention is not limited to switches and LEDs and that other I/O mechanism can be used.

Generally speaking, and not by way of limitation, the capacitance sensing function may operate on both 132 and 130 together, or common mode. For example, the capacitance sensing function may apply force modulating voltage waveforms on both contacts, and measure current on both contacts, in order to detect capacitance. This common mode arrangement allows touch sensing capacitance to be detected for not only between the user and the electrode region, but also for the touch sensing capacitance between the user and the I/O element 112. In this way, the effective area of the touch sensing electrode may be extended to include the I/O element. The I/O function may operate on 132 and 130 using differential mode, as for example driving a voltage or current from 132 to 130 (or vice-versa), or sensing a voltage or current from 132 to 130. This allows differentiation between the capacitance sensing, which is done common mode, and driving or sensing the I/O element, which is done differentially.

In some cases, a capacitor 140 may be electrically positioned between the first and second communication lines 120 and 122 to increase the total electrode area. That is, the addition of the capacitor causes the I/O mechanism to be included in the total electrode area thereby improving the electrode's capacitive sensing. A resistor may be further employed when the I/O mechanism is embodied as a light source such as an LED. The resistor limits DC current to flow at a specific value. In one example, the capacitor is a 20 pF capacitor, and the resistor is a 10 K-ohm resistor. If the I/O mechanism is a switch, the resistor may be replaced with a 0 ohm jumper or just a circuit trace.

An alternative to the external capacitor and resistor is for the capacitive sensing mode, connecting 130 and 132 together internally with a switch, and then connecting both of these to the capacitive sensing circuit (on-IC chip), and for the LED light mode, connecting 130 to ground and connecting 132 to a current source (on-chip). In the later, the function of 130 and 132 may be reversed depending on the polarity the LED is inserted.

In order to perform sensing and I/O operations using the same communication lines, the controller uses time multiplexing to switch between sensing and the I/O operations. In one embodiment, during sensing operations, the first I/O contact is modulated and used for capacitive sensing and the second I/O contact is set to high impedance. Further, during I/O operations when the I/O mechanism is an LED, the first I/O contact is set to output high and the second I/O contact is set as output low. Further still, during I/O operations when the I/O mechanism is a switch, the first I/O contact is set for output low and the second I/O contact is set as a weak pull up resistor internal to the IC, and after waiting a short amount of time (for example, if internal pull up is 100K then with external capacitance of 20 pF time constant is 2 µs, so wait 10 µs for five time constants) then sample the digital state at the second I/O contact. If it is a logic high then the switch is open. If it is a logic low then the switch is closed.

Referring to FIGS. 4-7, the assembly of the I/O device 100 will be described in greater detail. As shown, the electrode 106 is typically positioned on a substrate 150. The substrate 150 may for example be a printed circuit board or a flexible membrane such as those of a flex circuit or some other suitable material for supporting the electrode(s) 106 thereon (e.g., housing). Furthermore, the electrode 106 may be formed from any thin conductive material. By way of example, the electrode 106 may be embodied as a metallic foil that is adhered to the substrate, a conductive paint or ink that is coated on the substrate, a conductive material that is printed, deposited or etched on the substrate, plates or bands that are molded or embedded into the substrate or any other suitable arrangement. Moreover, the I/O device 100 typically includes a cover film 152 disposed above the electrode 106. The cover film 152 may be formed from any suitable dielectric material such as glass or plastic. The cover film 152 serves to protect the under layers and provide a surface for allowing an object to be placed thereon. The cover film 152 also provides an insulating layer between the object and the electrode 106. Furthermore, the cover film 152 is suitably thin to allow sufficient electrode coupling.

Figure 4:
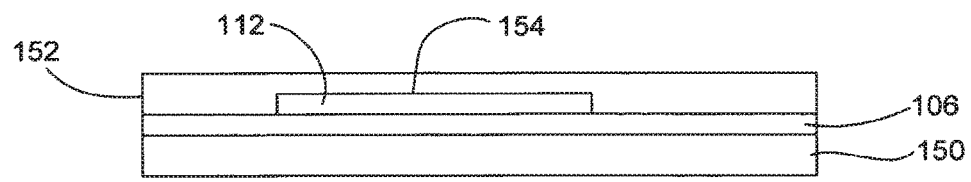
FIG. 4 is a side elevation view of an I/O device, in accordance with one embodiment of the present invention.
Figure 5:
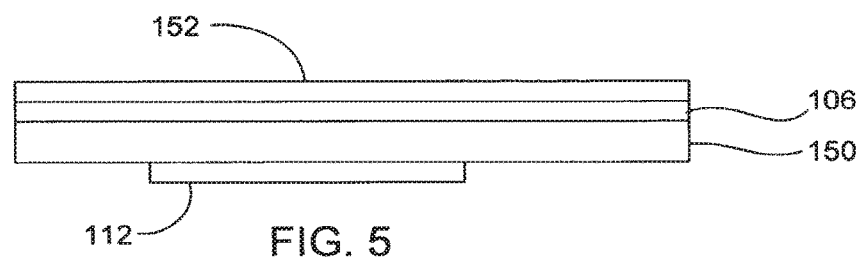
FIG. 5 is a side elevation view of an I/O device, in accordance with one embodiment of the present invention.
Figure 6:
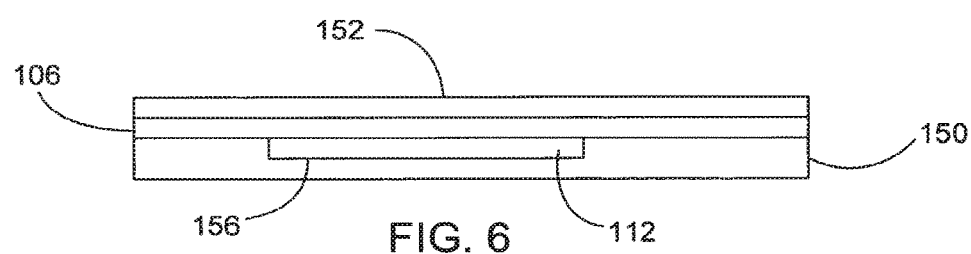
FIG. 6 is a side elevation view of an I/O device, in accordance with one embodiment of the present invention.
Figure 7:
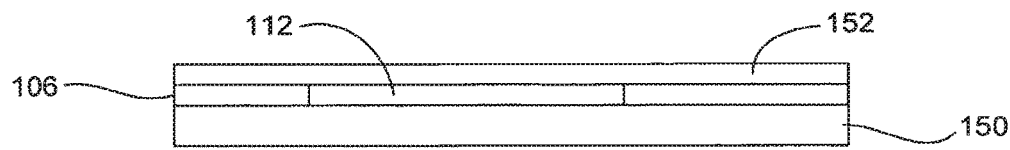
FIG. 7 is a side elevation view of an I/O device, in accordance with one embodiment of the present invention.

The position of the I/O mechanism(s) 112 relative to the electrode 106 may be widely varied. As shown in FIG. 4, the I/O mechanism 112 may be positioned above the electrode 106. In this embodiment, the cover film 122 may include a void 154 for placement of the I/O mechanism 112. As shown in FIGS. 5 and 6, the I/O mechanism 112 is positioned below the electrode 106. In FIG. 6, the I/O mechanism 112 is disposed inside a void 156 in the substrate 150 and sandwiched between the electrode 106 and the substrate 150. In FIG. 5, the I/O mechanism 112 is disposed on the opposite side of the substrate 150. Alternatively, as shown in FIG. 7, the I/O mechanism 112 may even be positioned within substantially the same plane as the electrode 106. This typically depends on the thickness of the various layers. It should be noted that in cases where multiple I/O mechanism 112 are used, any combination of the above may be used. For example, in one implementation, an LED 112 is positioned above the electrode 106, and a switch 112 is positioned below the electrode 106 on the backside of the substrate 150.

The I/O mechanism may come in a variety of forms including mechanical structures, integrated circuit chips, surface mount devices, and the like. Furthermore, they can be connected using a variety of techniques. One example are separate solder pads disposed at the first connection point and second connection point.

In some cases, the various layers may further be embodied as transparent or semi transparent materials. For example, the conductive material of the electrodes may be formed from indium tin oxide (ITO), the dielectric material of the cover film may be formed as clear or partially transparent plastic or glass, and the substrate may be formed as clear or partially transparent plastic or glass (e.g., clear Mylar sheet). This may be done to allow visual feedback through the various layers of the I/O device. For example, in cases where the I/O mechanism is a display or light source In one implementation, the electrodes are placed on one side of a printed circuit board (PCB), and the controller in the form a an integrated circuit chip is mounted on the back side of the PCB, with conventional PCB routing connecting the I/O contacts of the electrodes and I/O mechanism to the I/O contacts of the IC chip. The IC chip may for example be an ASIC. In another implementation, the electrodes are placed on one side of a printed circuit board (PCB) and the I/O contacts are coupled to the I/O contacts of a floating IC via a flex circuit with printed traces. For example, the PCB containing the electrodes is connected to one end of a flex circuit and the sensor IC is attached to the other end of the flex circuit. Alternatively, the electrodes may be applied directly to the flexible member of the flex circuit.

Figure 8:
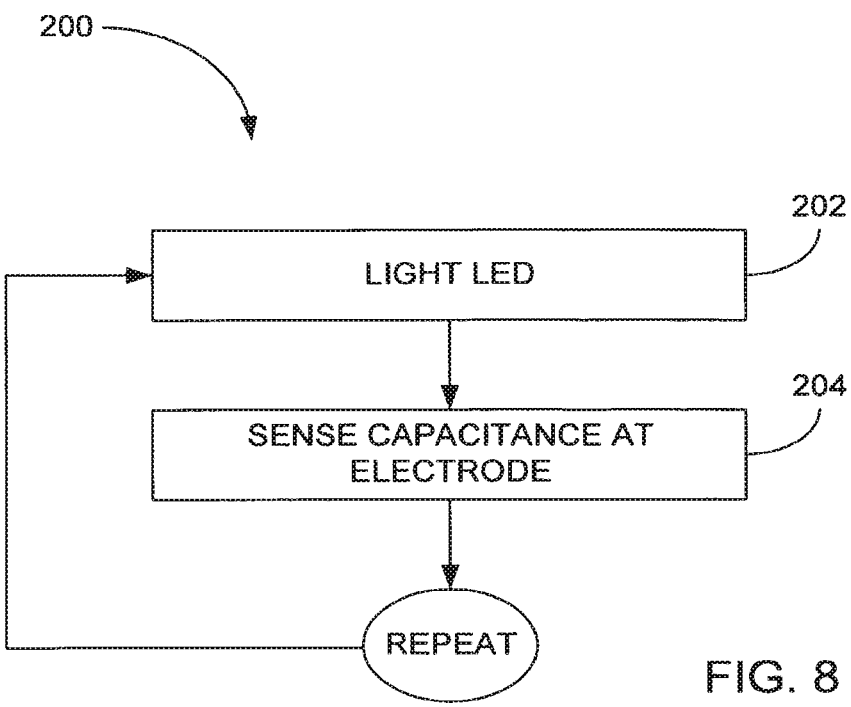
FIG. 8 is a method of operating an I/O device having a capacitance sensing electrode with integrated LED, in accordance with one embodiment of the present invention.

FIG. 8 is a method 200 of operating an I/O device having a capacitance sensing electrode with integrated LED, in accordance with one embodiment of the present invention. The I/O device may for example correspond to the I/O device shown in FIG. 3. The method 200 begins at block 202 where the LED is lighted. Thereafter in block 204, capacitance sensing is performed. Blocks 202 and 204 are cycled back and forth during operation of the I/O device using time multiplexing. By way of example, blocks 202 and 204 may be repeated every 10 to 20 ms, and more particularly 16 ms.

Figure 9:
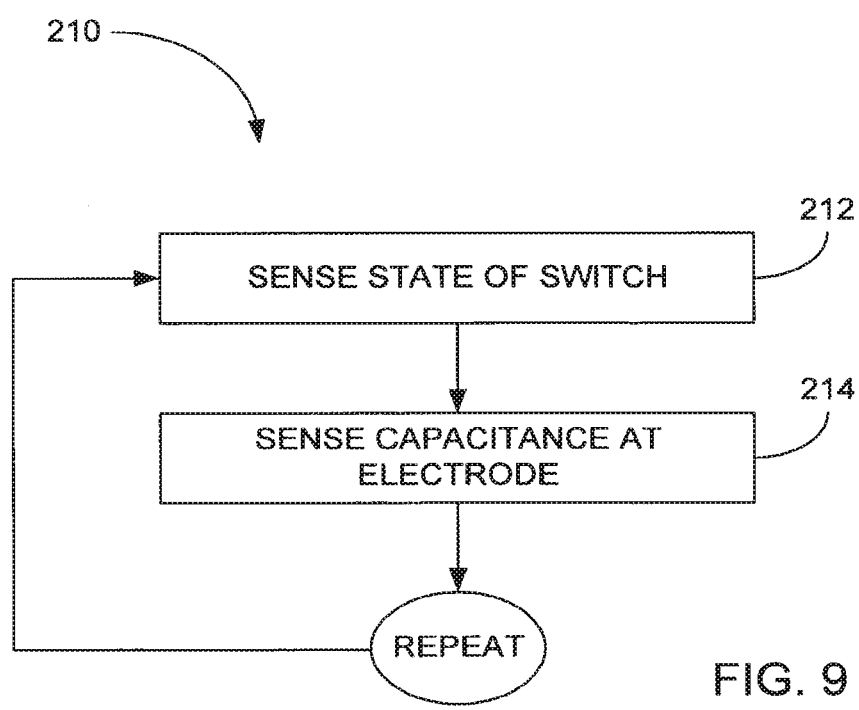
FIG. 9 is a method of operating an I/O device having a capacitance sensing electrode with integrated switch, in accordance with one embodiment of the present invention.

FIG. 9 is a method 210 of operating an I/O device having a capacitance sensing electrode with integrated switch, in accordance with one embodiment of the present invention. The I/O device may for example correspond to the I/O device shown in FIG. 3. The method begins at block 212 where the state of the switch is sensed. Thereafter in block 214, capacitance sensing is performed. Blocks 212 and 214 are cycled back and forth during operation of the I/O device. By way of example, blocks 212 and 214 may be repeated every 10 to 20 ms, and more particularly 16 ms.

Figure 10:
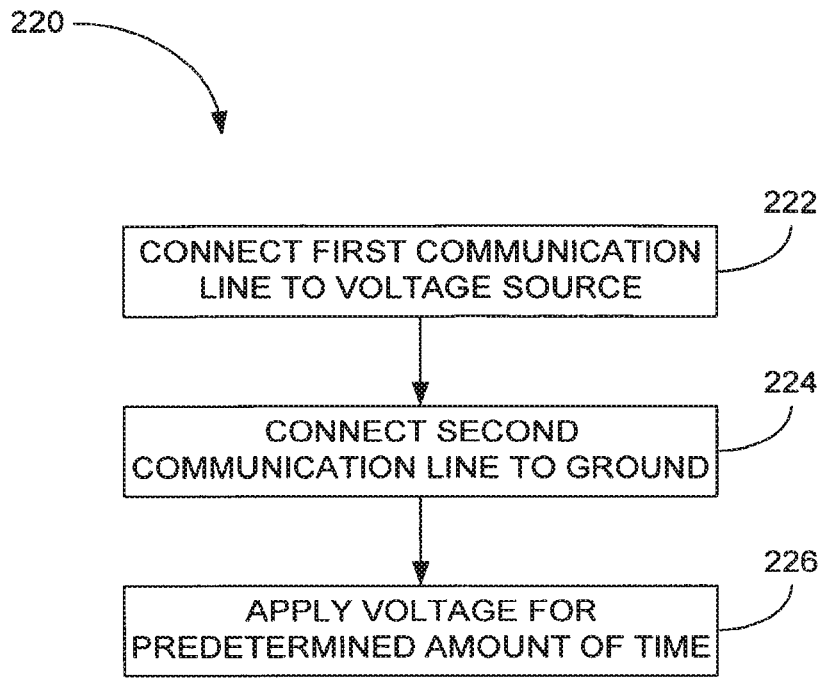
FIG. 10 is a method of lighting an LED, in accordance with one embodiment of the present invention.

FIG. 10 is a method 220 of lighting the LED of FIG. 8 (e.g., block 202). The method 220 includes block 222 where a first communication line is connected to a voltage source, and block 224 where the second communication line is connected to ground. This may be accomplished by adjusting the functionality of the I/O pins at the controller. In one example, the voltage source is configured to output 3V. The method also includes block 226 where the voltage is supplied for a predetermined amount of time. The amount of time depends on the desired brightness of the LED. The greater the time the greater the brightness, and the lower the time the lower the brightness. The time may for example be selected between 0 and 100 micro-seconds. In order to turn the LED off, the first communication line can be switched to ground or alternatively the second communication line can be switched to the voltage source.

Figure 11:
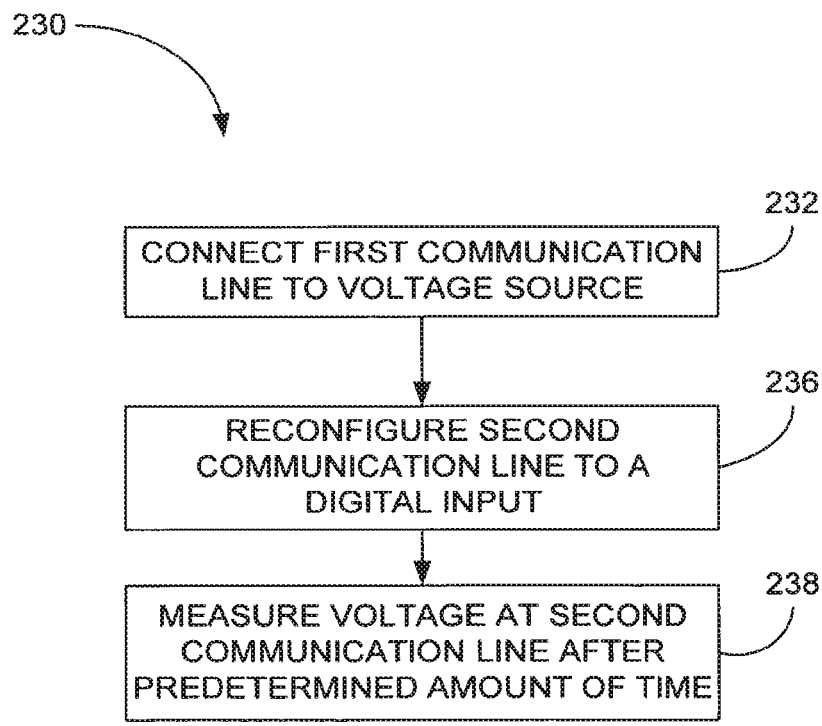
FIG. 11 is a method of sensing the state of a switch, in accordance with one embodiment of the present invention.

FIG. 11 is a method 230 of sensing the state of the switch of FIG. 9 (e.g., block 212). The method 230 includes block 232 where the first communication line is connected to a voltage source. This may be accomplished by adjusting the functionality of the I/O pins at the controller. In one example, the voltage source is configured to output 3V. The method 230 also includes block 236 where the second communication line is reconfigured to a digital input (as for example with an on-chip pull up resistor to Vcc 3V). After waiting a predetermined amount of time (e.g., 10 microseconds), the voltage of the second communication line is measured. If the voltage at the second communication line is at Vcc, then the switch is open, and if the voltage of the line is grounded then the switch is closed. In the event of a closed switch, an action associated with the switch is performed. This may for example be accomplished with a host controller.

Figure 12:
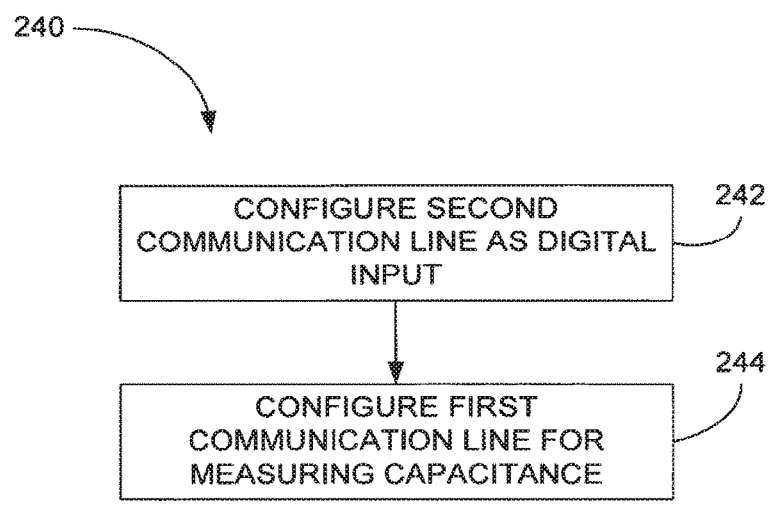
FIG. 12 is a method of performing capacitance sensing with the electrode, in accordance with one embodiment of the present invention.

FIG. 12 is a method 240 of performing capacitance sensing with the electrode of FIG. 8 or 9. The method 240 includes block 242 where the second communication line is configured for a digital input (create open circuit). The method 240 also includes block 244 where the first communication line is configured for measuring the capacitance at the electrode (e.g., measuring self capacitance).

An alternate embodiment of 240 that goes along with no off chip resistors or capacitors is connect first and second line to each other using an on-chip switch, and then connecting both of them to capacitive sensing measurement circuit.

Although the invention has been primarily described as having one I/O mechanism, it should be appreciated that this is not a limitation. In some cases, it may be desirable to include multiple I/O mechanism at the same node thereby providing even more functionality from the same location while also limiting the number of communication lines.

Figure 13:
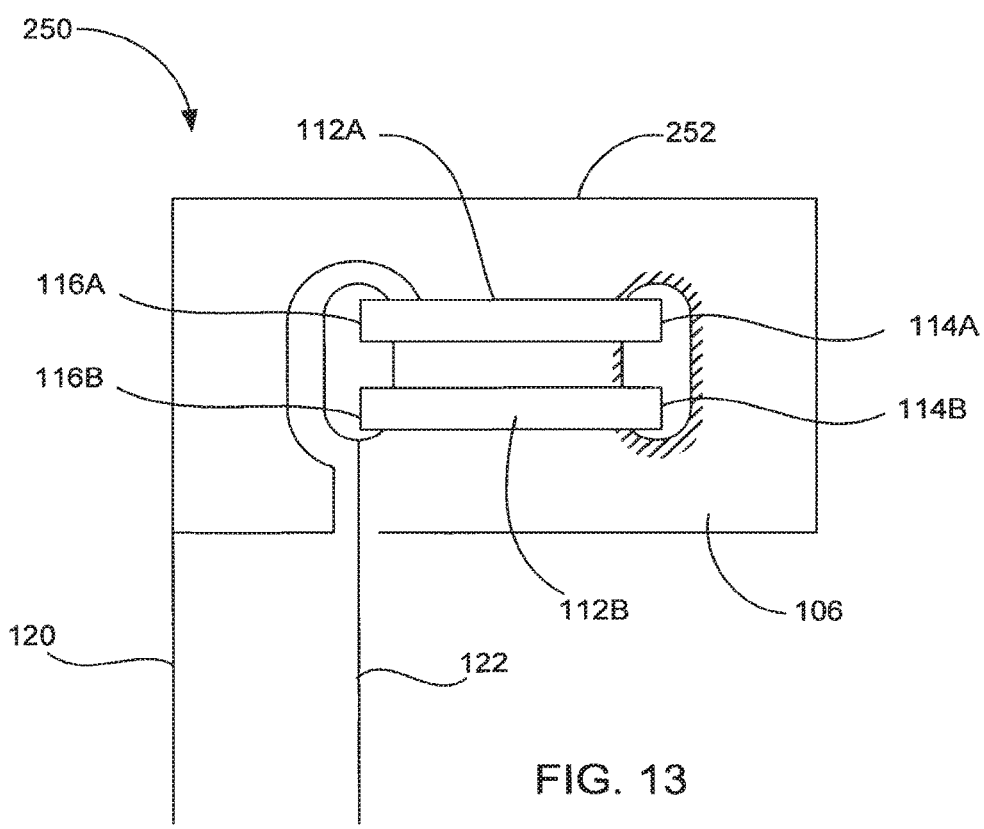
FIG. 13 is a diagram of an I/O device with a multifunctional node having a capacitance sensing electrode and multiple integrated I/O mechanisms, in accordance with one embodiment of the present invention.

FIG. 13 is a diagram of an I/O device 250 with a multifunctional node 252 having a capacitance sensing electrode 106 and multiple integrated I/O mechanisms 112. Any number of I/O mechanisms 112 may be used. In the illustrated embodiment, the multifunctional node 252 includes two I/O mechanisms 112A and 112B to go along the capacitance sensing electrode 106. The I/O mechanisms 112A and 112B are positioned in parallel. The first connection points 114A&B of each I/O mechanism 112A&B is electrically coupled to the electrode 106 while the second connection points 116A&B of each I/O mechanism 112A&B is electrically isolated from the electrode 106. Furthermore, the first communication line 120 is electrically coupled to the electrode 106 and the second communication line 122 is electrically isolated from the electrode 106 (and the other communication line) and electrically coupled to the second connection points 116A&B of the I/O mechanisms 112A&B. For example, the second connection points 116/second communication line 122 may be positioned similarly to a single second connection point as for example in an open area found within the electrode (as shown).

The combination of the I/O mechanisms 112 may be widely varied. For example, the combination may include a pair of input mechanisms, a pair of output mechanisms, or an input mechanism and an output mechanism. The input and output mechanism can be selected from any of those previously described. In one particular embodiment, the first I/O mechanism is a switch for providing additional inputs at the node and the second I/O mechanism is a light source for providing visual feedback at the node.

In order to perform sensing and I/O operations using the same communication lines, the controller uses time multiplexing to switch between sensing and the multiple I/O operations. Each step can be accomplished as mentioned above.

Figure 14:
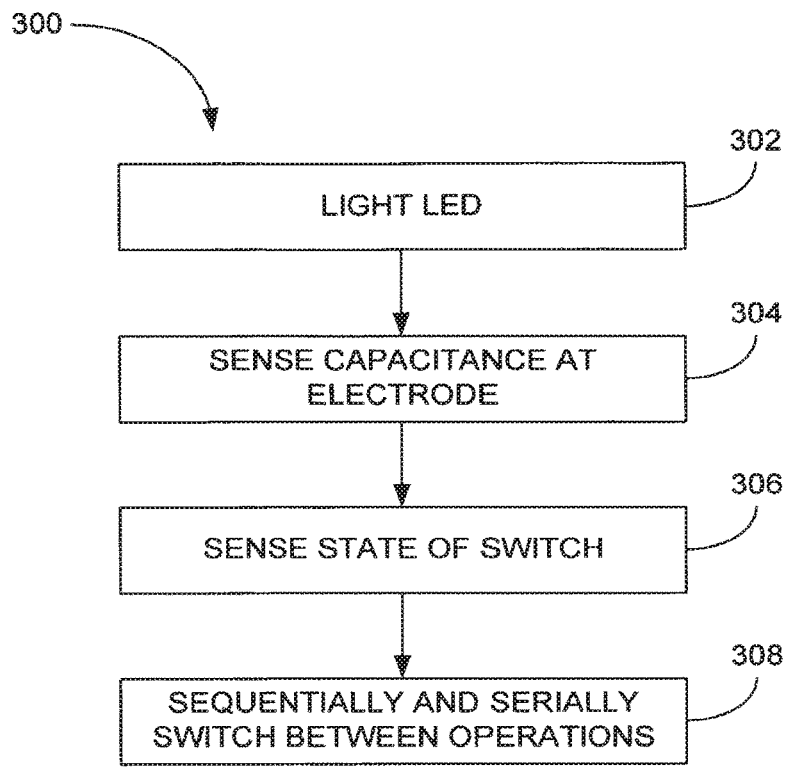
FIG. 14 is a method of operating an I/O device having a capacitance sensing electrode with integrated LED and switch, in accordance with one embodiment of the present invention.

FIG. 14 is a method 300 of operating an I/O device having a capacitance sensing electrode with integrated LED and switch, in accordance with one embodiment of the present invention. The I/O device may for example correspond to the I/O device shown in FIG. 13. The method 300 begins at block 302 where the LED is lighted. Thereafter in block 304, capacitance sensing is performed. Thereafter in block 306, the state of the switch is sensed. Blocks 302 and 304 and 306 are sequentially switched on and off during operation of the I/O device using time multiplexing. By way of example, blocks 302-306 may be repeated every 10 to 20 ms, and more particularly 16 ms.

Figure 15:
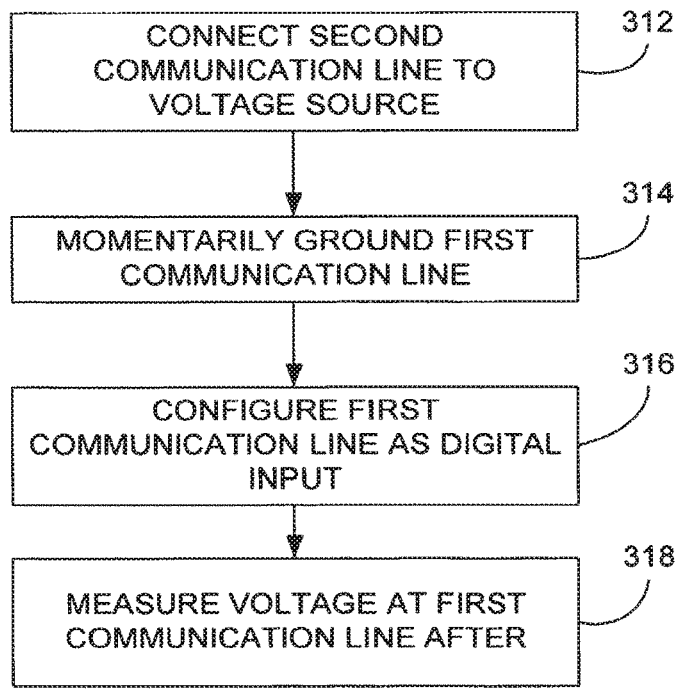
FIG. 15 is an alternate method of sensing the state of a switch, in accordance with one embodiment of the present invention.

FIG. 15 is an alternate method 310 of sensing the state of a switch. The method may be performed in FIGS. 9 and 14. The method 310 includes block 312 where the second communication line is connected to a voltage source (e.g., 3 V). The method 310 also includes block 314 where the first communication line is momentarily grounded. Thereafter, in block 316, the first communication line is configured for digital input. After waiting a predetermined amount of time (10 micro-seconds), the voltage of the first communication line is measured in block 318 (read state of first communication line). If the line is grounded (low), the switch is open, and if the line is not grounded (high) the switch is closed. In the event of a closed switch, an action associated with the switch is performed. This may for example be accomplished with a host controller. This particular implementation is typically accomplished with the resistor and capacitor as shown in FIG. 3A.

In any of the previously described embodiments, the nodes may be positioned in a conventional 2D array of rows and columns or alternatively they may be positioned in a non 2D array thereby allowing a wide variety of user interfaces to be created. In fact, non 2D arrays may be beneficial in creating user interfaces that better fit portable electronic devices. For example, different orientations of nodes may be used to provide input functionality that is directed at the specific applications of the portable electronic device. The user interfaces may for example include scrolling regions or parameter control regions where nodes are set up in succession along a prescribed path, and/or button regions where individual nodes may represent distinct button functions. With regards to a scrolling or parameter control, the nodes may be placed in an open loop arrangement such as a line, or they may be placed in closed loop arrangement such as a circle. Generally speaking, the nodes can be placed to form any shape whether in a single plane or multiple planes. Examples include squares, rectangles, circles, semi-circles, ovals, triangles, trapezoids, other polygons, pill shapes, S shapes, U shapes, L shapes, star shapes, plus shape, etc.

Any number of nodes in any combination may be used. In one embodiment, only multifunctional nodes are used. In another embodiment, multifunctional nodes are mixed with conventional nodes. For example, capacitive sensing electrodes with integrated I/O mechanisms can be solely or in combination with standard non integrated capacitive sensing electrodes. The number of nodes is typically determined by the size of the touch device as well as the size of the electrodes and 24 used at the nodes. In many cases, it is desirable to increase the number of nodes so as to provide higher resolution (e.g., more information can be used for such things as acceleration). However, as the number increases, so does the number of I/Os. Therefore a careful balance between resolution and number of I/Os needs to be made when designing the touch device.

Figure 16:
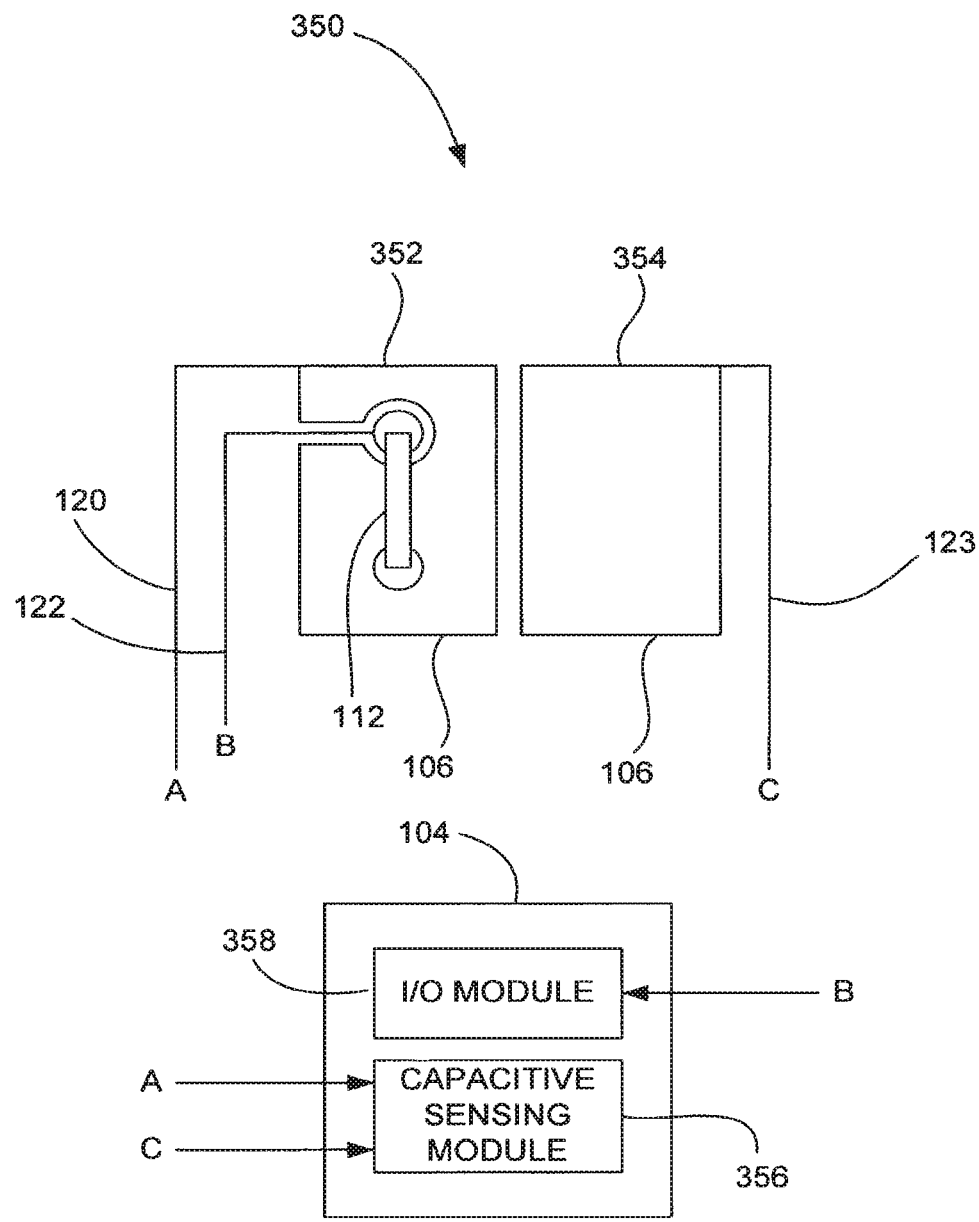
FIG. 16 is a diagram of a touch device including a multifunctional node and a single functional node, in accordance with one embodiment of the present invention.

FIG. 16 is a diagram of a touch device 350 including a multifunctional node 352 and a single functional node 354, in accordance with one embodiment of the present invention. Although only one node of each type is shown, it should be appreciated that the touch device can include more than one of each type. By way of example, in the case of a touch pad, the touch device may include an array of nodes 352 and 354 set up in various layouts within a touch plane.

As shown, each node includes an electrode 106. The multifunctional node additionally includes one or more I/O mechanisms 112 integrated therewith while the single functional node does not include any integrated I/O mechanisms. The multifunctional nodes 352 communicates with the controller 104 over a pair of shared communication lines 120 and 122 (see for example FIG. 3 or 13). The single functional nodes 354 communicate with the controller 104 via a single communication line 123. The single communication line 123 is connected to the capacitive sensing module 356. During capacitive sensing, the first communication line 120 is also connected to the capacitive sensing module 356. During I/O operations, the second communication line 122 is connected to the I/O module 358. This is similar to that described above.

Figure 17:
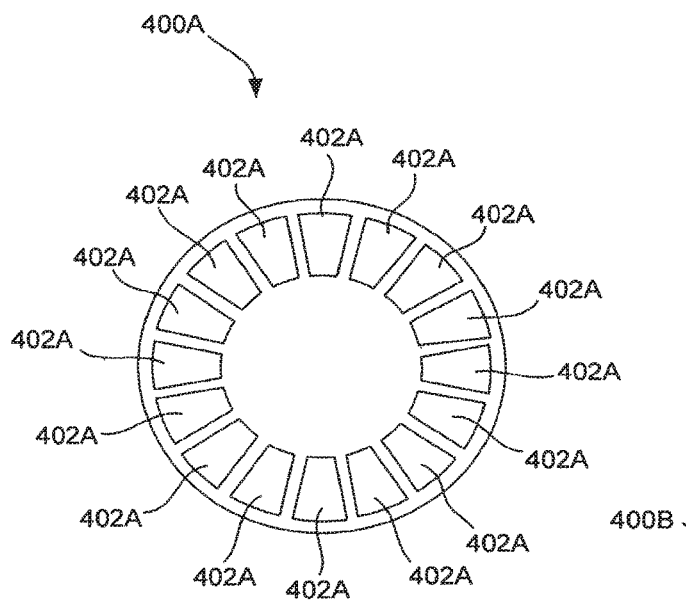
FIG. 17 is a diagram of circular touch device, in accordance with one embodiment of the present invention.
Figure 18:
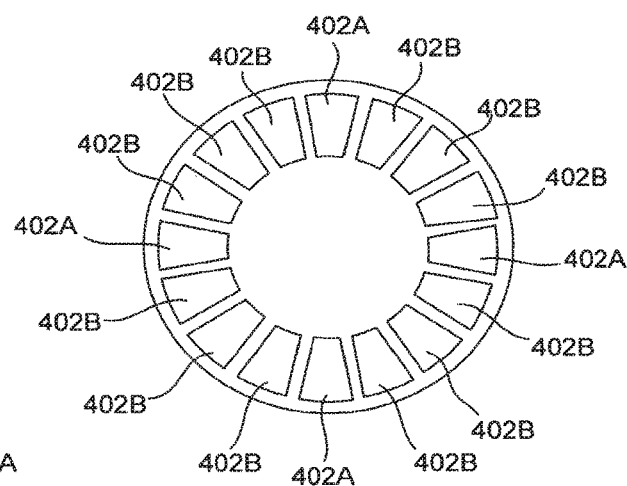
FIG. 18 is a diagram of circular touch device, in accordance with one embodiment of the present invention.
Figure 19:
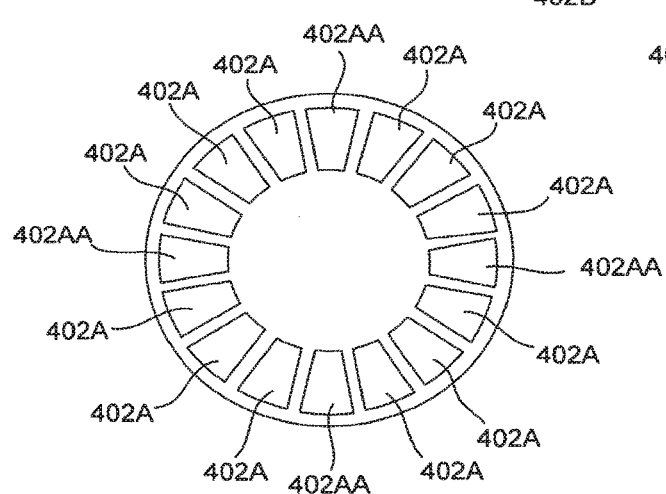
FIG. 19 is a diagram of circular touch device, in accordance with one embodiment of the present invention.

FIGS. 17-19 are diagrams of circular touch devices 400A-C, in accordance with one embodiment of the present invention. The circular touch devices 400 are divided into several independent and spatially distinct nodes 402 that are positioned in a circular manner. Each of the nodes 402 represents a different angular position within the circular shape. Any number of nodes may be used to form the circular arrangement. However, at least a portion of the nodes are multifunctional nodes 402A. In some cases, all of the nodes 402 are multifunctional nodes 402A. In other cases, the touch device 400 includes both multifunctional nodes 402A and conventional single functional nodes 402B (e.g., cap. sensing electrode by itself). Furthermore, within this arrangement, the multifunctional nodes 402A may be the same multifunctional node or they may be different multifunctional nodes. For example, some of the nodes 402A may include a single I/O mechanism while other nodes may include multiple I/O mechanisms. Alternatively, some of the nodes 402A may include a first I/O mechanism while other nodes include a second I/O mechanism. Any arrangement of nodes may be used.

FIG. 17 illustrates a circular touch device 400A consisting of all multifunctional nodes 402A. That is, each of the nodes 402 of the touch device 400 are configured as multifunctional nodes 402A that include a touch sensor with integrated I/O mechanisms.

In one implementation, the multifunctional nodes 402A may only include an integrated LED. This arrangement may be configured to perform like the touch devices described in U.S. patent application Ser. Nos. 11/394,493 and 60/755,656.

In another implementation, the multifunctional nodes 402A may only include an integrated switch in order to provide additional inputs. This arrangement may be configured to perform like the touch devices described in U.S. patent application Ser. Nos. 10/643,256 and 11/057,050.

In another implementation, the multifunctional nodes 402A may include both an integrated switch and LED. By way of example, the LED may be used illuminate symbols associated with the functionality of the integrated switch.

FIG. 18 illustrates a circular touch device 400B consisting of some multifunctional nodes 402A and some conventional single functionality nodes 402B. In the illustrated embodiment, the multifunctional nodes 402A are positioned at key positions about the circular arrangement. For example, they may be positioned at north, south, east and west positions or alternatively at 12 o clock, 3 o clock, 6 o clock and 9 o clock positions.

In one implementation, the multifunctional nodes 402A may only include an integrated LED in order to illuminate symbols. The symbols may be used to indicate a function associated with that node or region of the touch device 400B. This arrangement may work particularly well with the mechanical switch/touch pad described in U.S. patent application Ser. No. 10/643,256. For example, the symbols may be used to indicate functionality associated with physical switches housed underneath and engaged by a movable touch pad (e.g., tilting). In the case of a music player for example the symbols and physical switches may correspond to menu, play/pause, forward, and reverse.

In another implementation, the multifunctional nodes 402A may only include an integrated switch in order to provide additional inputs. The switches may be used in addition to or in place of the physical switches described in U.S. patent application Ser. No. 10/643,256.

In another implementation, the multifunctional nodes 402A may include both an integrated switch and LED. The LED is used illuminate symbols associated with the functionality of the integrated switch.

FIG. 19 illustrates a circular touch device 400C that includes all multifunctional nodes 402A. This is similar to the embodiment shown in FIG. 17 except that some of the multifunctional nodes 402A include one I/O mechanism 402A while others include two I/O mechanisms 402AA. In the illustrated embodiment, the dual I/O mechanism multifunctional nodes 402AA include integrated LEDs and integrated switches while the single I/O mechanism multifunctional node 402A includes just an LED. The dual I/O nodes 402AA are positioned at key positions about the circular arrangement. For example, they may be positioned at north, south, east and west positions or alternatively at 12 o clock, 3 o clock, 6 o clock and 9 o clock positions while the multifunctional nodes with one I/O mechanism 402A are positioned at the remaining positions. This particular embodiment allows each of the nodes 402 to be illuminated while still offering additional inputs at key nodes.

It should be noted that the circular arrangements describe in FIGS. 17-19 are not just limited to angular positioned nodes and that radial nodes may also be used. The radial nodes start at the center or near center of the circular arrangement and jet out radially to the edge of the circular arrangement.

It should also be appreciated that the invention is not limited to circular arrangements, and that other arrangements can be used. FIGS. 20-26 show several examples of other arrangements that can be used. In all of these arrangements, at least one of the nodes 402 is a multifunctional node 402A as described above. In some cases, all of the nodes 402 are multifunctional nodes 402A while in other cases only a portion of the nodes 402 are multifunctional nodes 402A. The remaining nodes being conventional non multifunctional nodes 402B.

Figure 20:
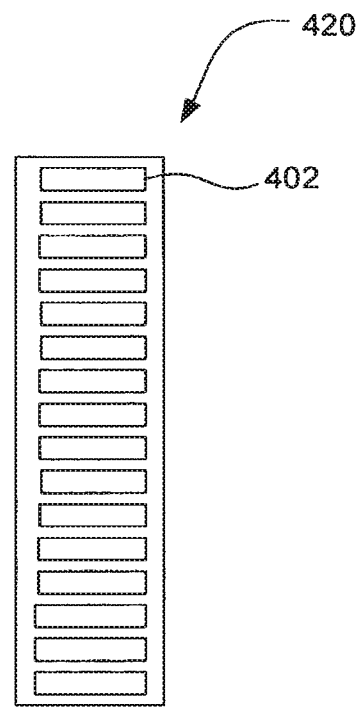
FIG. 20 is a diagram of a linear touch device, in accordance with one embodiment of the present invention.

FIG. 20 is a diagram of a linear touch device 420. The linear touch device 420 is divided into several independent and spatially distinct nodes 402 that are positioned next to one another along a straight line. Each of the nodes 402 represents a different linear position. Although shown vertical, it should be appreciated that the linear touch device may also be horizontal or at an angle. Moreover, although shown straight, in some cases it may be desirable to use a curved line such as one that is U shaped, S shaped, L shaped, etc.

Figure 21:
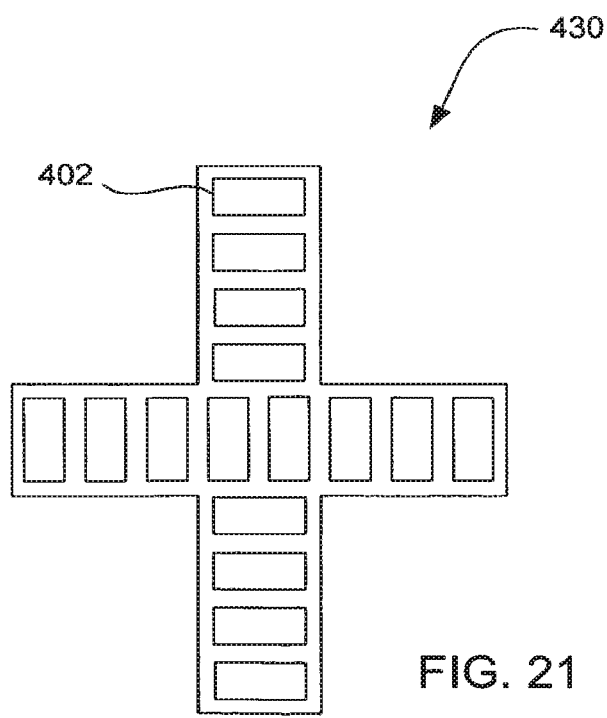
FIG. 21 is a diagram of another type of linear touch device, in accordance with one embodiment of the present invention.

FIG. 21 is a diagram of another type of linear touch device 430. The linear touch device 430 is divided into several independent and spatially distinct nodes 402 that are positioned in the form of a "+" shape. This embodiment includes both a horizontal line and a vertical line that cross each other.

Figure 22:
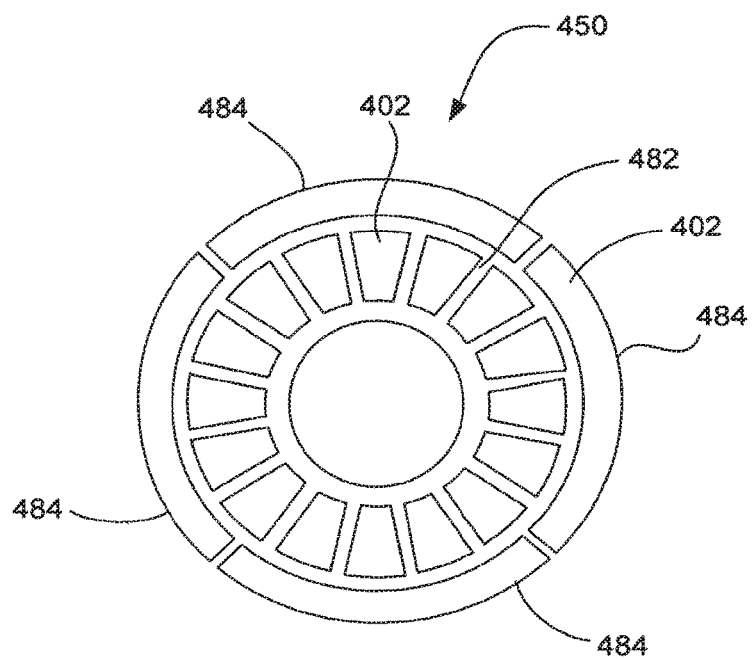
FIG. 22 is diagram of a touch devices including a scrolling or parameter control set up and one or more distinct buttons, in accordance with one embodiment of the present invention.
Figure 23:
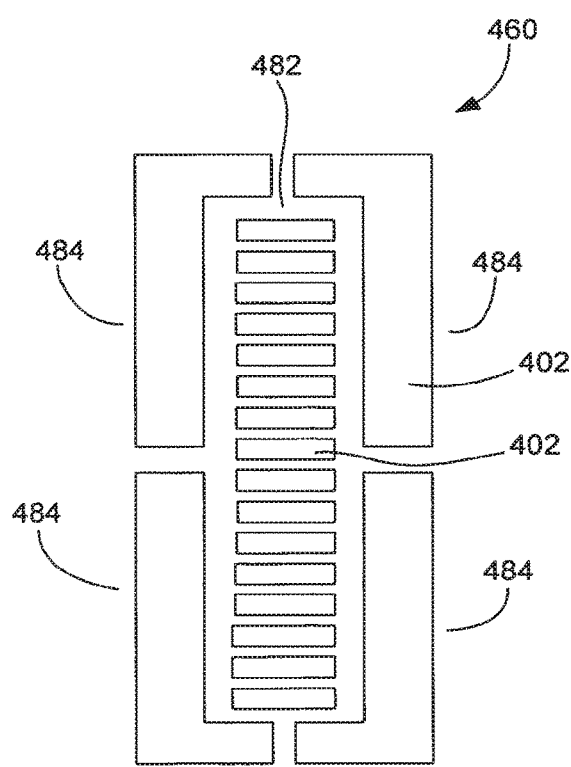
FIG. 23 is diagram of a touch devices including a scrolling or parameter control set up and one or more distinct buttons, in accordance with one embodiment of the present invention.
Figure 24:
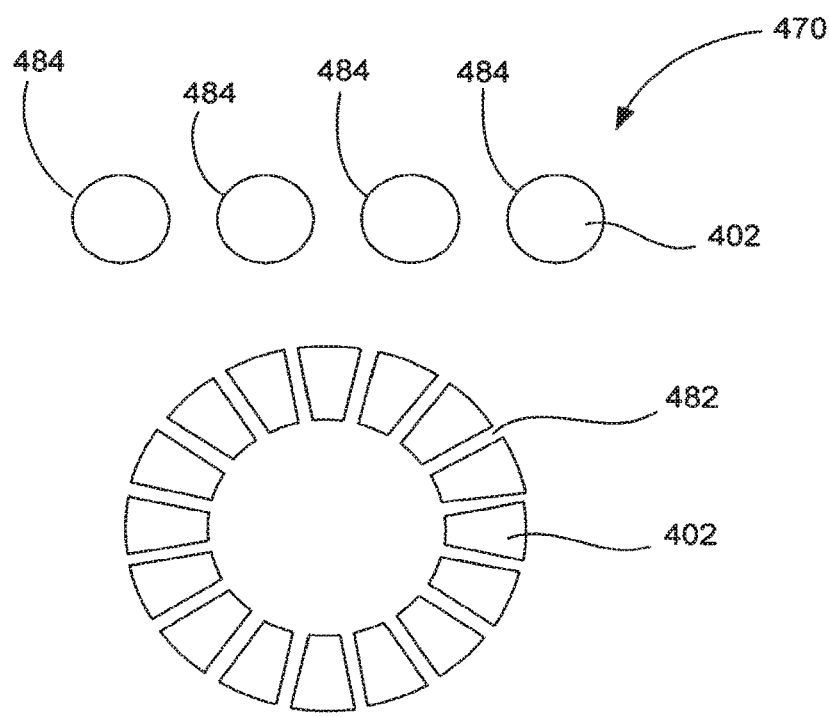
FIG. 24 is diagram of a touch devices including a scrolling or parameter control set up and one or more distinct buttons, in accordance with one embodiment of the present invention.

FIGS. 22-24 are diagrams of a touch devices 450-470 include a scrolling or parameter control set up 482 and one or more distinct buttons 484. The scrolling or parameter control set up 482 include nodes 402 configured similarly to any of those previously described 400-430. The buttons 484, on the other hand, include additional node(s) 402. Each button 484 may include one or more nodes 402. The minimum required node is one, but in some cases it may be desirable to include multiple nodes. The buttons 484 may be positioned inside and/or outside the scrolling region 482. They may be placed in close proximity of the scrolling region 482 as for example around the periphery of the scrolling region 482 and/or they may be placed away from the scrolling region 482.

Figure 25:
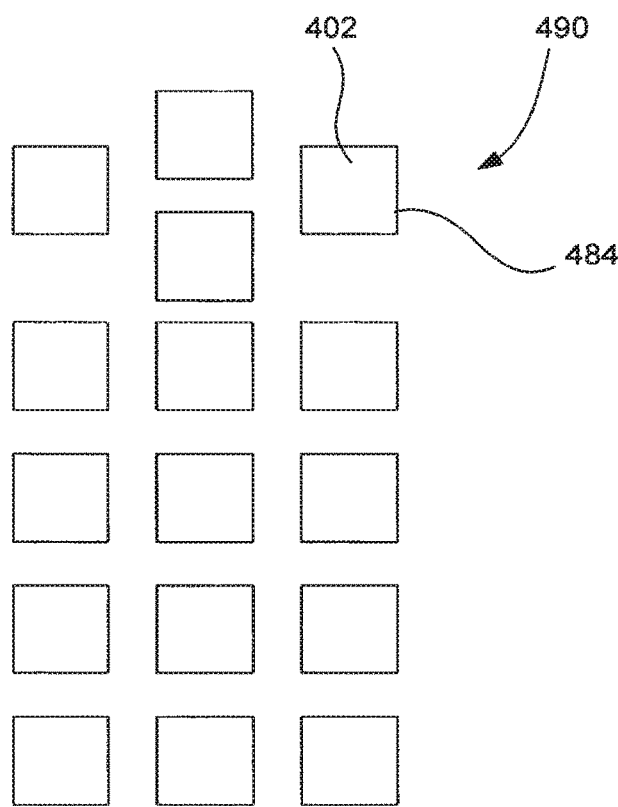
FIG. 25 is diagram of a touch device that only includes a button arrangement having a plurality of buttons, in accordance with one embodiment of the present invention.

FIG. 25 is diagram of a touch device 490 that only includes a button arrangement having a plurality of buttons 484. Each button 484 has a different task or function assigned thereto. The buttons 484 may be arranged in any manner within a user interface of an electronic device.

Figure 26:
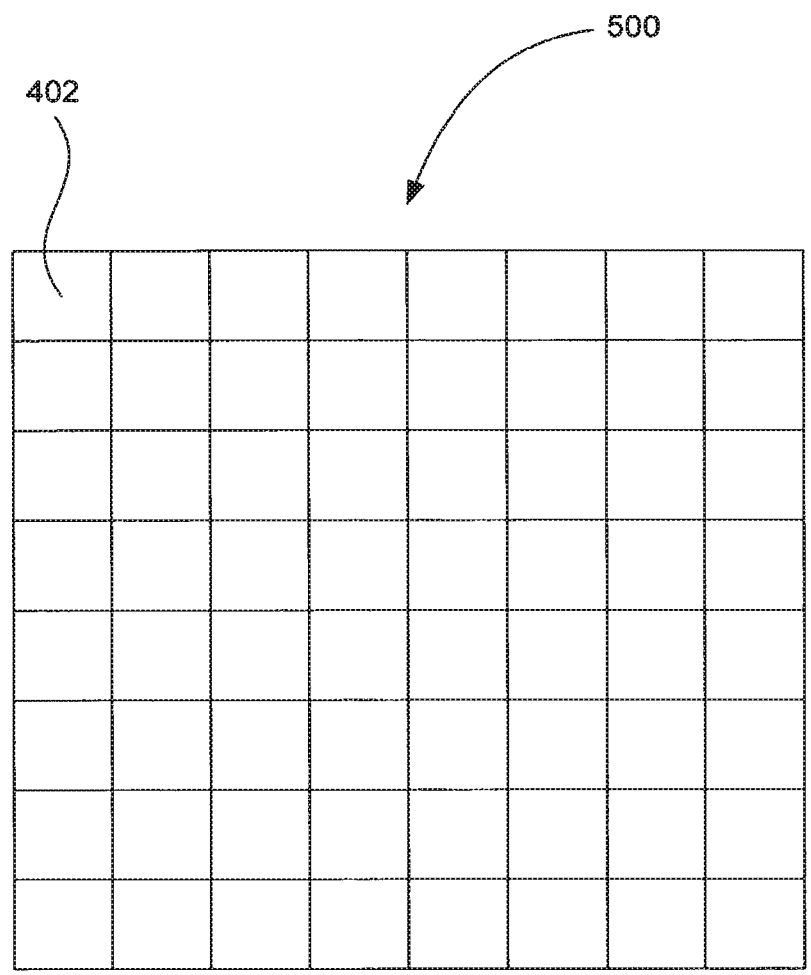
FIG. 26 is diagram of a touch device that is set up as a traditional 2D array, in accordance with one embodiment of the present invention.

FIG. 26 is diagram of a touch device 500 that is set up as a traditional 2D array. In this embodiment, the nodes are placed in rows and columns (e.g., X and Y).

Figure 27:
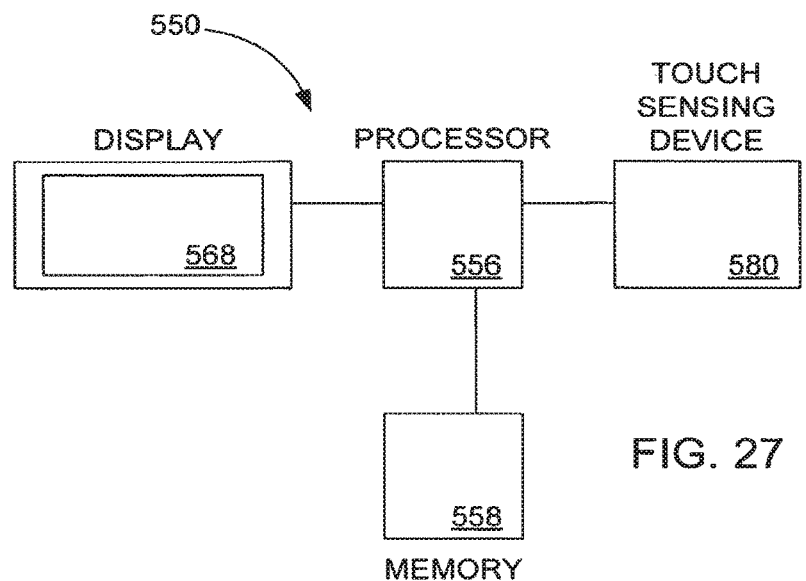
FIG. 27 is a block diagram of an exemplary electronic device, in accordance with one embodiment of the present invention.

FIG. 27 is a block diagram of an exemplary electronic device 550, in accordance with one embodiment of the present invention. The electronic device typically includes a processor 556 configured to execute instructions and to carry out operations associated with the electronic device 550. For example, using instructions retrieved for example from memory, the processor 556 may control the reception and manipulation of input and output data between components of the electronic device 550. The processor 556 can be implemented on a single-chip, multiple chips or multiple electrical components. For example, various architectures can be used for the processor 556, including dedicated or embedded processor, single purpose processor, controller, ASIC, and so forth.

In most cases, the processor 556 together with an operating system operates to execute computer code and produce and use data. The operating system may correspond to well known operating systems such as OSX, DOS, Unix, Linux, and Palm OS, or alternatively to special purpose operating system, such as those used for limited purpose appliance-type devices (e.g., media players). The operating system, other computer code and data may reside within a memory block 558 that is operatively coupled to the processor 556. Memory block 558 generally provides a place to store computer code and data that are used by the electronic device 550. By way of example, the memory block 558 may include Read-Only Memory (ROM), Random-Access Memory (RAM), hard disk drive, flash memory and/or the like.

The electronic device 550 also includes a display 568 that is operatively coupled to the processor 556. The display 568 is generally configured to display a graphical user interface (GUI) that provides an easy to use interface between a user of the electronic device 550 and the operating system or application running thereon. The display 568 may for example be a liquid crystal display (LCD).

The electronic device 550 also includes one or more touch sensing devices 580 that utilize the multifunctional technology described herein. The one or more touch sensing devices are operatively coupled to the processor 556. The touch sensing devices 580 are configured to transfer data from the outside world into the electronic device 550. The touch sensing device 580 may for example be used to perform movements such as scrolling and to make selections with respect to the GUI on the display 568. The touch sensing device 580 may also be used to issue commands in the electronic device 550. The touch sensing devices may be selected from fixed and/or movable touch pads, touch screens and/or touch sensitive housings.

The touch sensing device 580 recognizes touches, as well as the position and magnitude of touches on a touch sensitive surface. The touch sensing device 580 reports the touches to the processor 556 and the processor 556 interprets the touches in accordance with its programming. For example, the processor 556 may initiate a task in accordance with a particular touch. Alternatively, a dedicated processor can be used to process touches locally at the touch sensing device and reduce demand for the main processor of the electronic device.

Because of the multifunctional nature of the touch sensing devices, the touch sensing device provides additional inputs and/or outputs. In the case of input, and more particularly switches, the touch sensing device reports that state of one or more switches integrated with the touch sensing device and the processor 556 interprets the touches in accordance with its programming. For example, the processor 556 may initiate a task in accordance with a particular state. In the case of an output, and more particularly a light source such as an LED, the touch sensing device may illuminate one or more regions thereof in accordance with instructions provided by the processor 556. For example, the processor may generate symbols over key nodes or provide feedback at the location of a touch.

In one particular embodiment of the present invention, the electronic devices described above correspond to hand-held electronic devices with small form factors. As used herein, the term "hand held" means that the electronic device is typically operated while being held in a hand and thus the device is sized and dimension for such use. Examples of hand held devices include PDAs, Cellular Phones, Media players (e.g., music players, video players, game players), Cameras, GPS receivers, Remote Controls, and the like.

As should be appreciated, the touch sensing device can reduce the number of input devices needed to support the device and in many cases completely eliminate input devices other than the touch sensing devices. The device is therefore more aesthetically pleasing (e.g., planar smooth surfaces with limited to no breaks gaps or lines), and in many cases can be made smaller without sacrificing screen size and input functionality, which is very beneficial for hand held electronic device especially those hand held electronic device that are operated using one hand (some hand held electronic device require two handed operation while others do not).

The touch sensing devices of the present invention are a perfect fit for small form factor devices such as hand held devices, which have limited space available for input interfaces, and which require adaptable placement of input interfaces to permit operation while being carried around. This is especially true when you consider that the functionality of handheld devices have begun to merge into a single hand held device. At some point, there is not enough real estate on the device for housing all the necessary buttons and switches without decreasing the size of the display or increasing the size of the device, both of which leave a negative impression on the user. In fact, increasing the size of the device may lead to devices, which are no longer considered "hand-held."

In one particular implementation, the hand held device is a music player and the touch sensing devices are configured to generate control signals associated with a music player. For example, the touch sensing device may include list scrolling functionality, volume control functionality and button functionality including, Select, Play/Pause, Next, Previous and Menu.

In another particular implementation, the hand held device is a cell phone and the touch sensing devices are configured to generate control signals associated with a cell phone. For example, the touch sensing device may include number listing functionality.

In some cases, the handheld device may be a multifunctional handheld device as described in U.S. Patent Application No. 60/658,777, which is herein incorporated by reference.

Figure 28:
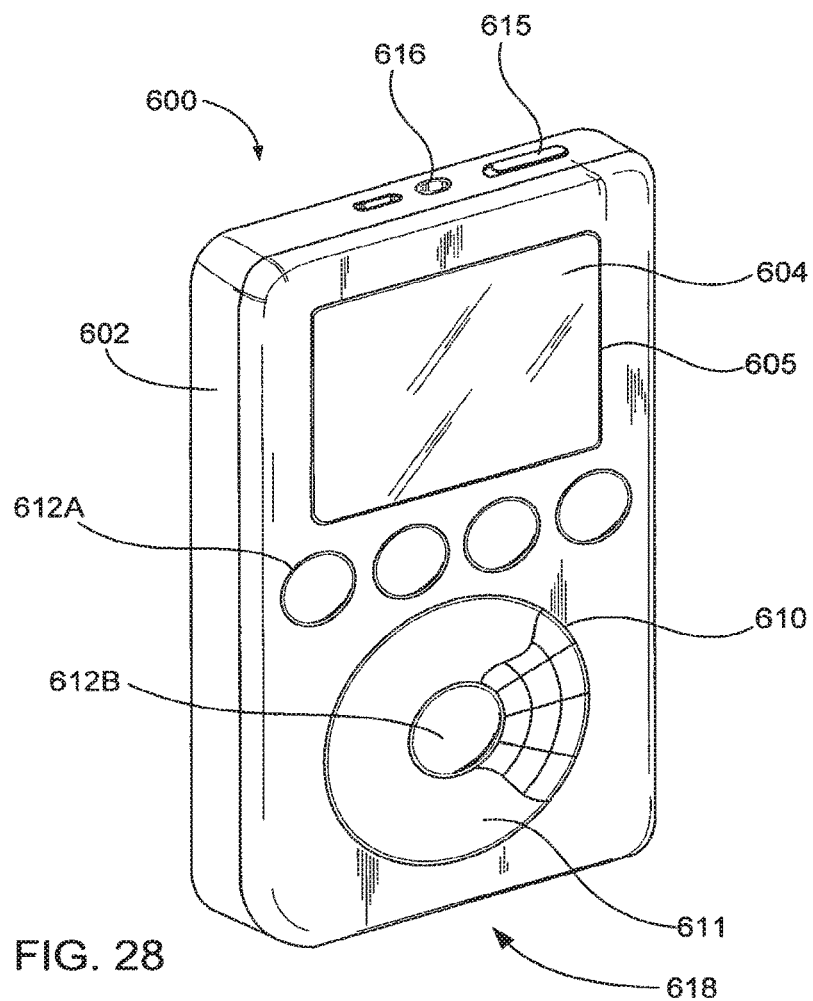
FIG. 28 is a perspective diagram of a media player, in accordance with one embodiment of the present invention.

FIG. 28 is a perspective diagram of a media player 600, in accordance with one embodiment of the present invention. The term "media player" generally refers to computing devices that are dedicated to processing media such as audio, video or other images, as for example, music players, game players, video players, video recorders, cameras and the like. These devices are generally portable so as to allow a user to listen to music, play games or video, record video or take pictures wherever the user travels. In one embodiment, the media player is a handheld device that is sized for placement into a pocket of the user. By being pocket sized, the user does not have to directly carry the device and therefore the device can be taken almost anywhere the user travels (e.g., the user is not limited by carrying a large, bulky and often heavy device, as in a portable computer).

Media players generally have connection capabilities that allow a user to upload and download data to and from a host device such as a general purpose computer (e.g., desktop computer, portable computer). For example, in the case of a camera, photo images may be downloaded to the general purpose computer for further processing (e.g., printing). With regards to music players, songs and play lists stored on the general purpose computer may be downloaded into the music player. In the illustrated embodiment, the media player 400 is a pocket sized hand held MP3 music player that allows a user to store a large collection of music. By way of example, the MP3 music player may correspond to any of those iPod music players manufactured by Apple Computer of Cupertino, Calif. (e.g., standard, mini, iShuffle, Nano, etc.).

As shown in FIG. 28, the media player 600 includes a housing 602 that encloses internally various electrical components (including integrated circuit chips and other circuitry) to provide computing operations for the media player 600. The integrated circuit chips and other circuitry may include a microprocessor, memory (e.g., ROM, RAM), a power supply (e.g., battery), a circuit board, a hard drive, and various input/output (I/O) support circuitry. In the case of music players, the electrical components may include components for outputting music such as an amplifier and a digital signal processor (DSP). In the case of video recorders or cameras the electrical components may include components for capturing images such as image sensors (e.g., charge coupled device (CCD) or complimentary oxide semiconductor (CMOS)) or optics (e.g., lenses, splitters, filters). In addition to the above, the housing may also define the shape or form of the media player. That is, the contour of the housing 602 may embody the outward physical appearance of the media player 600.

The media player 600 also includes a display screen 604. The display screen 604 is used to display a graphical user interface as well as other information to the user (e.g., text, objects, graphics). By way of example, the display screen 604 may be a liquid crystal display (LCD). As shown, the display screen 604 is visible to a user of the media player 600 through an opening 605 in the housing 602, and through a transparent wall 606 that is disposed in front of the opening 605. Although transparent, the transparent wall 606 may be considered part of the housing 602 since it helps to define the shape or form of the media player 600.

The media player 600 also includes a touch pad 610. The touch pad 610 is configured to provide one or more control functions for controlling various applications associated with the media player 600. For example, the touch initiated control function may be used to move an object or perform an action on the display screen 604 or to make selections or issue commands associated with operating the media player 600. In most cases, the touch pad 610 is arranged to receive input from a finger moving across the surface of the touch pad 610 in order to implement the touch initiated control function.

The manner in which the touch pad 610 receives input may be widely varied. In one embodiment, the touch pad 610 is configured receive input from a linear finger motion. In another embodiment, the touch pad 610 is configured receive input from a rotary or swirling finger motion. In yet another embodiment, the touch pad 610 is configured receive input from a radial finger motion. Additionally or alternatively, the touch pad 610 may be arranged to receive input from a finger tapping on the touch pad 610. By way of example, the tapping finger may initiate a control function for playing a song, opening a menu and the like.

In one embodiment, the control function corresponds to a scrolling feature. For example, in the case of an MP3 player, the moving finger may initiate a control function for scrolling through a song menu displayed on the display screen 604. The term "scrolling" as used herein generally pertains to moving displayed data or images (e.g., text or graphics) across a viewing area on a display screen 604 so that a new set of data (e.g., line of text or graphics) is brought into view in the viewing area. In most cases, once the viewing area is full, each new set of data appears at the edge of the viewing area and all other sets of data move over one position. That is, the new set of data appears for each set of data that moves out of the viewing area. In essence, the scrolling function allows a user to view consecutive sets of data currently outside of the viewing area. The viewing area may be the entire viewing area of the display screen 604 or it may only be a portion of the display screen 604 (e.g., a window frame).

The direction of scrolling may be widely varied. For example, scrolling may be implemented vertically (up or down) or horizontally (left or right). In the case of vertical scrolling, when a user scrolls down, each new set of data appears at the bottom of the viewing area and all other sets of data move up one position. If the viewing area is full, the top set of data moves out of the viewing area. Similarly, when a user scrolls up, each new set of data appears at the top of the viewing area and all other sets of data move down one position. If the viewing area is full, the bottom set of data moves out of the viewing area. In one implementation, the scrolling feature may be used to move a Graphical User Interface (GUI) vertically (up and down), or horizontally (left and right) in order to bring more data into view on a display screen. By way of example, in the case of an MP3 player, the scrolling feature may be used to help browse through songs stored in the MP3 player. The direction that the finger moves may be arranged to control the direction of scrolling. For example, the touch pad may be arranged to move the GUI vertically up when the finger is moved in a first direction and vertically down when the finger is moved in a second direction To elaborate, the display screen 604, during operation, may display a list of media items (e.g., songs). A user of the media player 600 is able to linearly scroll through the list of media items by moving his or her finger across the touch pad 610. As the finger moves around the touch pad 610, the displayed items from the list of media items are varied such that the user is able to effectively scroll through the list of media items. However, since the list of media items can be rather lengthy, the invention provides the ability for the user to rapidly traverse (or scroll) through the list of media items. In effect, the user is able to accelerate their traversal of the list of media items by moving his or her finger at greater speeds.

In one embodiment, the media player 600 via the touch pad 610 is configured to transform a swirling or whirling motion of a finger into translational or linear motion, as in scrolling, on the display screen 604. In this embodiment, the touch pad 610 is configured to determine the angular location, direction, speed and acceleration of the finger when the finger is moved across the top planar surface of the touch pad 610 in a rotating manner, and to transform this information into signals that initiate linear scrolling on the display screen 604. In another embodiment, the media player 600 via the touch pad 610 is configured to transform radial motion of a finger into translational or linear motion, as in scrolling, on the display screen 604. In this embodiment, the touch pad 610 is configured to determine the radial location, direction, speed and acceleration of the finger when the finger is moved across the top planar surface of the touch pad 610 in a radial manner, and to transform this information into signals that initiate linear scrolling on the display screen 604. In another embodiment, the media player 600 via the touch pad 610 is configured to transform both angular and radial motion of a finger into translational or linear motion, as in scrolling, on the display screen 604.

The touch pad generally consists of a touchable outer surface 611 for receiving a finger for manipulation on the touch pad 610. Although not shown in FIG. 27, beneath the touchable outer surface 611 is a sensor arrangement. The sensor arrangement includes a plurality of sensors that are configured to activate as the finger performs an action over them. In the simplest case, an electrical signal is produced each time the finger passes a sensor. The number of signals in a given time frame may indicate location, direction, speed and acceleration of the finger on the touch pad, i.e., the more signals, the more the user moved his or her finger. In most cases, the signals are monitored by an electronic interface that converts the number, combination and frequency of the signals into location, direction, speed and acceleration information. This information may then be used by the media player 600 to perform the desired control function on the display screen 604. By way of example, the sensor arrangement may correspond to any of those described herein.

The position of the touch pad 610 relative to the housing 602 may be widely varied. For example, the touch pad 610 may be placed at any external surface (e.g., top, side, front, or back) of the housing 602 that is accessible to a user during manipulation of the media player 600. In most cases, the touch sensitive surface 611 of the touch pad 610 is completely exposed to the user. In the illustrated embodiment, the touch pad 610 is located in a lower, front area of the housing 602. Furthermore, the touch pad 610 may be recessed below, level with, or extend above the surface of the housing 602. In the illustrated embodiment, the touch sensitive surface 611 of the touch pad 610 is substantially flush with the external surface of the housing 602.

The shape of the touch pad 610 may also be widely varied. For example, the touch pad 610 may be circular, rectangular, triangular, and the like. In general, the outer perimeter of the shaped touch pad defines the working boundary of the touch pad. In the illustrated embodiment, the touch pad 610 is circular. Circular touch pads allow a user to continuously swirl a finger in a free manner, i.e., the finger can be rotated through 360 degrees of rotation without stopping. Furthermore, the user can rotate his or her finger tangentially from all sides thus giving it more range of finger positions. For example, when the media player is being held, a left handed user may choose to use one portion of the touch pad 610 while a right handed user may choose to use another portion of the touch pad 610. More particularly, the touch pad is annular, i.e., shaped like or forming a ring. When annular, the inner and outer perimeter of the shaped touch pad defines the working boundary of the touch pad.

In addition to above, the media player 600 may also include one or more buttons 612. The buttons 612 are configured to provide one or more dedicated control functions for making selections or issuing commands associated with operating the media player 600. By way of example, in the case of an MP3 music player, the button functions may be associated with opening a menu, playing a song, fast forwarding a song, seeking through a menu and the like. The button functions are implemented via a mechanical clicking action or alternatively via a sensor arrangement such as those described herein. The position of the buttons 612 relative to the touch pad 610 may be widely varied. For example, they may be adjacent one another or spaced apart. In the illustrated embodiment, the buttons 612 are separated from the touch pad 610. As shown, there are four buttons 612A in a side by side relationship above the touch pad 610 and one button 612B disposed in the center or middle of the touch pad 610. By way of example, the plurality of buttons 612 may consist of a menu button, play/stop button, forward seek button and a reverse seek button, select button (enter) and the like. Alternatively or additionally, the buttons may be implemented with a movable touch pad.

Moreover, the media player 600 may also include a hold switch 614, a headphone jack 616 and a data port 618. The hold switch 614 is configured to turn the input devices of the media device 600 on and off. The headphone jack 616 is capable of receiving a headphone connector associated with headphones configured for listening to sound being outputted by the media device 600. The data port 618 is capable of receiving a data connector/cable assembly configured for transmitting and receiving data to and from a host device such as a general purpose computer. By way of example, the data port 618 may be used to upload or down load songs to and from the media device 600. The data port 618 may be widely varied. For example, the data port may be a PS/2 port, a serial port, a parallel port, a USB port, a Firewire port and the like. In some cases, the data port 618 may be a radio frequency (RF) link or optical infrared (IR) link to eliminate the need for a cable. Although not shown in FIG. 28, the media player 600 may also include a power port that receives a power connector/cable assembly configured for delivering powering to the media player 400. In some cases, the data port 618 may serve as both a data and power port.

In the embodiment of FIG. 28, the touch device may be configured to provide visual information to indicate when and where the touches occur, to invoke a touch (location where a user should touch), or as otherwise programmed. This may be accomplished with integrated LEDs that are capable of adjusting the visual stimuli of the touch surface.

If used, this visual feedback feature allows the display of pop-up buttons, characters, and indicators around the touch surface, which can disappear when not in use or required, or glowing special effects that trace or outline a user's fingers in contact with the touch surface, or otherwise provide visual feedback for the users of the device. In one implementation, the handheld device is configured to sense one or more touches and provide visual feedback in the area of the touches. In another implementation, the handheld device is configured to provide visual feedback on the touch surface, detect a touch in the area of the visual feedback, and to perform an action that is associated with the visual feedback. An example of such an arrangement can be found in U.S. patent application Ser. Nos. 11/394,493 and 60/755,656, which are herein incorporated by reference.

Additionally or alternatively, the touch device may be configured to provide additional inputs when particular regions of the touch pad are pressed. This may be accomplished with integrated switches that are capable of adjusting the visual stimuli of the touch surface.

While this invention has been described in terms of several preferred embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A portable electronic device comprising:
an input region having touch sensing and display functionality and coupled to first communication lines; and a movable circular touch-sensitive element located on a periphery of the input region, the movable circular touch-sensitive element configured for detecting movement of an object on the periphery and coupled to second communication lines different from the first communication lines;

wherein the input region and the movable circular touch-sensitive element are configured for being independently actuated and generating first and second signals transmitting respectively through the first and second communication lines and corresponding to first and second scrolling inputs to the electronic device.

2. The portable electronic device of claim 1, wherein at least one of the input region and the movable circular touch-sensitive element further comprises one or more multifunctional nodes, each multifunctional node including a touch sensor and one or more input/output (I/O) mechanisms.

3. The portable electronic device of claim 1, further comprising one or more processors and one or more data storage elements communicatively coupled to the input region and the circular movable touch-sensitive element.

4. The portable electronic device of claim 1, wherein the input region is configured for detecting translational movement of the object across the input region.

5. The portable electronic device of claim 1, wherein at least one of the input region and the circular movable touch-sensitive element comprises one or more capacitive sensing electrodes for providing the touch sensing functionality.

6. The portable electronic device of claim 1, further comprising a data port enabling wireless data transfer.

7. The portable electronic device of claim 1, further comprising a button located on the periphery of the input region.

8. The portable electronic device of claim 1, further comprising a haptic output element enabling generation of a haptic output.

9. The portable electronic device of claim 1, further comprising a biometric sensor configured for biosensing functionality.

10. The portable electronic device of claim 1, further comprising at least one of a light source and an optical detector.

11. The portable electronic device of claim 1, wherein the input region is configured to sense pressure.

12. The portable electronic device of claim 1, wherein the scrolling inputs are configured to scroll displayed GUI elements.

13. A method of providing input to a portable electronic device having an input region with touch sensing and display functionality and a movable circular touch-sensitive element located in a periphery of the input region, the method comprising:

detecting a touch input at the input region and generating first signals corresponding to first scrolling inputs to the electronic device;

detecting movement of an object at the movable circular touch-sensitive element and generating second signals corresponding to second scrolling inputs to the electronic device; and performing a scrolling operation based on one of the first scrolling inputs and the second scrolling inputs.

14. The method of claim 13, further comprising detecting translational movement of the object across the input region.

15. The method of claim 13, wherein at least one of the input region and the circular movable touch-sensitive element comprises one or more capacitive sensing electrodes and at least one of detecting the touch input and detecting the movement of the object comprises detecting with the one or more capacitive sensing electrodes.

16. The method of claim 13, further comprising generating a haptic output in response to an input.

17. The method of claim 13, further comprising detecting a biometric input.

18. The method of claim 13, further comprising detecting an input from at least one of a light source and an optical detector.

19. The method of claim 13, wherein detecting the input further comprises detecting pressure applied to the input region.

20. The method of claim 13, wherein performing the scrolling operation comprises scrolling displayed GUI elements.

* * * * *